(12) United States Patent
Kobayashi

(10) Patent No.: US 7,505,346 B2
(45) Date of Patent: Mar. 17, 2009

(54) SEMICONDUCTOR INTEGRATED CIRCUIT

(75) Inventor: Hiroyuki Kobayashi, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 0 days.

(21) Appl. No.: 12/044,437

(22) Filed: Mar. 7, 2008

(65) Prior Publication Data

US 2008/0151668 A1 Jun. 26, 2008

Related U.S. Application Data

(63) Continuation of application No. PCT/JP2005/016645, filed on Sep. 9, 2005.

(51) Int. Cl.
G11C 7/02 (2006.01)

(52) U.S. Cl. ............... 365/207; 365/202; 365/203; 365/189.02

(58) Field of Classification Search ............... 365/207, 365/202, 203, 189.02, 189.17, 230.06
See application file for complete search history.

(56) References Cited

U.S. PATENT DOCUMENTS

| | | | |
|---|---|---|---|
| 5,740,113 A | 4/1998 | Kaneko | |
| 5,745,430 A | 4/1998 | Wong et al. | |
| 6,144,601 A | 11/2000 | Takeda | |
| 6,212,110 B1 | 4/2001 | Sakamoto et al. | |
| 6,333,889 B1 * | 12/2001 | Arimoto | 365/230.03 |
| 7,254,072 B2 * | 8/2007 | Kuroda | 365/203 |
| 2001/0053065 A1 | 12/2001 | Aritomi et al. | |

FOREIGN PATENT DOCUMENTS

| | | |
|---|---|---|
| JP | 61-180996 | 8/1986 |
| JP | 63-042095 | 2/1988 |
| JP | 8-171796 | 7/1996 |
| JP | 11-086529 | 3/1999 |
| JP | 11-149800 | 6/1999 |
| JP | 2000-36194 | 2/2000 |
| JP | 2000-187985 | 7/2000 |
| JP | 2001-351399 | 12/2001 |

* cited by examiner

*Primary Examiner*—Anh Phung
*Assistant Examiner*—Toan Le
(74) *Attorney, Agent, or Firm*—Arent Fox LLP

(57) ABSTRACT

One of a pair of data output units outputs data to one of the data line pair precharged to a reference voltage. A switch control unit couples the other of the data line pair to the data line, which corresponds to a data line to which data are not output, in a data output unit which does not output data during a period after data are output to one of the data line pair until a differential amplifier starts an amplifying operation. Thus, the load amount on the other of the data line pair increases. Therefore, change of the voltage on the other of the data line pair due to the influence of a coupling capacitance during data output can be prevented. That is, decrease of the read margin of data due to the coupling capacitance can be prevented.

19 Claims, 44 Drawing Sheets

US 7,505,346 B2

SEMICONDUCTOR INTEGRATED CIRCUIT

CROSS-REFERENCE TO RELATED APPLICATION

This application is a Continuation Application of International Application No. PCT/JP2005/16645, filed Sep. 9, 2005, designating the U.S., the entire contents of which are incorporated herein by reference.

BACKGROUND

1. Field

The application relate to a semiconductor integrated circuit having a differential amplifier which amplifies a voltage difference in a data line pair.

2. Description of the Related Art

In a semiconductor integrated circuit, for example a semiconductor memory such as DRAM, data read from a memory cell are transmitted to one of a bit line pair. At this time, the other of the bit line pair is precharged to the reference voltage. Then, data are read by amplifying the voltage difference in the bit line pair by a sense amplifier and taking out the amplified signal.

In Japanese Laid-open Patent Publication No. 2000-36194 and Japanese Laid-open Patent Publication No. S63-42095, there is disclosed a circuit which precharges a bit line on the reference side until just before the sense amplifier operates. Specifically, bit lines are coupled to a reference voltage line by switching transistors which operate independently from each other. Thus, when a read operation is performed, change of the voltage on the bit line on the reference side due to the coupling capacitance between the bit lines is prevented. That is, decrease of the voltage difference in the bit line pair is prevented.

In recent years, due to miniaturization of device structures, the areas of memory cells decrease, and the interval between bit lines tends to be narrow. Accordingly, the coupling capacitance between bit lines tends to increase. Further, when the interval between bit lines becomes narrow, it becomes difficult to increase the sizes of precharge transistors arranged in a memory cell array. It hinders increasing of driving power of the precharge transistors. Furthermore, between a transistor and bit lines/a reference voltage line, there exist a resistance component such as contact resistance and/or a capacitance component such as diffusion capacitance. Accordingly, due to the miniaturization, it is becoming more and more difficult to cancel the operation of the coupling capacitance when read data are transmitted to one bit line so as to match the other bit line with the precharge voltage.

In addition, for reducing the chip size, there is proposed a semiconductor memory in which memory cell arrays are arranged on both sides of a sense amplifier, and the sense amplifier is shared by the memory cell arrays. However, in this type of semiconductor memory, there is no technology proposed for reducing the influence of the coupling capacitance between bit lines.

SUMMARY

The present embodiments provide that a semiconductor integrated circuit, including a pair of data output units each having a complementary data line pair and outputting data to one of the data lines which are precharged to a reference voltage, a complementary coupling wire pair, a differential amplifier coupled to the coupling wire pair and amplifying a voltage difference in the coupling wire pair, amplifier switches coupling the coupling wires to the data lines respectively, and a switch control unit outputting amplifier switch control signals controlling operations of the amplifier switches respectively, in which when one of the data output units outputs data to one of the data line pair, the switch control unit turns on by the amplifier switch control signals a pair of amplifier switches coupled to the data line pair of the data output unit which outputs data, and turns on the amplifier switch coupled to the data line, which corresponds to the other of the data line pair coupled one of the data output units, in the data output unit which does not output data during a period after the one of the data output units outputs data until the differential amplifier starts an amplifying operation.

DETAILED DESCRIPTION OF THE EMBODIMENTS

Figure 1:
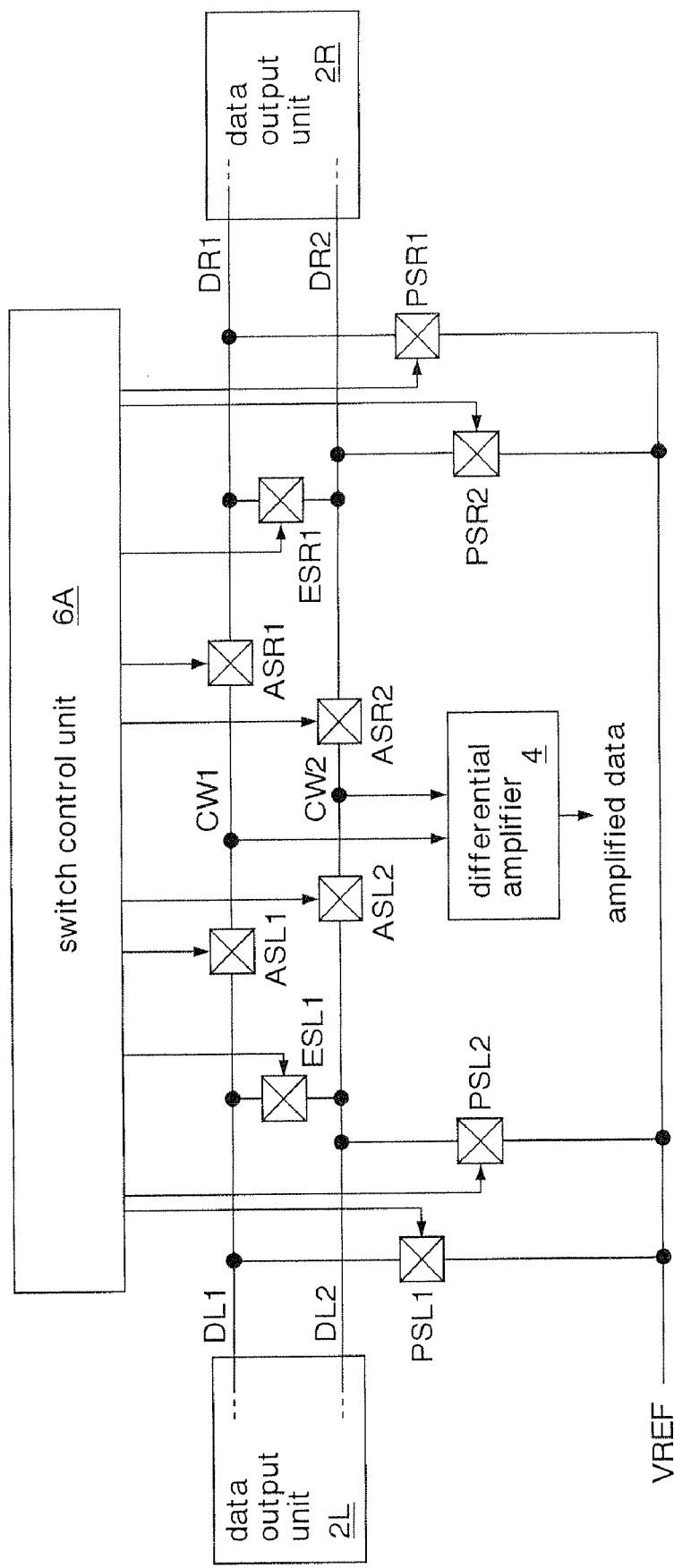
FIG. 1 is a block diagram illustrating a first embodiment.

Hereinafter, embodiments will be explained using the drawings. A double circle in the drawings (in FIG. 7 or the like) indicates an external terminal. In the drawings, a signal line indicated by a thick line is formed by a plurality of signal lines. Further, a part of the blocks to which a thick line is coupled is formed by a plurality of circuits. For a signal line in which a signal is transmitted, the same reference sign as the name of the signal is used. A signal with "/" added to the head indicates negative logic. A signal with "Z" added to the end indicates positive logic.

FIG. 1 illustrates a first embodiment. A semiconductor integrated circuit has a pair of data output units 2L, 2R having complementary data line pairs DL1/DL2, DR1/DR2 respectively, a differential amplifier 4 coupled to a coupling wire pair CW1, CW2, and a switch control unit 6A. The data lines DL1-2, DR1-2 are coupled to the coupling wire pair CW1-2 via amplifier switches ASL1, ASL2, ASR1, ASR2. In other words, the differential amplifier 4 is shared by the data output units 2L, 2R.

Further, the data lines DL1-2, DR1-2 are coupled to a reference voltage line VREF via precharge switches PSL1, PSL2, PSR1, PSR2, respectively. The data line pair DL1-2 are coupled to each other via an equalization switch ESL1. The data line pair DR1-2 are coupled to each other via an equalization switch ESR1. Each of the switches ASL1-2, ASR1-2, PSL1-2, PSR1-2, ESL1, ESR1 is formed by an nMOS transistor, a pMOS transistor, or a CMOS transmission gate in which an nMOS transistor and a pMOS transistor are combined.

One of the data output units 2L, 2R operates and outputs data to one of the data line pair DR1-2 (or one of DL1-2). The switch control unit 6A outputs amplifier switch control signals which control the operations of the amplifier switches ASL1-2, ASR1-2 respectively, precharge switch control signals which control the operations of the precharge switches PSL1-2, PSR1-2 respectively, equalization switch control signals which control the operations of the equalization switches ESL1, ESR1 respectively, to respective control signal lines. The respective control signal lines are coupled to the gates of transistors of the respective switches ASL1-2, ASR1-2, PSL1-2, PSR1-2, ESL1, ESR1.

For example, when data are output from the data line DR1 of the data output unit 2R, the switch control unit 6A turns on the amplifier switches ASR1-2. Thus, the data lines DR1-2 are coupled to the differential amplifier 4 via the coupling wire pair CW1-2. The differential amplifier 4 amplifies the potential difference between the data line DR1 to which data are output and the corresponding data line DR2 precharged to the reference voltage, and outputs the amplified data.

When the semiconductor integrated circuit is a semiconductor memory, the data lines DL1-2, the data output units 2L, 2R and the differential amplifier 4 correspond to complementary bit line pairs, memory cell arrays and a sense amplifier. Alternatively, these elements correspond to complementary data bus lines for transferring data amplified in the sense amplifier to the outside, data bus switches for outputting data amplified in the sense amplifier to the data bus lines, and a read amplifier which amplifies a signal amount of data on the data bus lines. The structure of FIG. 1 is also applicable to a logic LSI.

Figure 2:
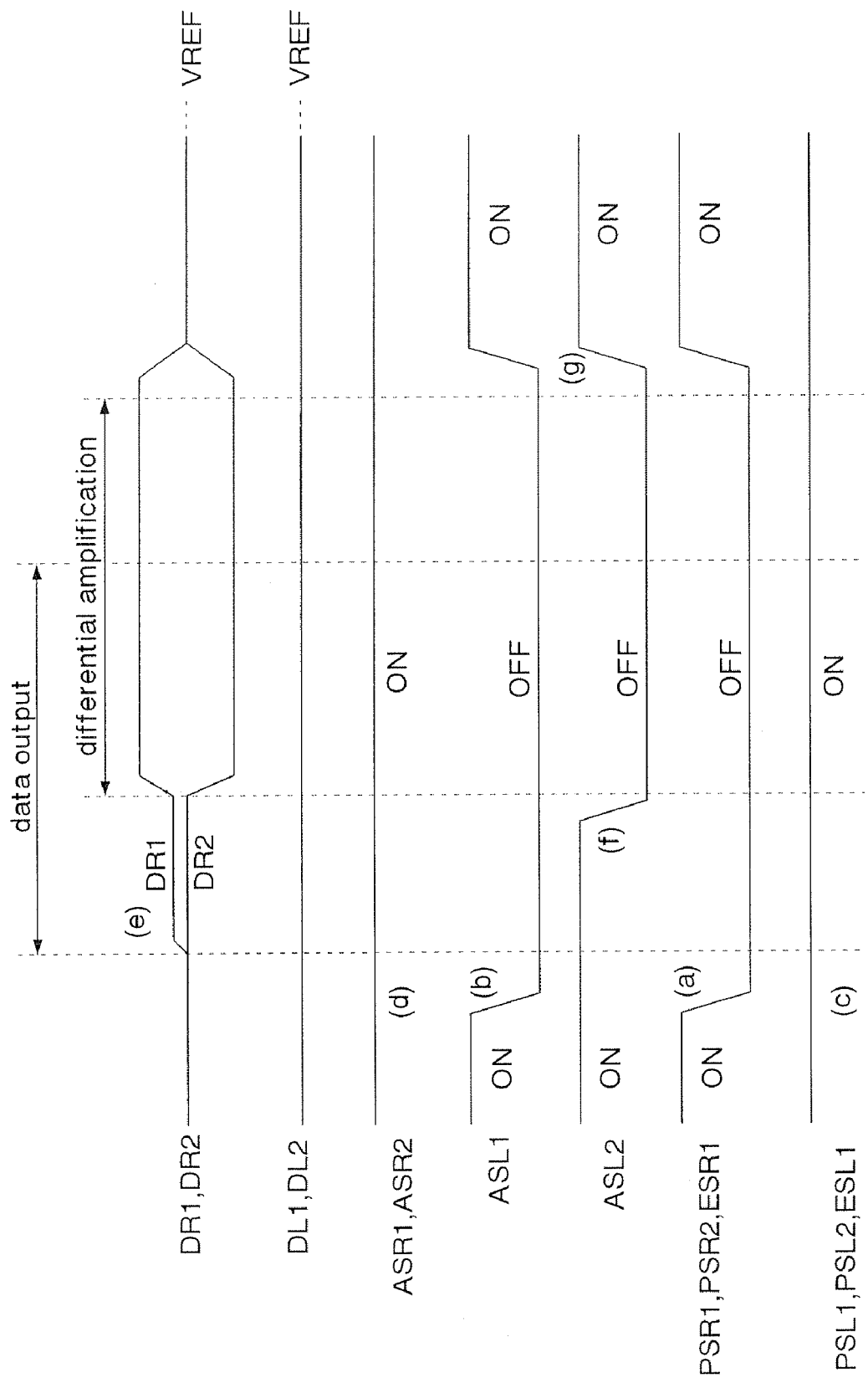
FIG. 2 is a timing chart illustrating an output operation of data of a semiconductor integrated circuit shown in FIG. 1.

FIG. 2 illustrates an output operation of data of the semiconductor integrated circuit shown in FIG. 1. In this example, data are output from the data line DR1 of the data output unit 2R. In this chart, "ON" indicates that a switch is on, and "OFF" indicates that a switch is off. Before the output operation of data is started, all the switches ASL1-2, ASR1-2, PSL1-2, PSR1-2, ESR1, ESL1 are on. Thus, the data lines DL1-2, DR1-2 and the coupling wire pair CW1-2 are precharged to the reference voltage VREF.

Before the data output unit 2R outputs data to the data line DR, the switch control unit 6A turns off the switches PSR1-2, ESR1 corresponding to the data line pair DR1-2 to which data are output (FIG. 2(a)). Further, before the data output unit 2R outputs data to the data line DR1, the switch control unit 6A turns off the switch ASL1 coupled to the data line DL1, which corresponds to the data line DR1 to which data are output, in the data output unit 2L to which data are not output (FIG. 2(b)). Thus, the load amount on the data line DR1 decreases, and the voltage variation amount on the data line DR1 which changes in response to data output to the data line DR1 can be increased. The switches PSL1-2 corresponding to the data lines DL1-2 of the data output unit 2L which does not output data remain on during the output operation of data from the data output unit 2R (FIG. 2(c)). Accordingly, the reference voltage VREF is supplied constantly to the data lines DL1-2 during the output operation. Further, by the switches ESL1, ASL2 being on, the coupling wire CW2 and the data line DR2 are coupled not only to the data line DL2 but to the data line DL1. The load amount on the coupling wire CW2 and the data line DR2 is increased when data are output. Accordingly, it is possible to securely prevent change of the voltage on the coupling wire CW2 and the data line DR2 due to the influence of a coupling capacitance during data output.

The switches ASR1-2 remain on during the output operation so as to amplify by the differential amplifier 4 the potential difference in the data line pair DR1-2 to which data are output (FIG. 2(d)). When data are output to the data line DR1, the switch ASL2 is on, which is on the data output unit 2L side corresponding to the data line DR2 to which data are not output. Accordingly, the data line DR2 is coupled to the reference voltage line VREF via the switches ASR2, ASL2, PSL2. Further, the data line DR2 is coupled to the reference voltage line VREF via the switches ASR2, ASL2, ESL1, PSL1. Thus, when data are output to the one data line DR1 of the data line pair and the voltage changes, it is possible to securely prevent change of the voltage on the other data line DR2 of the data line pair due to the influence of the coupling capacitance (FIG. 2(e)). In other words, when the differential amplifier 4 starts to operate, decrease of the voltage difference in the data line pair DR1-2 can be prevented.

Just before the differential amplifier 4 starts an amplifying operation, the switch control unit 6A turns off the switch ASL2 on the data output unit 2L side corresponding to the data line DR2 to which data are not output (FIG. 2(f)). Thus, the data line DR2 and the coupling wire CW2 are uncoupled from the reference voltage line VREF before the amplifying operation and turn to a floating state. Accordingly, the differential amplifier 4, which operates thereafter, can differentially amplify the voltage difference in the coupling wire pair CW1, CW2 and the data lines DR1, DR2 reliably. Further, as described above, since decrease of the voltage difference in the data line pair DR1-2 is prevented, the differential amplifier 4 can reliably amplify data output from the data output unit 2R. After the differential amplifier 4 completes the amplifying operation, the switch control unit 6A turns on the switches ASL1-2, PSR1-2, ESR1 (FIG. 2(g)). Thus, the data line pair DR1-2 and the coupling wire pair CW1-2 are coupled to the reference voltage line VREF and precharged to the reference voltage VREF. Then the output operation of data is completed.

Note that formation of the equalization switches ESL1, ESR1 which equalize the data line pairs DL1-2, DR1-2 shown in FIG. 1 may be omitted. However, by forming the equalization switches ESL1, ESR1, the data line DR2 to which data are not output can be coupled not only to the data line DL2 but to the reference voltage line VREF via the data line DL1 as explained with FIG. 2. Thus, during a period after data are output until the differential amplifier 4 starts to operate, it is possible to securely prevent change of the voltage on the data line DR2 due to the influence of the voltage variation on the data line DR1.

Further, in FIG. 1, the control signal lines are wired independently to the switches PSL1-2, ESL1 and switches PSR1-2, ESR1. However, a common signal line may be wired to the switches PSL1-2, ESL1 and a common signal line may be wired to the switches PSR1-2, ESR1.

As above, in the first embodiment, by coupling the data line DR2 to which data are not transmitted and the coupling wire CW2 to the reference voltage line VREF after data are output until just before the differential amplifier 4 starts the amplifying operation, it is possible to prevent change of the voltage on the data line DR2 and the coupling wire CW2 due to the influence of the coupling capacitance in the data line pair DR1-2 and the coupling wire pair CW1-2 during data output. As a result, when the differential amplifier 4 starts the amplifying operation, decrease of the voltage difference in the data line pair DR1-2 and the coupling wire pair CW1-2 can be prevented. In other words, decrease of the read margin of data due to the coupling capacitance can be prevented. By turning off the switch control signal ASL2 just before the differential amplifier 4 starts the amplifying operation, the data line DR2 and the coupling wire CW2 can be set to floating before the amplifying operation. Thus, the differential amplifier 4 can differentially amplify the voltage difference in the coupling wire pair CW1-2 reliably.

Figure 3:
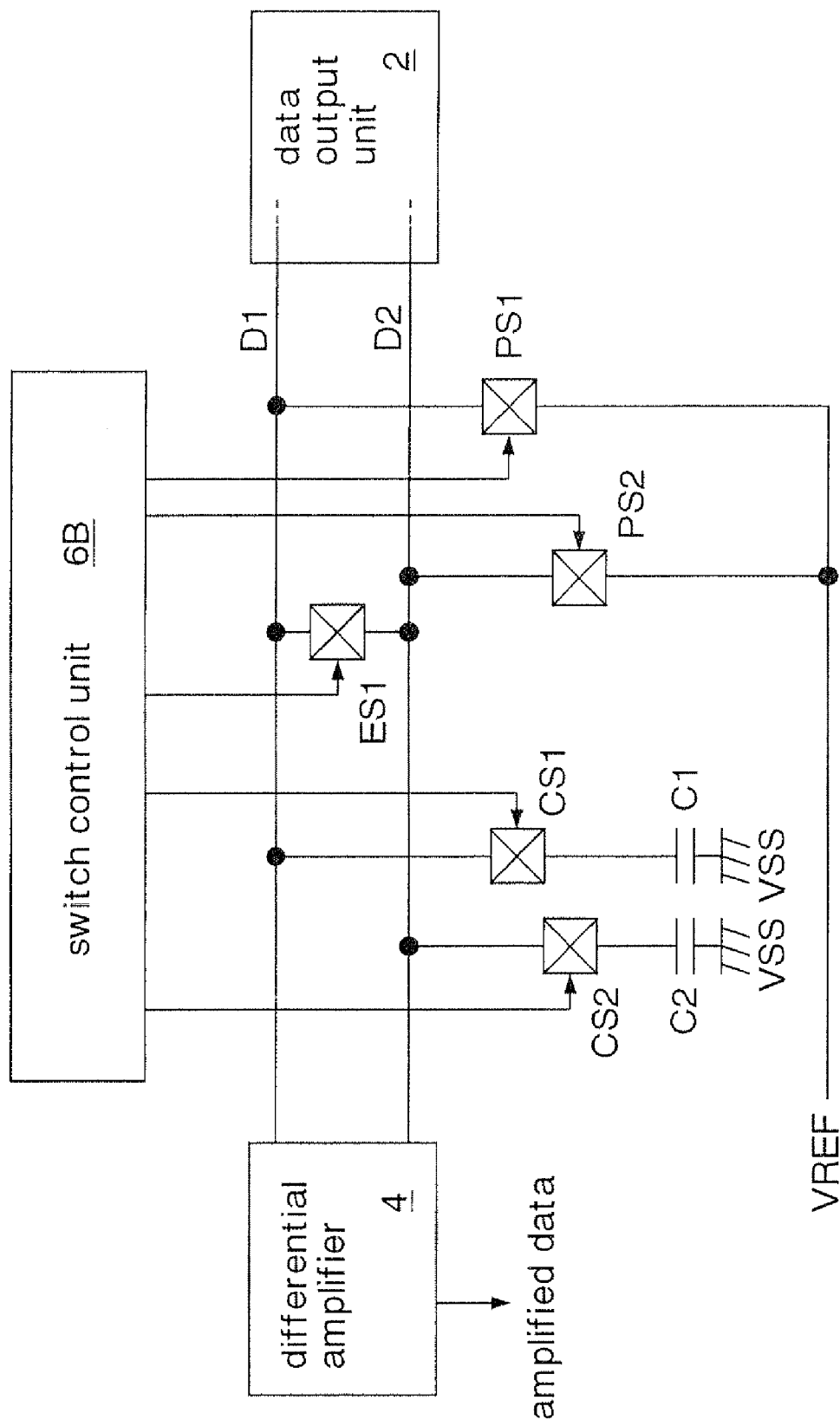
FIG. 3 is a block diagram illustrating a second embodiment.

FIG. 3 illustrates a second embodiment. The same elements as those in the first embodiment are given the same reference sings, and detailed explanations thereof are omitted. A semiconductor integrated circuit has a data output unit 2 having a complementary data line pair D1, D2, a differential amplifier 4 coupled to the data line pair D1, D2, and a switch control unit 6B. This embodiment is different from the first embodiment in that the differential amplifier 4 is not shared, and that the data lines D1, D2 are coupled to a ground line VSS via precharge capacitors C1, C2.

The data lines D1-2 are coupled to the reference voltage line VREF via precharge switches PS1, PS2, respectively. The data line pair D1-2 are coupled to each other via an equalization switch ES1. Furthermore, the data lines D1-2 are coupled to the ground line VSS via capacitor switches CS1-2 and the precharge capacitors C1-2. The circuit structures of the switches PS1-2, ES1, CS1-2 are the same as those of the switches PSR1-2 and soon of the first embodiment.

The data output unit 2 outputs data to one of the data line pair D1-2. The switch control unit 6B outputs precharge switch control signals which control the operations of the precharge switches PS1-2 respectively, an equalization switch control signal which controls the operation of the equalization switch ES1, and capacitor switch control signals which control the operations of the capacitor switches CS1-2.

Figure 4:
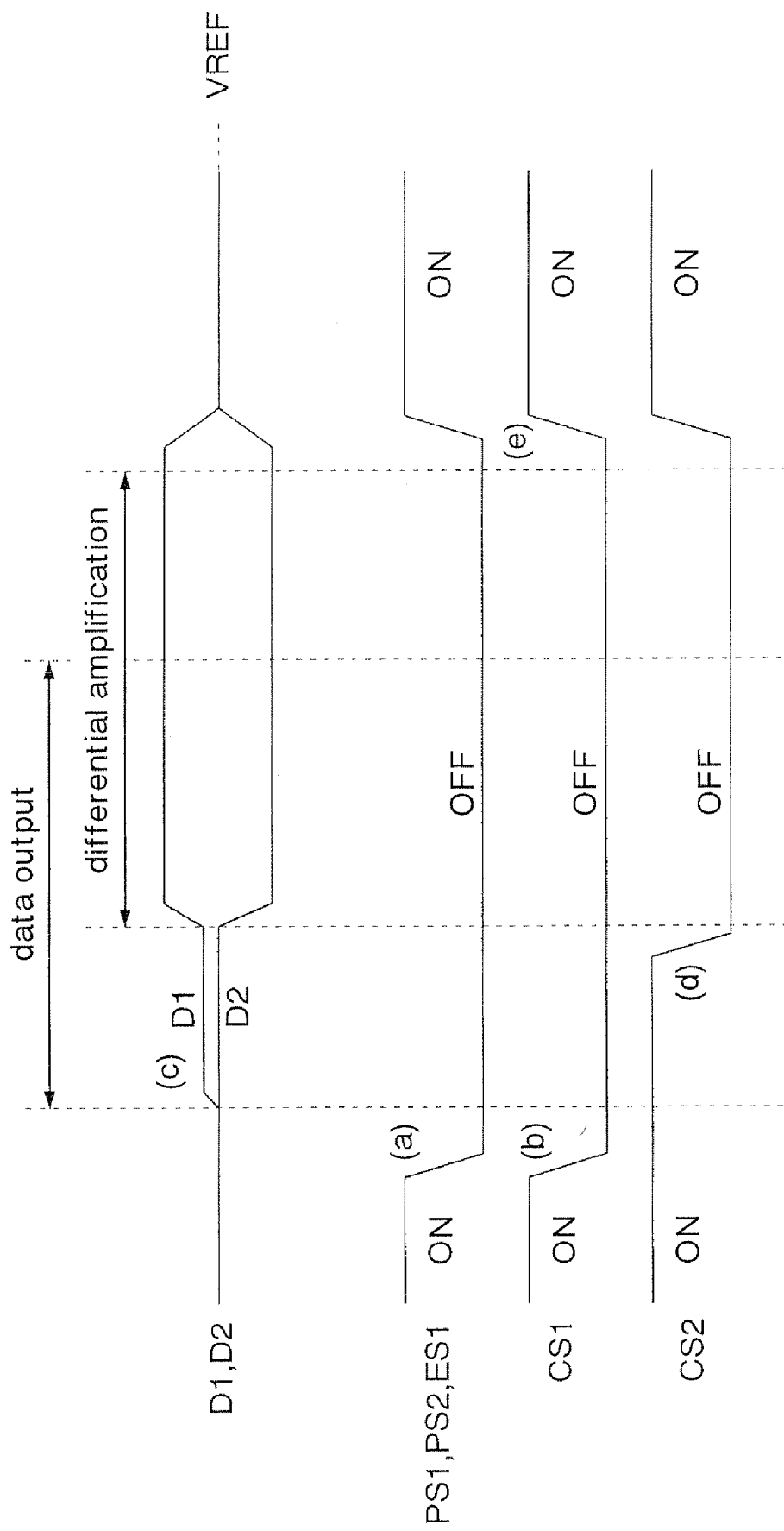
FIG. 4 is a timing chart illustrating an output operation of data of a semiconductor integrated circuit shown in FIG. 3.

FIG. 4 illustrates an output operation of data of the semiconductor integrated circuit shown in FIG. 3. In this example, the data output unit 2 outputs data to the data line D1. Before the output operation of data is started, all the switches PS1-2, ES1, CS1-2 are on. Thus, the data lines D1-2 are precharged to the reference voltage VREF. The precharge capacitors C1-2 are coupled to the data lines D1-2, respectively. Thus, the load capacitances on the data lines D1-2 are increased by the precharge capacitors C1-2.

The switch control unit 6B turns off the switches PS1-2, ES1 just before data are output to the data line D1 (FIG. 4(a)). Further, the switch control unit 6B turns off the switch CS1 just before data are output to the data line D1 (FIG. 4(b)). The data line D1 is uncoupled from the precharge capacitor C1 by turning off the switch CS1. Thus, the load capacitance on the data line D1 decreases, and hence the variation amount of voltage on the data line D1 due to the output of data can be increased.

When data are output to the data line D1, the load capacitance on the data line D2 to which data are not output is increased by the precharge capacitor C2 coupled to the data line D2. Thus, when data are output to the one data line D1 of the data line pair and the voltage thereon changes, change of the voltage on the other data line D2 of the data line pair due to the influence of the coupling capacitance is suppressed (FIG. 4(c)). In other words, decrease of the voltage difference in the data line pair D1-2 can be prevented.

The switch control unit 6B turns off the switch CS2 just before the differential amplifier 4 starts an amplifying operation (FIG. 4(d)). Thus, the precharge capacitor C2 is uncoupled from the data line D2 to which data are not output. The load capacitance on the data line D2 decreases, and this prevents decrease of amplification speed of the voltage difference in the data line pair D1-2 by the differential amplifier 4. In other words, the differential amplifier 4 can reliably amplify data output from the data output unit 2. After the differential amplifier 4 completes the amplifying operation, the switch control unit 6B turns on the switches PS1-2, ES1, CS1-2 (FIG. 4(e)). Thus, the data line pair D1-2 are coupled to the reference voltage line VREF and precharged to the reference voltage VREF.

Note that similarly to the first embodiment, formation of the equalization switch ES1 may be omitted. Further, a common control signal line may be wired to the switches PS1-2, ES1. When independent control signal lines are wired to the switches PS1-2, ES1 respectively, the precharge switch (PS2 for example) coupled to a data line (D2 for example) to which data are not output can be turned off just before the differential amplifier 4 starts to operate. In this case, during a period after data are output until the differential amplifier 4 starts to operate, a data line to which data are not output can be coupled to the reference voltage line VREF. Therefore, during this period, the variation amount of voltage on the data line D2 due to the voltage variation on the data line D1 can be minimized.

As above, also in this embodiment, the same effects as in the above-described embodiments can be obtained. Furthermore, by decreasing the load amount on the data line D1 just before data are output, the voltage variation amount on the data line D1 which changes in response to output of data can be increased. By increasing the load amount on the data line D2 to which data are not output until just before the differential amplifier 4 starts an amplifying operation, it is possible to prevent change of the voltage on the data line D2 due to the influence of the coupling capacitance in the data line pair D1-2 during data output. As a result, decrease of the read margin of data due to the coupling capacitance can be prevented.

Figure 5:
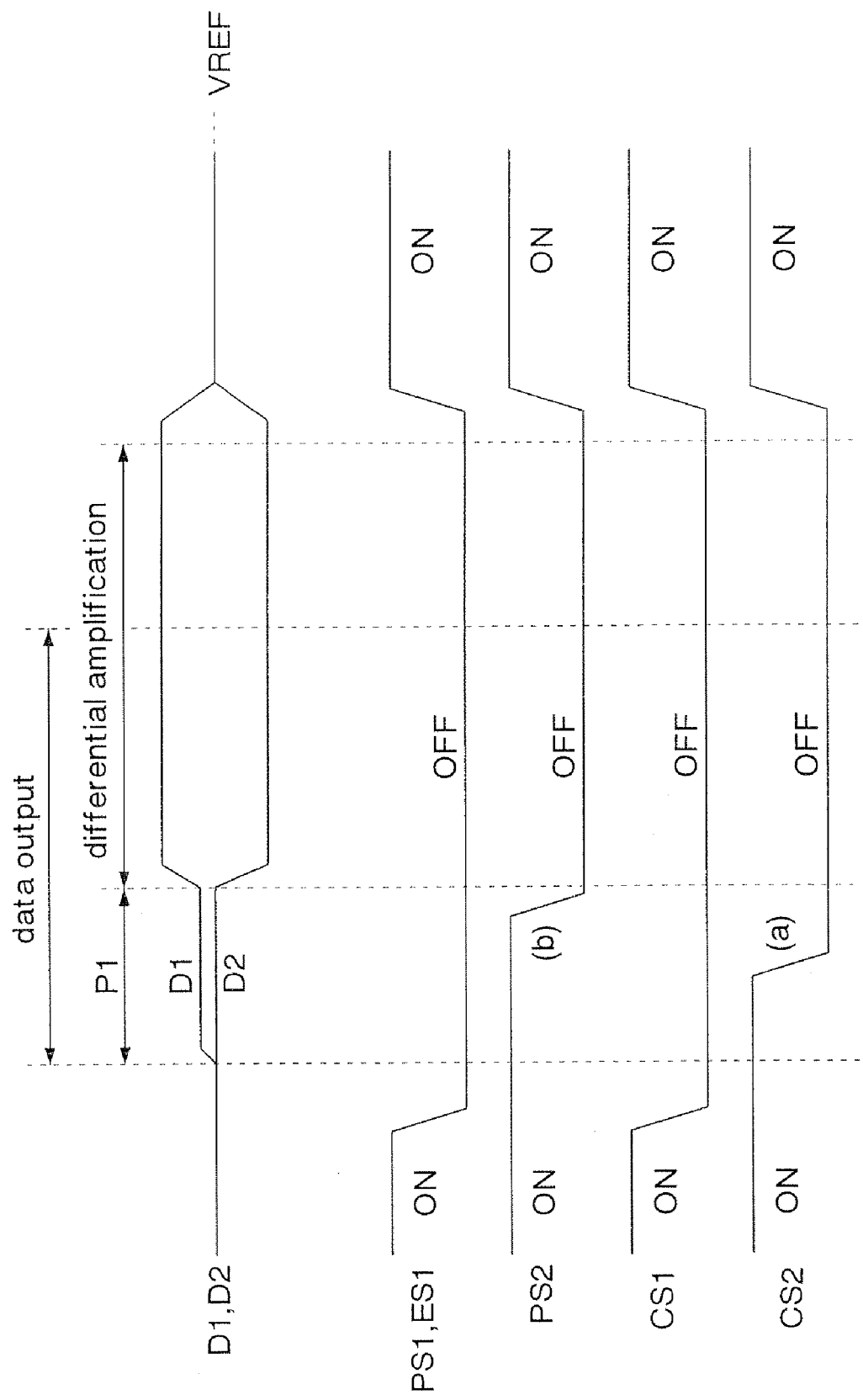
FIG. 5 is a timing chart illustrating an output operation of data in a third embodiment.

FIG. 5 illustrates an output operation of data in a third embodiment. The same elements as those in the first and the second embodiment are given the same reference signs, and detailed explanations thereof are omitted. In this embodiment, the operations of the switches PS2, CS2 coupled to the data line (D2 in this example) to which data are not output are different as compared to the second embodiment. Thus, the switch control unit is different from that of the second embodiment. The other structure of the semiconductor integrated circuit is the same as in the second embodiment (FIG. 3).

After data are output, the switch control unit turns off the switch CS2 just before the switch PS2 is turned off (FIG. 5(a)). The switch PS2 is turned off just before the differential amplifier 4 starts to operate (FIG. 5(b)). During a period P1 after data are output until the differential amplifier 4 starts to operate, the load capacitance on the data line D2 increases while the switch CS2 is on. Further, during the period P1, the data line D2 to which data are not output is coupled to the reference voltage line VREF by the switch PS2 being on. Thus, the variation amount of voltage on the data line D2 due to the voltage variation on the data line D1 can be minimized.

Further, in the period P1, the coupling of the precharge capacitor C2 and the data line D2 is released by turning off the switch CS2. The load capacitance on the data line D2 decreases, and hence the voltage on the data line D2 which is changed due to the influence of the voltage variation on the data line D1 can be quickly brought back to the reference voltage VREF.

Figure 6:
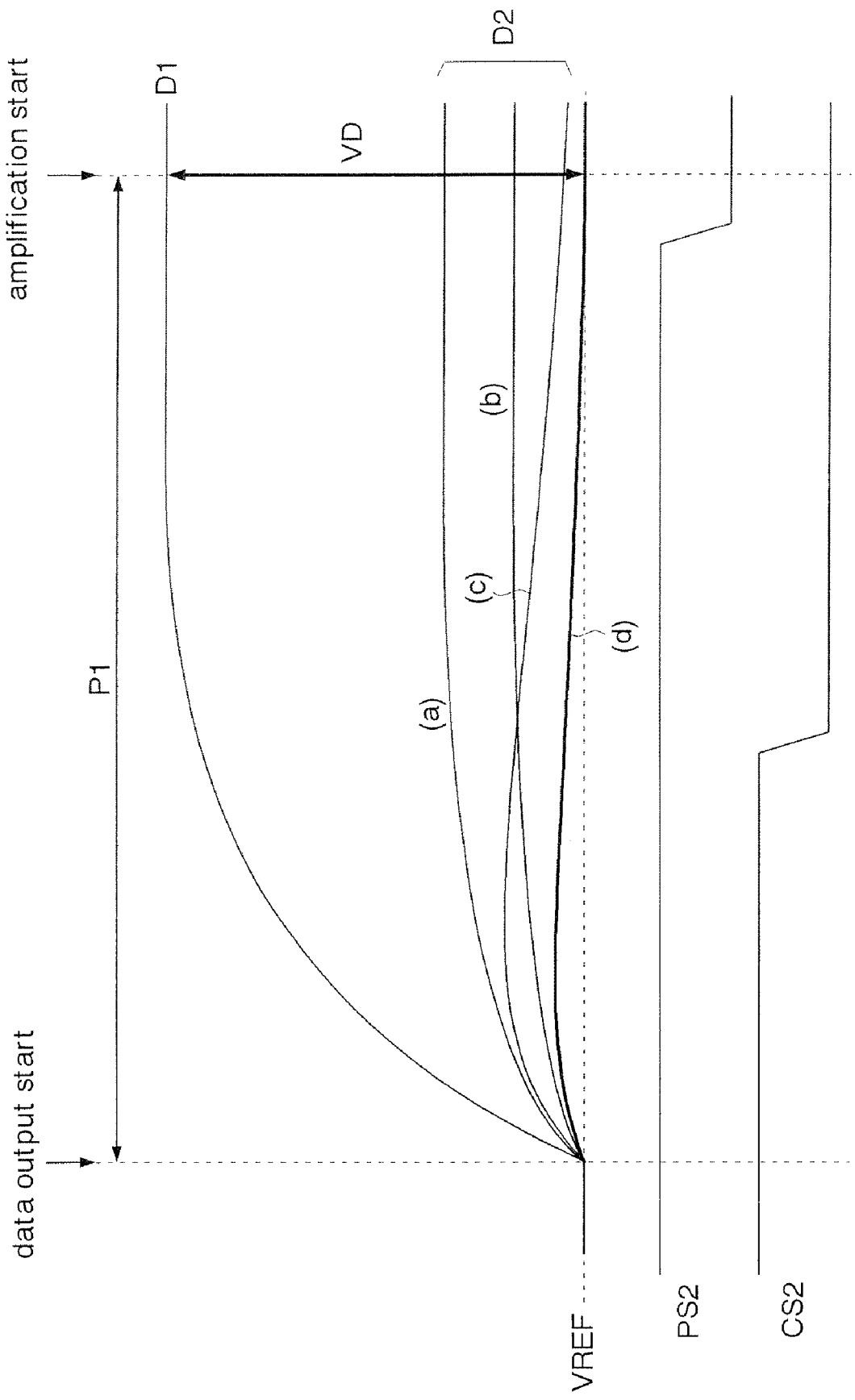
FIG. 6 is a waveform chart illustrating voltage variations in a data line pair during a period P1 in FIG. 5.

FIG. 6 illustrates details of voltage variations in the data line pair D1-2 during the period P1 of FIG. 5. The variation on the data line D2 when the embodiment is applied is shown by the thick curve (d). When the data line D2 is not coupled to the reference voltage line VREF and the capacitor C2 during the period P1, the data line D2 changes largely due to the influence of the voltage variation on the data line D1 (the curve a). When the data line D2 is not coupled to the reference voltage line VREF during the period P1 and is coupled to the capacitor C2 in the former half of the period P1, the load capacitance on the data line D2 increases, and hence the data line D2 is not easily influenced by the voltage variation on the data line D1 (the curve b).

When the data line D2 is coupled to the reference voltage line VREF and is not coupled to the capacitor C2 during the period P1, the load capacitance on the data line D2 is small. Thus, the voltage on the data line D2 is influenced temporarily by the voltage variation on the data line D1 and rises. However, thereafter, due to the reference voltage VREF supplied via the switch PS2, the voltage decreases toward the reference voltage VREF (the curve c).

When the data line D2 is coupled to the reference voltage line VREF during the period P1 and is coupled to the capacitor C2 in the former half of the period P1, the load capacitance on the data line D2 increases, and hence the data line D2 is not easily influenced by the voltage variation on the data line D1 (the curve d; this embodiment). In other words, the voltage variation on the data line D2 during data output is small. Thereafter, the capacitor C2 is uncoupled from the data line D2, and the load capacitance decreases. Thus, the voltage on the data line D2 returns to the reference voltage VREF quickly due to the reference voltage VREF supplied via the switch PS2. As a result, the voltage difference VD between the data lines D1-2 when the differential amplifier 4 starts to operate can be maximized. When the voltage difference VD is set to approximately the same as in a conventional manner, timing to start the operation of the differential amplifier 4 can be made earlier. In this case, the time after the data output unit 18 starts outputting of data until the differential amplifier 4 outputs amplified data can be reduced. For example, the access time can be shortened.

As above, also in this embodiment, the same effects as in the above-described embodiments can be obtained. Furthermore, by sequentially turning off the switch CS2 and the switch PS2 corresponding to the data line D2 to which data are not output during a period after data are output until the differential amplifier 4 starts an amplifying operation, the voltage on the data line D2 can be securely set to the reference voltage line VREF before the differential amplifier 4 starts the amplifying operation. In other words, it is possible to prevent change of the voltage on the data line D2 to which data are not output due to the influence of the coupling capacitance during data output.

By turning off the switches CS1, PS1 corresponding to the data line D1 before data are output to the data line D1, the data line D1 can be turned to a floating state, and a load amount on the data line D1 can be reduced. Thus, the voltage variation amount on the data line D1 which changes in response to data output to the data line D1 can be increased.

Figure 7:
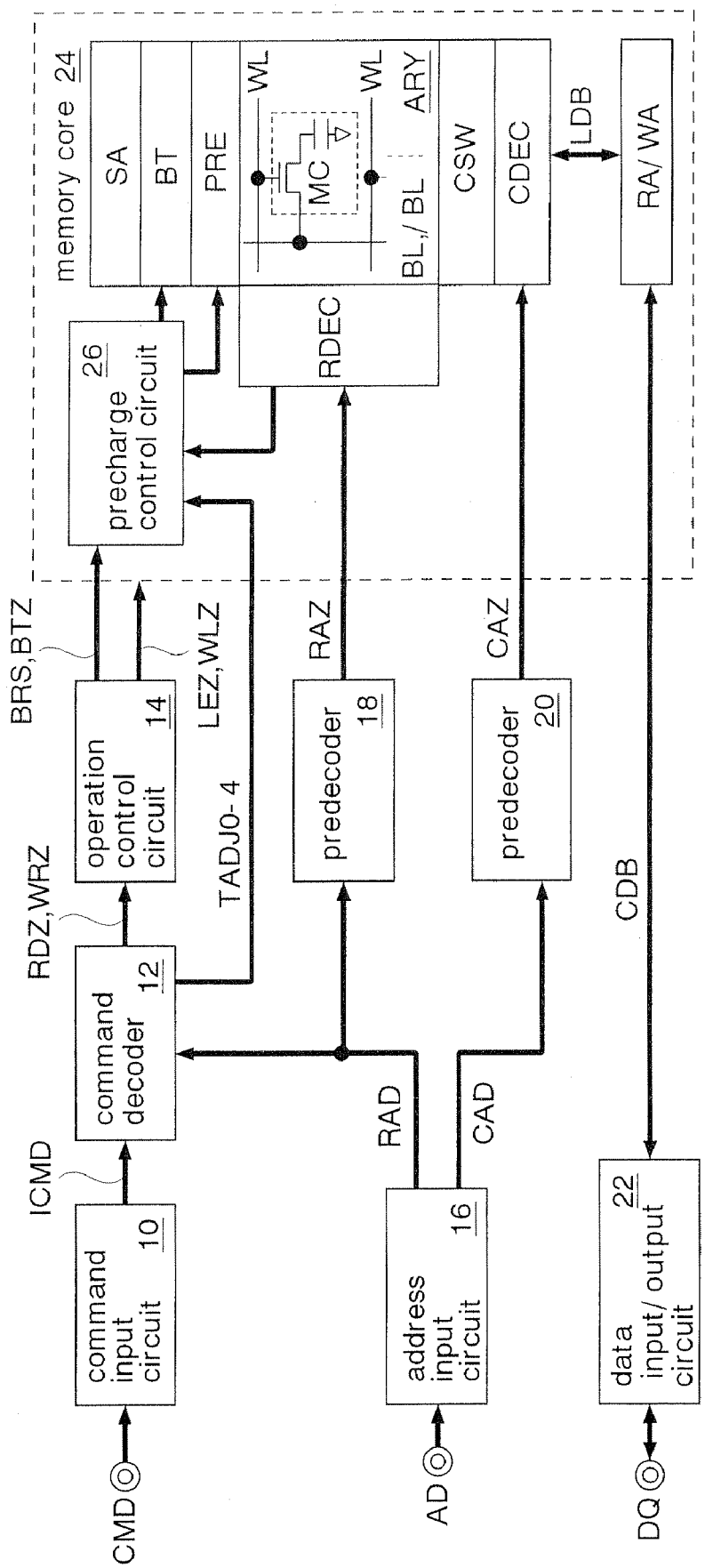
FIG. 7 is a block diagram illustrating a fourth embodiment.

FIG. 7 illustrates a fourth embodiment. Using the CMOS technology, this semiconductor memory is formed as an FCRAM (Fast Cycle RAM) having the memory cells (dynamic memory cell) of DRAM and the interface of SRAM. The FCRAM, which is a kind of pseudo SRAM, executes a refresh operation periodically inside the chip to retain data written in the memory cells without receiving a refresh command from the outside. Note that the embodiment can be applied to both of the clock synchronous type FCRAM and the clock asynchronous type FCRAM.

The FCRAM has a command input circuit 10, a command decoder 12, an operation control circuit 14, an address input circuit 16, predecoders 18, 20, a data input/output circuit 22 and a memory core 24. The memory core 24 has a precharge control circuit 26, a sense amplifier unit SA, a bit line transfer unit BT, a precharge unit PRE, a row decoder unit RDEC, a column switch unit CSW, a column decoder unit CDEC, a read amplifier unit RA and a write amplifier WA. Besides those shown, the FCRAM has a refresh timer, a refresh counter, an arbiter circuit which determines the order of priority of an external access request and an internal refresh request from the refresh timer, a booster circuit which generates a high-level voltage of a word line or the like, a precharge voltage generation circuit which generates a precharge voltage on bit lines BL, /BL, which will be described later, and so on.

The command input circuit 10 receives a command signal CMD (an external access request signal, a mode register setting signal, a test command signal, and so on) supplied via a command terminal CMD, and outputs the received signal as an internal command signal ICMD. The command signal CMD includes, for example, a chip enable signal /CE, an output enable signal /OE, a write enable signal /WE, an upper byte signal /UB and a lower byte signal /LB.

The command decoder 12 decodes the internal command signal ICMD and outputs a read signal RDZ for executing a read operation or a write signal WRZ for executing a write operation. Further, the command decoder 12 decodes the test command signal CMD and a row address signal RAD and activates one of timing adjusting signals TADJ0-4 to a high logic level. Selection of the timing adjusting signals TADJ0-4 becomes possible when the state of the FCRAM changes from a normal operation mode to a test mode by the test command signal CMD. Note that after the FCRAM is powered on, the timing adjusting signal TADJ2 is activated to a high logic level as default, and the other signals TADJ0, 1, 3, 4 are deactivated to low logic levels. The normal operation mode is an operation mode in which an access operation (read operation and write operation) is executed in response to an external access request.

Upon reception of the read signal RDZ, the write signal WRZ or a not-shown refresh request signal, the operation control circuit 14 outputs a basic timing signal such as a bit line reset signal BRS, a bit line transfer signal BTZ, a latch enable signal LEZ, a word line activation signal WLZ, and/or the like so as to enable the memory core 24 to execute a read operation, a write operation or a refresh operation.

The address input circuit 16 receives an address signal AD via an address terminal AD, and outputs the received signal as a row address signal RAD and a column address signal CAD. Note that this FCRAM is the address non-multiplexed type memory which receives an upper address and a lower address simultaneously. The predecoder 18 decodes the row address signal RAD and generates a row decoding signal RAZ. The predecoder 20 decodes the column address signal CAD and generates a column decoding signal CAZ.

The data input/output circuit 22 receives read data from a memory cell MC via a common data bus line CDB and outputs the received data to a data terminal DQ. Further, the data input/output circuit 28 receives write data via the data terminal DQ and outputs the received data to the common data bus line CDB.

The precharge control circuit 26 receives the bit line reset signal BRS, the bit line transfer signal BTZ, the timing adjusting signals TADJ0-4 and row address information from the row decoder RDEC, and outputs switch control signals to the precharge unit PRE and the bit line transfer unit BT. The precharge control circuit 26 operates as a switch control unit which outputs amplifier switch control signals (BLTL1-2, BLTR1-2), precharge switch control signals (BRS1-2) and equalization switch control signals (BRS1-2) for controlling the operations of bit line transfer switches (amplifier switches), precharge switches and equalization switches, which will be described later.

A memory cell array ARY has a plurality of volatile dynamic memory cells MC, a plurality of word lines WL coupled to the dynamic memory cells MC, and a plurality of complementary bit line pairs BL, /BL. Each memory cell MC is identical to the memory cell of a general DRAM, and has a memory cell capacitor for retaining data as an electric charge and a transfer transistor arranged between the capacitor and a bit line BL (or /BL). The gate of the transfer transistor is coupled to a word line WL. By selecting a word line WL, one of a read operation, a write operation and a refresh operation is executed. A triangle mark on a memory cell MC indicates that the memory cell capacitor is coupled to a cell plate voltage line VCP. After executing one of the read operation, the write operation and the refresh operation, the memory cell array ARY executes a precharge operation to set the bit lines BL, /BL to a precharge voltage VPR (reference voltage) in synchronization with the bit line reset signal BRS.

The sense amplifier unit SA has a plurality of sense amplifiers (differential amplifiers) coupled to the bit line pairs BL, /BL, respectively. Each sense amplifier operates in synchronization with activation of sense amplifier activation signals PSD, NSD, which are generated from the latch enable signal LEZ, and amplifies the voltage difference in the bit line pair BL, /BL (coupling wire pair CW, /CW of FIG. 9). Data amplified in the sense amplifier are transmitted to a local data bus line LDB via a column switch during a read operation, and are written in the memory cells MC via the bit lines BL, /BL during a write operation.

The bit line transfer unit BT has a plurality of bit line transfer switches (amplifier switches) for coupling the bit lines BL, /BL to the sense amplifiers. Each bit line transfer switch operates in synchronization with the bit line transfer signal BTZ. In this embodiment, the sense amplifiers are shared by a plurality of memory cell arrays ARY. The bit line transfer unit BT is needed for selectively coupling the bit lines BL, /BL of each memory cell array ARY to the sense amplifiers.

The precharge unit PRE has a plurality of precharge circuits coupled to the bit line pairs BL, /BL, respectively. Each precharge circuit operates in synchronization with activation (high logic level) of the bit line reset signal BRS, and couples the bit lines BL, /BL to a precharge voltage line VPR and couples the bit lines BL, /BL to each other.

The row decoder unit RDEC selects one of the word lines WL according to the row decoding signal RAZ upon reception of the word line activation signal WLZ at a high logic level, and changes the selected word line WL to a high logic level. The column decoder unit CDEC outputs a column selection signal CL, which will be described later, for turning on a column switch according to the column decoding signal CAZ.

The column switch unit CSW has a plurality of column switches coupled to the bit lines BL, /BL, respectively. Each column switch couples the bit lines BL, /BL to local data bus lines LDB shown in FIG. 9, during activation of the column selection signal CL generated by the column decoder CDEC.

The read amplifier RA amplifies a signal amount of read data on the local data bus lines LDB and outputs the data to the common data bus line CDB. The write amplifier WA amplifies a signal amount of write data on the common data bus line CDB and outputs the data to the local data bus lines LDB.

Figure 8:
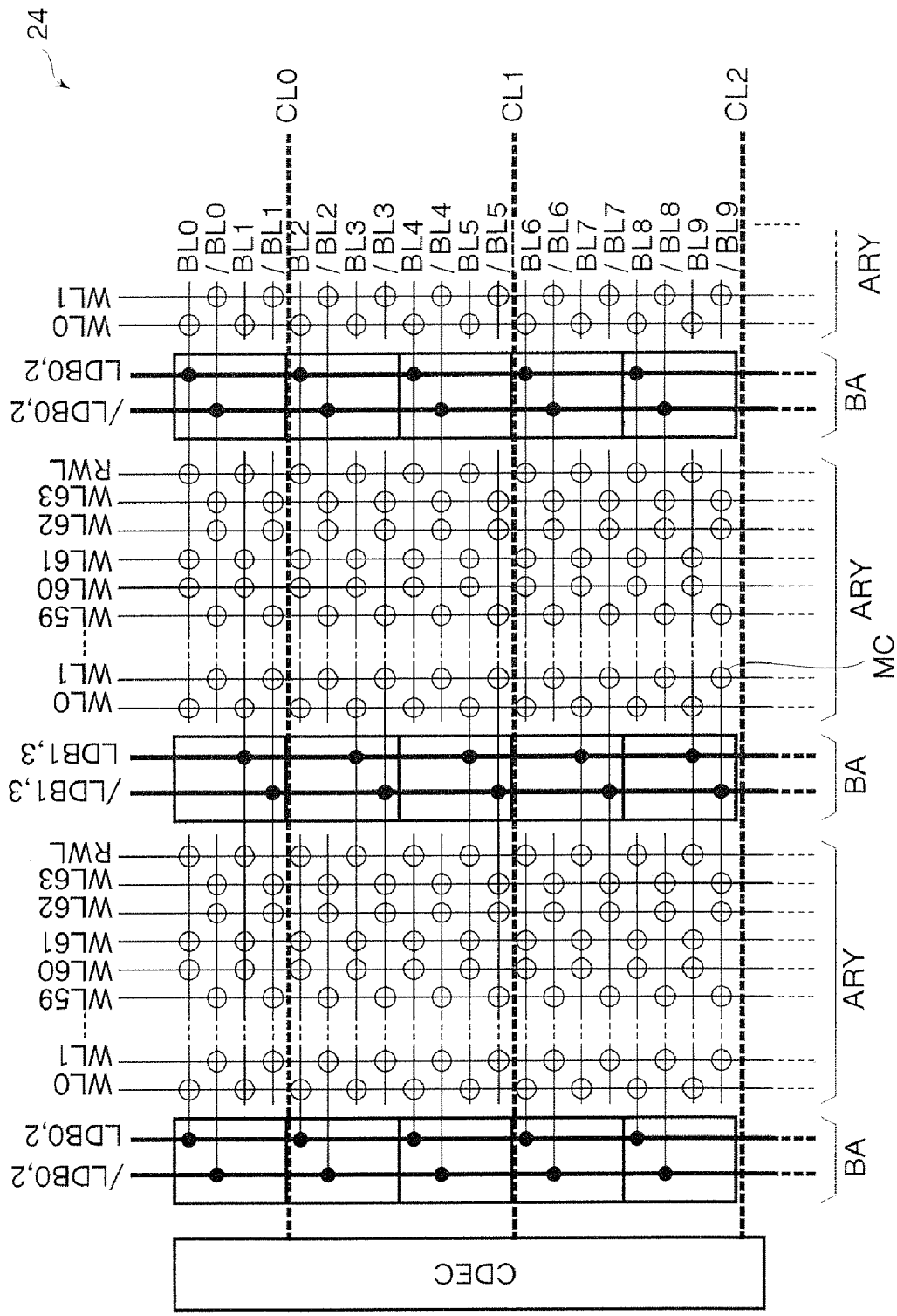
FIG. 8 is a block diagram illustrating an overview of a memory core unit shown in FIG. 7.

FIG. 8 illustrates an overview of the memory core 24 shown in FIG. 7. The memory core 24 has the memory cell arrays ARY and boundary areas BA which are arranged alternately. A thick line frame in the boundary areas BA indicates a formation area of one sense amplifier. The sense amplifier unit SA, the precharge unit PRE, the bit line transfer unit BT and the column switch unit CSW are arranged in a boundary area BA. A boundary area BA is used in common by the bit line pairs BL, /BL (data lines) of a pair of adjacent memory cell arrays ARY. More particularly, each of the boundary areas BA is coupled to the bit line pairs BL, /BL having an even number on the end or the bit line pairs BL, /BL having an odd number on the end. The pair of memory cell array ARY operates as a pair of data output units which output data to one of the bit lines BL, /BL.

Each memory cell array ARY has, for example, 64 word lines WL (WL0-WL63), and a redundancy word line RWL. The redundancy word line RWL is used for relieving a defective memory cell or the like. A circle mark at an intersection part of the word lines WL, RWL and the bit lines BL (or /BL) indicates a memory cell MC. Local data bus lines LDB (LDB0-3, /LDB0-3) are wired above the boundary areas BA. The local data bus lines LDB0-3, /LDB0-3 are coupled to the bit lines BL, /BL via the column switches indicated by black circle marks in the diagram. The column switches are selected using a column selection signal transmitted to the column selection lines CL (CL0 or the like) wired in parallel above the bit lines BL, /BL. The bit line pairs BL, /BL (BL0, /BL0 or the like) arranged in the vertical direction of the diagram in each memory cell array ARY are coupled alternately to the boundary areas BA on both the left and the right side.

Figure 9:
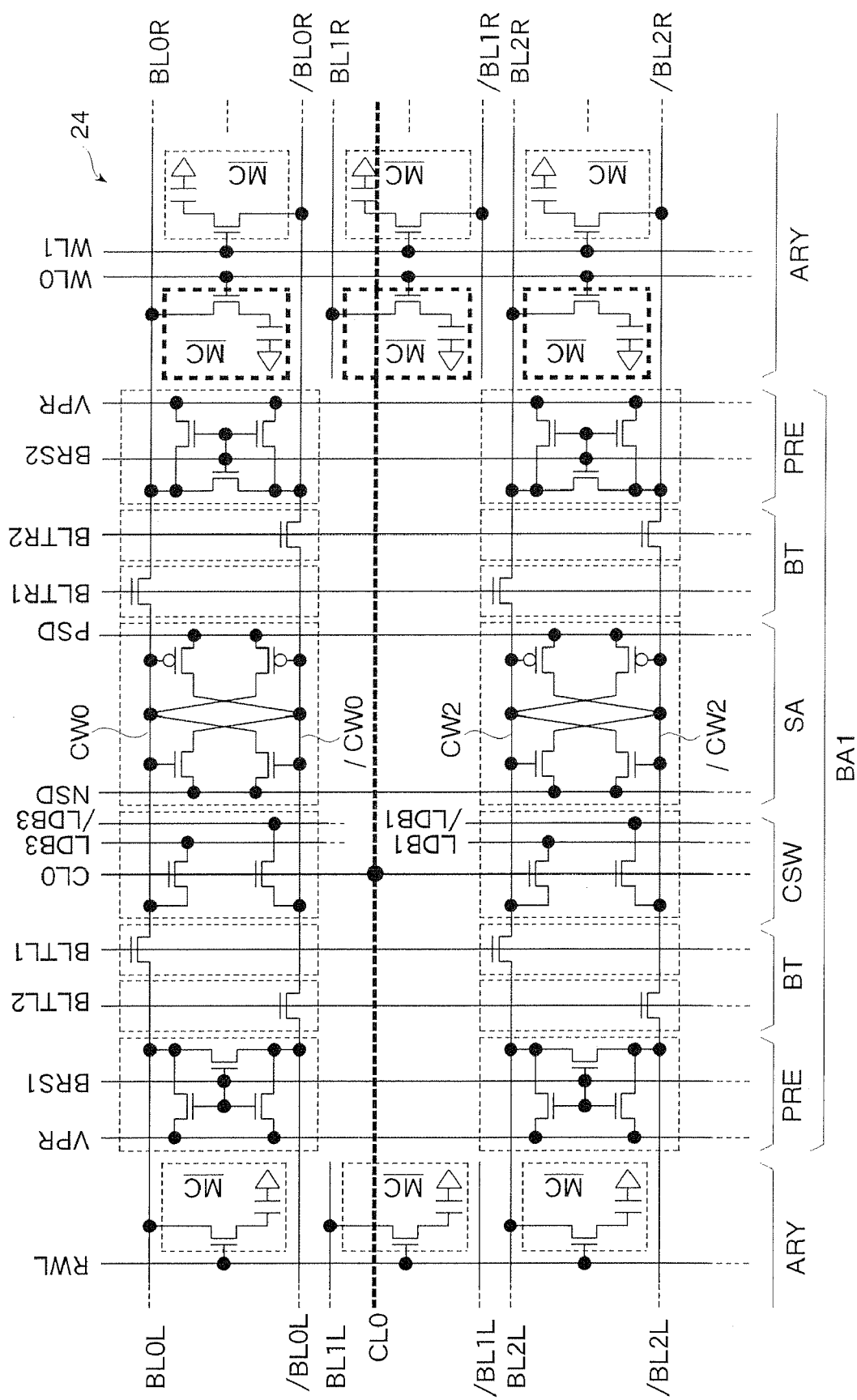
FIG. 9 is a circuit diagram illustrating details of a boundary area shown in FIG. 8.

FIG. 9 illustrates details of a boundary area BA shown in FIG. 8. In the following explanation, circuit elements indicated by dashed line frames and formed in the precharge unit PRE, the bit line transfer unit BT, the column switch unit CSW and the sense amplifier unit SA are also referred to as a precharge circuit PRE, a bit line transfer switch BT, a column switch CSW and a sense amplifier SA. In FIG. 9, "L" and "R" are attached to the ends of the bit lines BL, /BL-formed in the memory cell arrays ARY on the left side and the right side of the boundary area BA, respectively.

The precharge circuit PRE is arranged on the side of the memory cell array ARY with respect to the bit line transfer unit BT. The precharge circuit PRE has a pair of nMOS transistors (precharge switches) for coupling the bit lines BL, /BL to the precharge voltage line VPR, and an nMOS transistor (equalization switch) for coupling the bit lines BL, /BL to each other. The gates of the nMOS transistors of the precharge circuit PRE receive one of the bit line reset signals BRS1-2 (precharge switch control signals, equalization switch control signals). The bit line reset signals BRS1-2 are generated by the precharge control circuit 26 shown in FIG. 7 using the bit line reset signal BRS and the row address information.

The bit line transfer switch BT is formed by an nMOS transistor (amplifier switch). The bit line transfer switch BT couples the bit lines BL, /BL to the sense amplifier SA via the coupling wire pair CW, /CW (CW0, CW2, /CW0, /CW2). The gate of the bit line transfer switch BT receives the bit line transfer signals BLTL1-2, BLTR1-2 (amplifier switch control signals). The bit line transfer signals BLTL1-2, BLTR1-2 are generated by the precharge control circuit 26 using a bit line transfer signal BLT and the row address information. For high level voltages of the bit line reset signals BRS1-2 and the bit line transfer signals BLTL1-2, BLTR1-2, boosted voltages are used for increasing the gate-to-source voltage of the nMOS transistor and lower the on-resistance.

The column switch CSW is formed by an nMOS transistor which couples the bit line BL and the local data bus line LDB and an nMOS transistor which couples the bit line /BL and the local data bus line /LDB. The gate of each nMOS transistor of the column switch CSW receives the column selection signal CL (CL0 in FIG. 9).

The sense amplifier SA is formed by a latch circuit with power supply terminals coupled to sense amplifier activation signal lines NSD, PSD respectively. The sense amplifier activation signal lines NSD, PSD are coupled respectively to the source of a pMOS transistor and the source of an nMOS transistor which form the latch circuit. The sense amplifier activation signal lines NSD, PSD are generated by the precharge control circuit 26 shown in FIG. 7 using the latch enable signal LEZ and the row address information. The sense amplifier SA is shared by the memory cell arrays ARY on both the left and the right side in the diagram.

Figure 10:
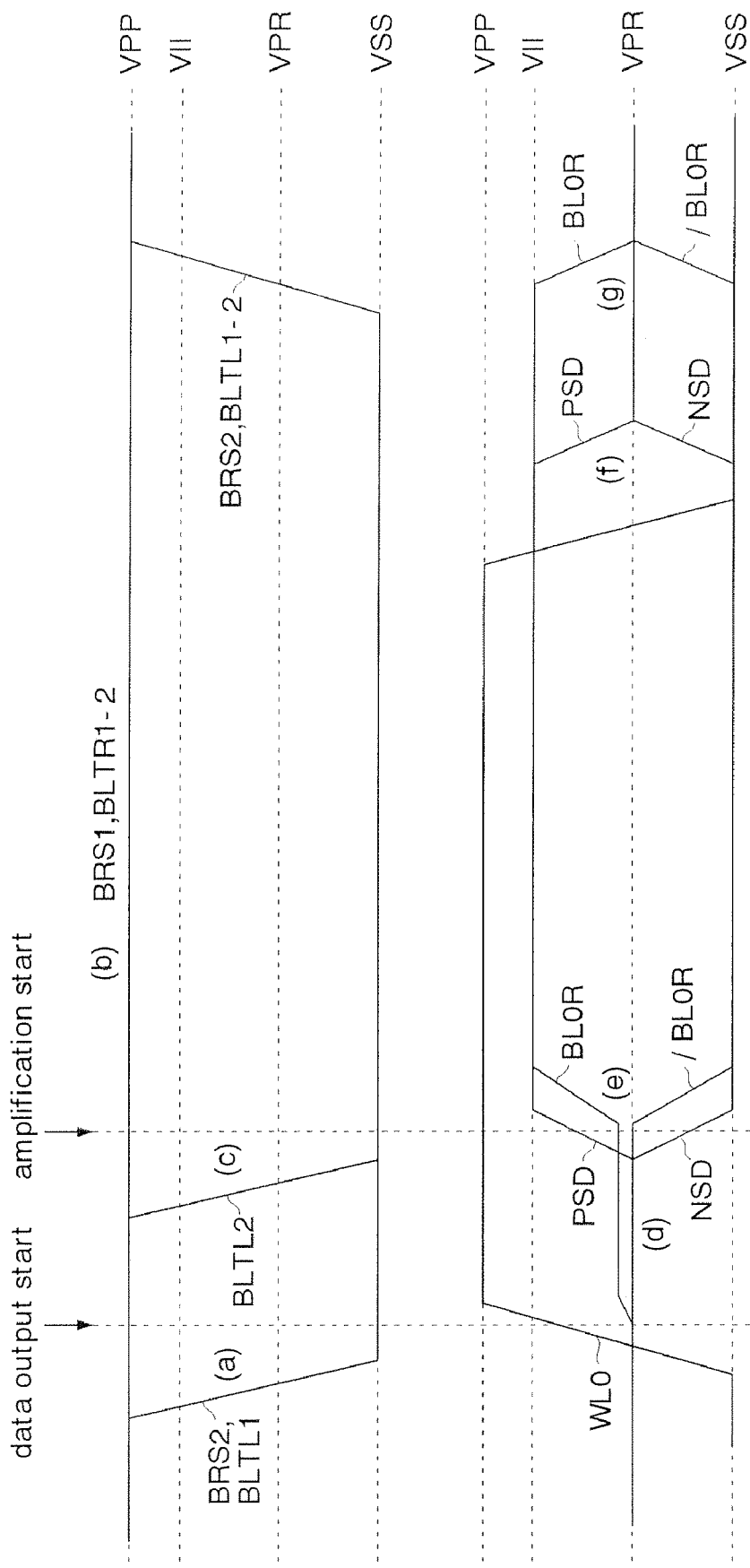
FIG. 10 is a timing chart illustrating a read operation of an FCRAM of the fourth embodiment.

FIG. 10 illustrates a read operation of the FCRAM of the fourth embodiment. In this example, the word line WL0 of the memory cell array ARY on the right side shown in FIG. 9 is selected, and data are read from the memory cells MC coupled to the bit lines BL0R, BL1R, BL2R, which are indicated by the thick dashed line frames in FIG. 9. Note that data read to the bit line BL1R are amplified by a not-shown sense amplifier SA. Detailed explanations of the same operations as in the above-described FIG. 2 are omitted. In the following explanation, the memory cell array ARY on the right side including the memory cells MC from which data are read will be referred to as an active array, and the memory cell array ARY on the left side including memory cells MC from which data are not read will be referred to as an inactive array.

In the read operation, after data are read to the bit line BL0R from the memory cells MC of the memory cell array ARY on the right side in the diagram due to activation of the word line WL0, the voltage difference in the bit line pair BL0R, /BL0R is amplified by the sense amplifier SA. Before the read operation, the nMOS transistors of the precharge circuits PRE and the bit line transfer switches BT are all on. Thus, all the bit lines BL, /BL are precharged to the precharge voltage VPR.

The bit lines BL0R, /BL0R correspond to the data lines DR1, DR2 in FIG. 2. The bit lines BL0L, /BL0L correspond to the data lines DL1, DL2 in FIG. 2. The bit reset signal BRS1 corresponds to the switch control signals which control the operations of the switches PSL1-2, ESL1 in FIG. 2. The bit line reset signal BRS2 corresponds to the switch control signals which control the operations of the switches PSR1-2, ESR1 in FIG. 2. The bit line transfer signals BLTL1, BLTL2 correspond to the switch control signals which control the operations of the switches ASL1, ASL2 in FIG. 2. The bit line transfer signals BLTR1, BLTR2 correspond to the switch control signals which control the operations of the switches ASR1, ASR2 in FIG. 2

Just before the word line WL0 is activated to a high level voltage VPP, the bit line reset signal BRS2 is deactivated to a low logic level, and the coupling of the bit lines BL, /BL on the active array side and the precharge voltage line VPR is released. Simultaneously, the bit line transfer signal BLTL1 is deactivated to a low logic level, and the coupling of the bit line BL0L on the inactive array side corresponding to the bit line BL0R to which data are output and the sense amplifier SA is released (FIG. 10(a)).

The bit line reset signal BRS1 and the bit line transfer signals BLTR1-2 are held at a high level voltage VPP during the read operation (FIG. 10(b)). After the word line WL0 is activated, the bit line transfer signal BLTL2 is held at the high level voltage VPP until just before the sense amplifier activation signals PSD, NSD are activated (FIG. 10(c)).

Note that in this embodiment, off-timing of the bit line transfer switch BT on the inactive array side corresponding to the bit line /BL0R to which data are not output is adjustable during the test mode. In this embodiment, deactivation timing of the bit line transfer signal BLTL2 is adjustable. A circuit necessary for adjustment and an adjustment method will be explained with FIG. 11 and FIG. 12, which will be described later.

During the high logic level period (VPP) of the bit line transfer signal BLTL2, the bit line /BL0R to which data are not output on the active array side is coupled to the precharge voltage line VPR via the bit line transfer switch BT and the precharge circuit PRE on the inactive array side. Furthermore, the bit line /BL0R is also coupled to the bit line BL0L which is charged to the precharge voltage VPR by the equalization switch of the precharge circuit PRE on the inactive array side. Accordingly, when data are read to the bit line BL0R by activation of the word line WL0, change of the voltage on the bit line /BL0R due to the influence of the coupling capacitance with the bit line BL0R is prevented securely (FIG. 10(d)). Specifically, decrease of the voltage difference in the bit line pair BL0R, /BL0R is prevented.

Next, the sense amplifier activation signals PSD, NSD are activated respectively from the deactivated level (VPR). The sense amplifier SA starts an amplifying operation, and the voltage difference in the bit line pair BL0R, /BL0R is amplified (FIG. 10(e)). Thereafter, a not-shown column selection signal CL0 is activated to a high logic level, and the read data are output to the local data bus lines LDB, /LDB.

Next, the word line WL0 and the sense amplifier activation signals PSD, NSD are deactivated sequentially (FIG. 10(f)). By deactivation of the sense amplifier activation signals PSD, NSD, the amplifying operation by the sense amplifier SA stops. Next, the bit line reset signal BRS2 and the bit line transfer signals BLTL1-2 change to the high level voltage VPP, and the bit line pair BL0R, /BL0R on the active array side are precharged to the precharge voltage VPR, thereby completing the read operation (FIG. 10(g)). Thus, change of the voltages on the bit lines due to the influence of the coupling capacitance can be prevented without adding a special element to the sense amplifier unit SA in the current state.

Figure 11:
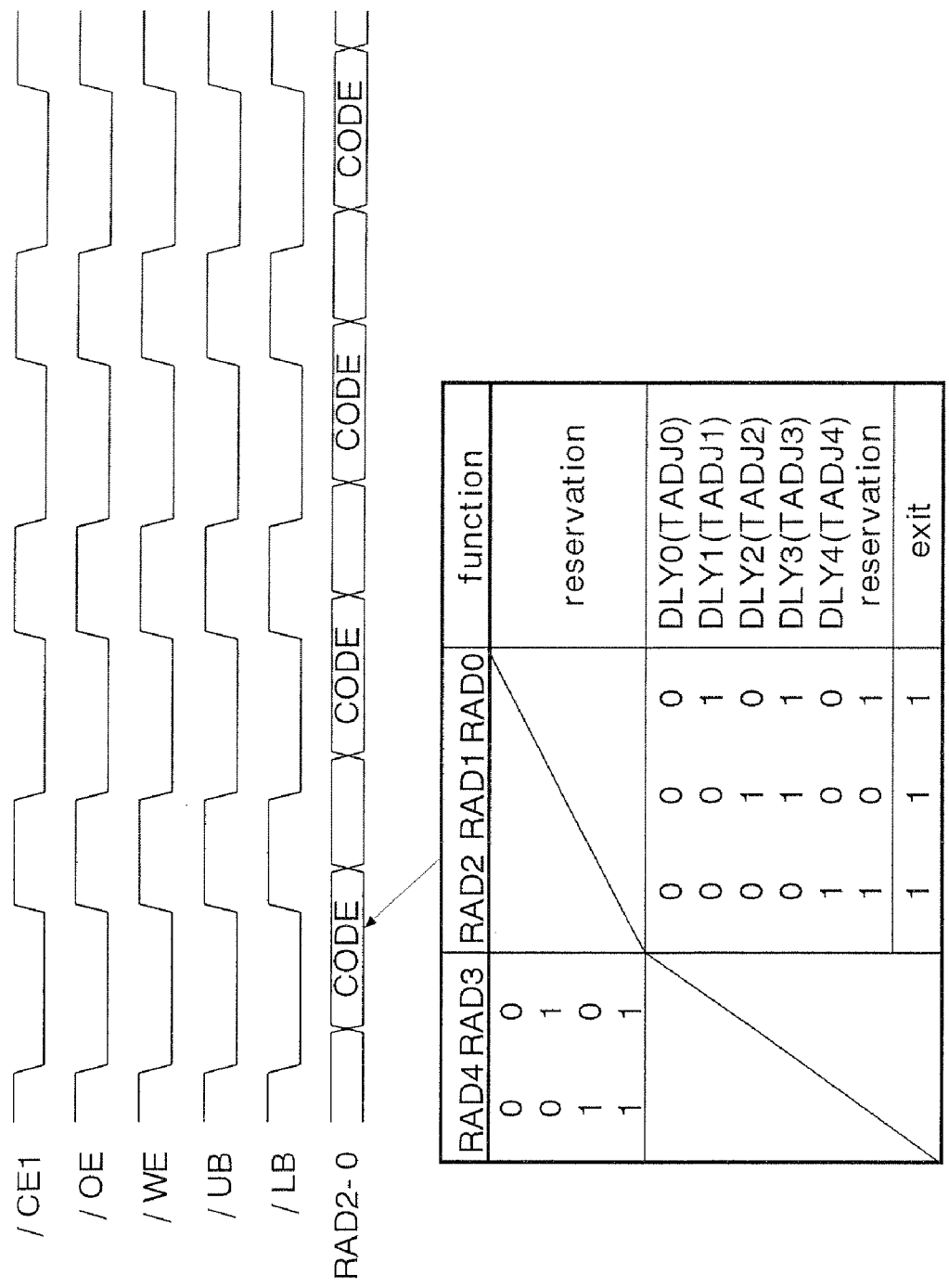
FIG. 11 is an explanatory chart illustrating a test command sequence of the fourth embodiment.

FIG. 11 illustrates a test command sequence when changing off-timing of the bit line transfer switch BT on the inactive array side corresponding to the bit line to which data are output. A test command is accepted by asserting the chip enable signal /CE, the output enable signal /OE, the write enable signal /WE, the upper byte signal /UB and the lower byte signal /LB to low logic levels continuously for four times. At this time, the state of the FCRAM changes from the normal operation mode to the test mode.

Off-timing of the bit line transfer signal BLTL2 is changed by a test code CODE supplied to the address terminal AD (RAD4-0) together with the test command. Specifically, a timing changing circuit 26a shown in FIG. 12 can adjust the off-timing of the bit line transfer signal BLTL2 only during the test mode. Further, the command input circuit 10 and the address input circuit 16 operate as a command input circuit which receives a timing changing command for changing the off-timing of the bit line transfer switch BT.

The output enable signal /OE is set to a low logic level when a read operation is executed, and the write enable signal /WE is set to a low logic level when a write operation is executed. Accordingly, the test command by which the signals /OE, /WE change to low logic levels simultaneously is an illegal command which is not used in a normal read operation and write operation.

In this embodiment, upon reception of address signals RAD2-0 of "000" in binary number together with the test command, the command decoder 12 shown in FIG. 7 sets the off-timing of the bit line transfer switch BT to a minimum value DLY0, and activates only the timing adjusting signal TADJ0 to a high logic level. Similarly, the command decoder 12 activates one of the timing adjusting signals TADJ0-4 to a high logic level so as to set the off-timing of the bit line transfer switch BT to DLY1-4 according to the address signals RAD2-0 supplied together with the test command.

Further, upon reception of the address signals RAD2-0 of "111" in binary number, the command decoder 12 exits from the test mode and returns to the normal operation mode (exit command). By receiving the test code CODE using the address terminal AD, timing of a plurality of switches can be changed easily. For example, by selecting a switch with a reserved address signals RAD4-3, timing can be adjusted for each of the switches. The off-timing adjusted during the test mode is retained until the power of the FCRAM is turned off or until the off-timing is adjusted again by the test command.

In this embodiment, deactivation timing (off-timing) of the bit line transfer signal BLTL2 is evaluated using the test command. When the default timing (TADJ2) is determined not to be the optimum by the evaluation, the photomask for producing the FCRAM is changed for example so as to set the deactivation timing of the bit line transfer signal BLTL2 to the optimum.

Note that by combining this embodiment with the seventh embodiment (fuse circuit 34), which will be described later, the deactivation timing of the bit line transfer signal BLTL2 can be set to the optimum without changing the photomask. First, using the test command, the optimum deactivation timing of the bit line transfer signal BLTL2 is evaluated. Next, the fuse can be programmed according to the evaluation result.

Figure 12:
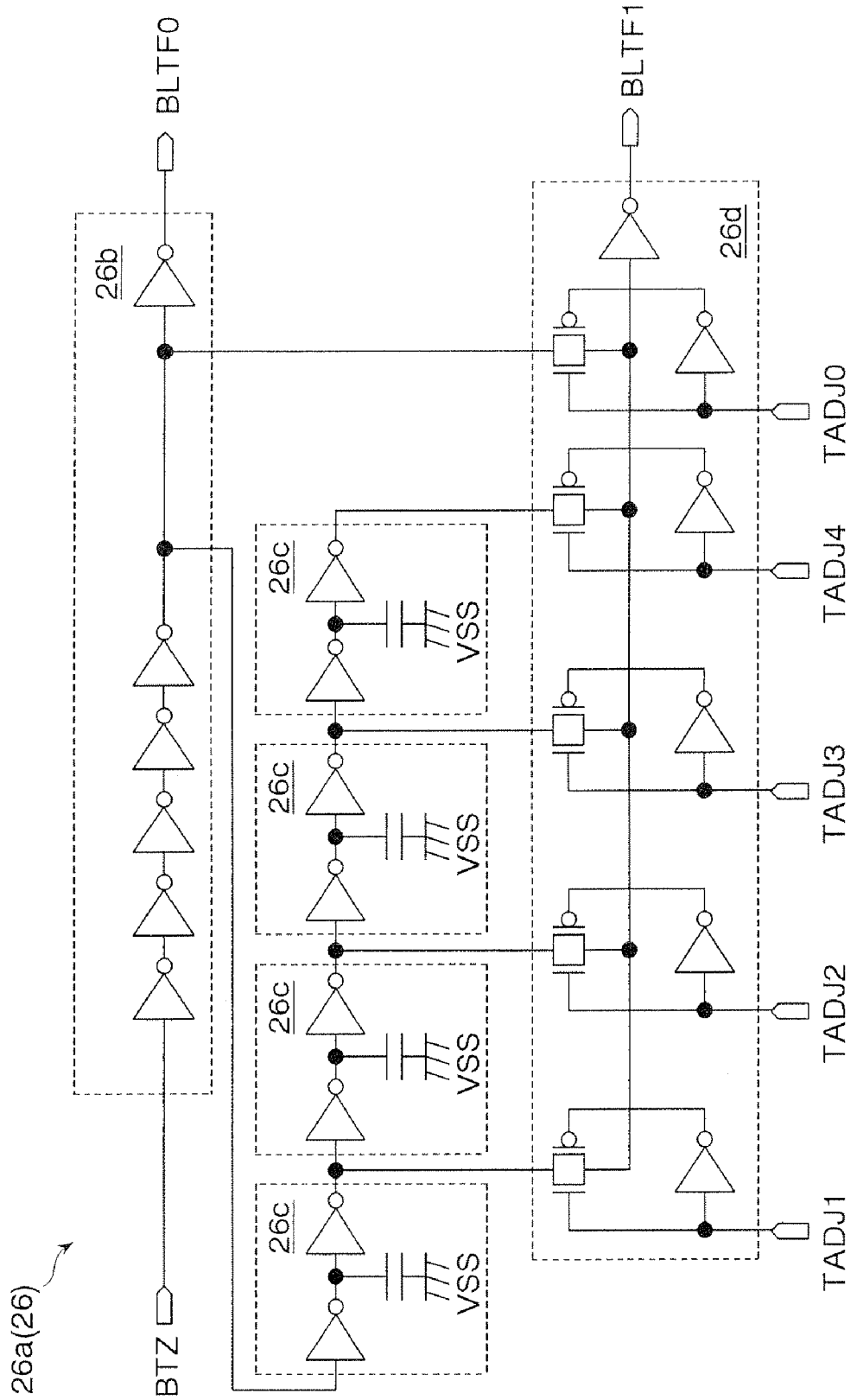
FIG. 12 is a circuit diagram illustrating a timing changing circuit formed in a precharge control circuit shown in FIG. 7.

FIG. 12 illustrates a timing changing circuit 26a which generates a timing signal BLTF1 that determines the off-timing of a bit line transfer switch BT in the precharge control circuit 26 shown in FIG. 7. The timing changing circuit 26a has a buffer circuit 26b, four cascade coupled delay circuits 26c, and a selection circuit 26d which selects one of outputs of the buffer circuit 26b and the delay circuits 26c.

The buffer circuit 26b delays a bit line transfer signal BT from the operation control circuit 14 to generate a timing signal BLTF0. The timing signal BLTF0 sets off-timing (the bit line transfer signal BLTL1 of (a) in FIG. 10) of the bit line transfer switch BT on the inactive array side corresponding to the bit line to which data are output. The delay circuits 26c each have a pair of inverters and a capacitor coupled between the inverters.

The selection circuit 26d has a CMOS transmission gate for selectively outputting an output signal from each delay circuit 26c and an output signal from the buffer circuit 26b as the timing signal BLTF1 via an inverter The timing signal BLTF1 sets off-timing (the bit line transfer signal BLTL2 of (c) in FIG. 10) of the bit line transfer switch BT on the inactive array side corresponding to the bit line to which data are not output.

Note that when the word line WL1 is selected, the timing signal BLTF0 sets deactivation timing of the bit line transfer signal BLTL2, and the timing signal BLTF1 sets deactivation timing of the bit line transfer signal BLTL1. Further, when the memory cell array ARY on the left side in FIG. 9 is accessed, the timing signal BLTF0 sets deactivation timing of one of the bit line transfer signals BLTR1-2. The timing signal BLTF1 sets deactivation timing of the other of the bit line transfer signals BLTR1-2.

Upon activation of each of the timing adjusting signals TADJ1-4, the selection circuit 26d selects an output of the delay circuits 26c at a first to a fourth stage, inverts the level of the selected output and outputs it as the timing signal BLTF1. Specifically, the selection circuit 26d changes the load amount existing on a signal path for generating the bit line transfer signal BLTL2 to change the deactivation timing of the bit line transfer signal BLTL2.

Upon activation of the timing adjusting signal TADJ0, the selection circuit 26d inverts the output of the buffer circuit 26b and outputs it as the timing signal BLTF1. Thus, when the timing adjusting signal TADJ0 is activated, off-timing of the pair of bit line transfer switches BT on the inactive array side becomes the same. Specifically, the off-timing of the bit line transfer switches BT on the inactive array side corresponding to the bit line to which data are not output is set before the word line WL is activated.

Note that by forming the plurality of timing changing circuits 26a in the precharge control circuit 26, it is also possible to adjust deactivation timing (off-timing) of a switch control signal such as the other bit line transfer signal BLTL1, the bit line reset signals BRS1-2, and the like. Alternatively, it is also possible to adjust activation timing (on-timing) of the switch control signal. At this time, timing of the switch control signal can be easily adjusted by increasing bits of the address signal RAD used for the test code CODE supplied together with the test command.

Figure 13:
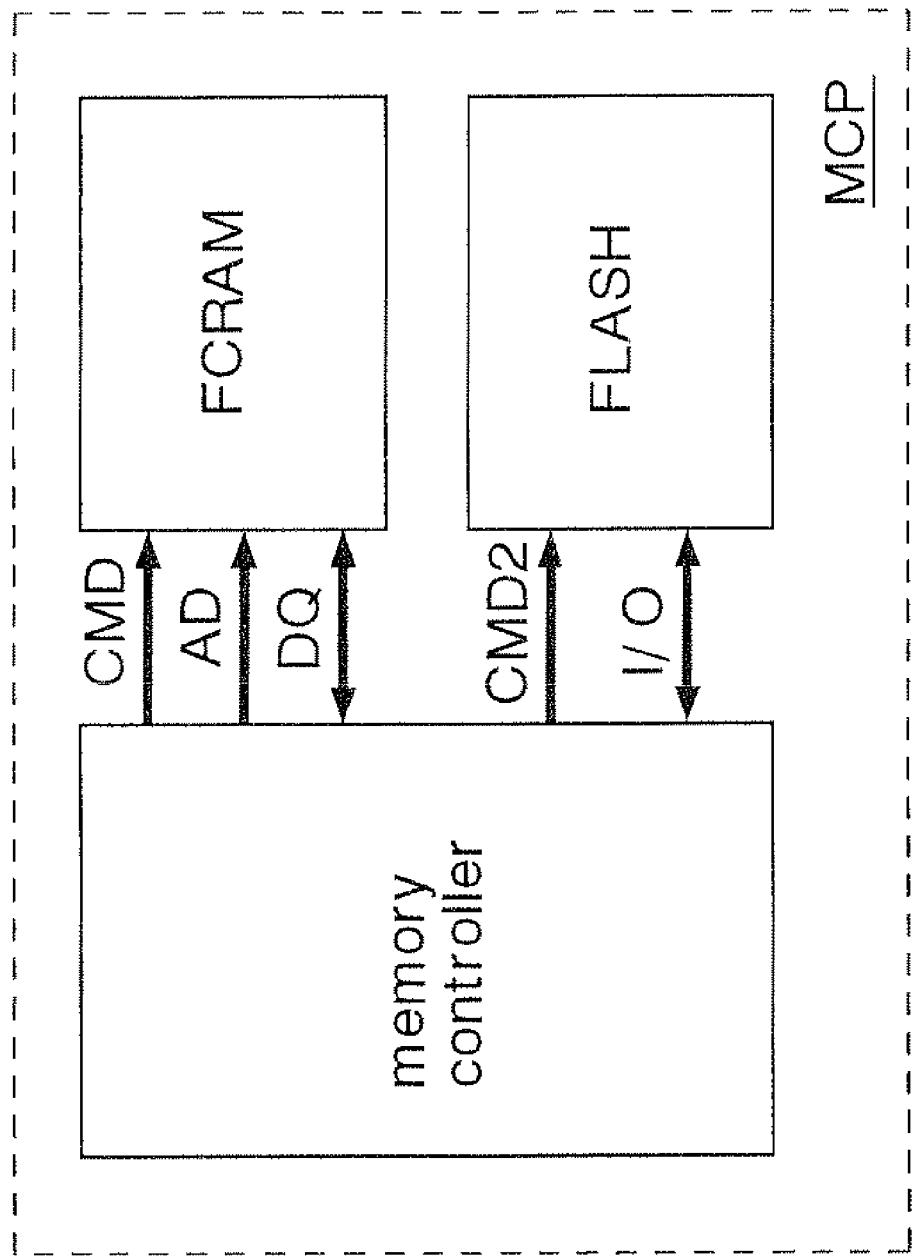
FIG. 13 is a block diagram illustrating a multi-chip package in which the FCRAM of the fourth embodiment is mounted.

FIG. 13 illustrates a multiple package MCP (system) in which the above-described FCRAM is mounted. In the multiple package MCP, besides the FCRAM, there are mounted a flash memory (hereinafter referred to as FLASH) and a memory controller for accessing the FCRAM and the FLASH. The embodiment can also be applied to a semiconductor integrated circuit such as the FCRAM mounted in the multiple package MCP.

As above, also in this embodiment, the same effects as in the above-described embodiments can be obtained. Furthermore, by the timing changing circuit 26a, the optimum deactivation timing of a bit line transfer signal (BLTL2 or the like) can be evaluated. By feeding back the evaluation result to the manufacturing process or the designing process, an FCRAM with a large read margin of data can be formed. In other words, the yield of the FCRAM can be improved.

The deactivation timing of the bit line transfer signal BLTL2 can be changed easily by changing a load amount existing on the signal path for generating the bit line transfer signal BLTL2 by the selection circuit 26d. The same applies to the deactivation timing of the bit line transfer signal BLTL2.

Figure 14:
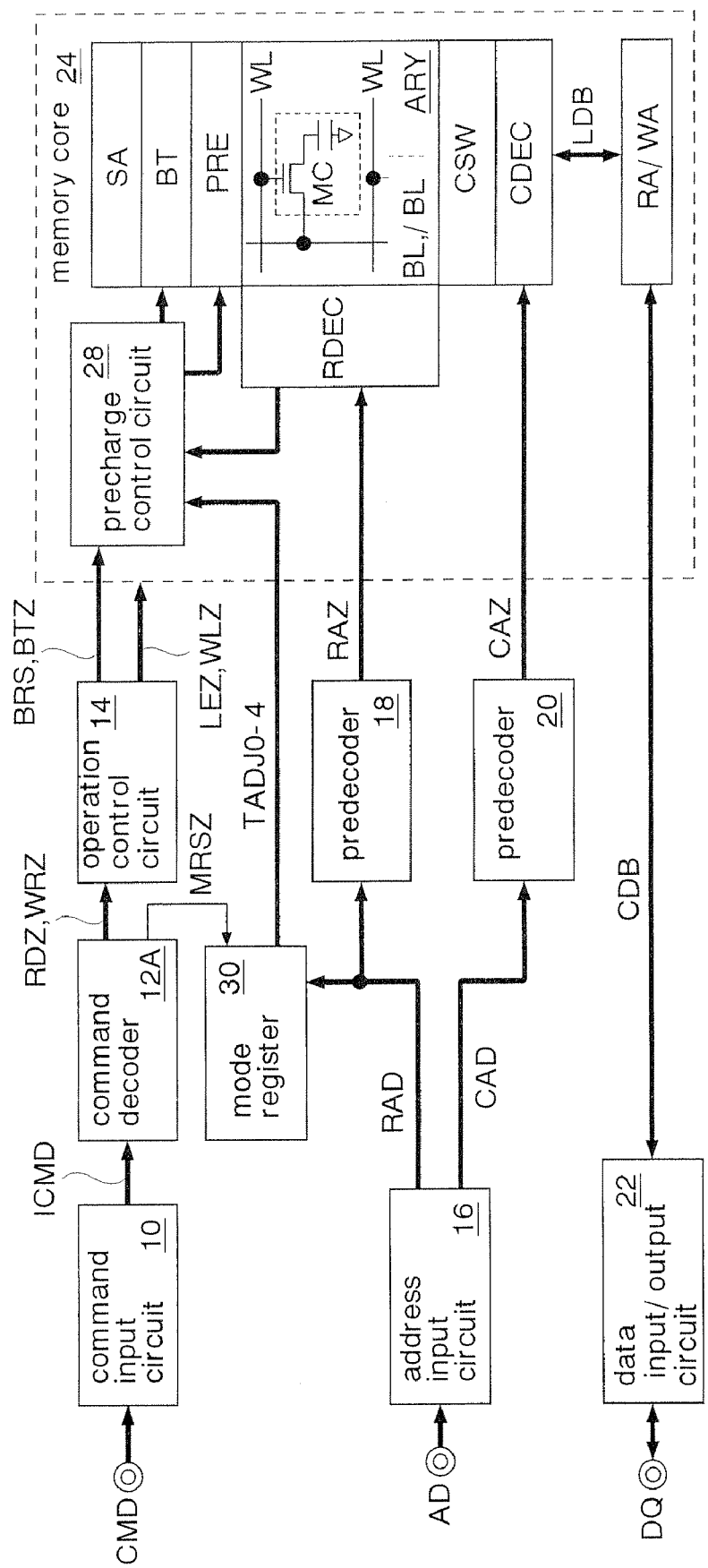
FIG. 14 is a block diagram illustrating a fifth embodiment.

FIG. 14 illustrates a fifth embodiment. The same elements as those explained in the above-described embodiments are given the same reference signs, and detailed explanations thereof are omitted. In this embodiment, a command decoder 12A and a precharge control circuit 28 are formed instead of the command decoder 12 and the precharge control circuit 26 of the fourth embodiment (FIG. 7). In addition, a mode register 30 is newly formed. The other structure is the same as in the fourth embodiment. Specifically, the semiconductor integrated circuit in this embodiment is formed as an FCRAM.

The command decoder 12A has a function to activate a mode register set signal MRSZ when a mode register set command is decoded, in addition to the function of the fourth embodiment. The mode register 30 receives the address signal RAD in synchronization with activation of the mode register set signal MRSZ, and activates one of the timing adjusting signals TADJ0-4 according to the received address signal RAD. Specifically, in this embodiment, deactivation timing of the bit line transfer signal BLTL2 changes according to a value set in the mode register 30. The relationship between the address signal RAD and the timing adjusting signals TADJ0-4 to be activated is the same as in FIG. 11.

The precharge control circuit 28 adjusts off-timing of the bit line transfer switch BT on the inactive array side corresponding to the bit line to which data are not output according to the timing adjusting signals TADJ0-4, similarly to the fourth embodiment.

Figure 15:
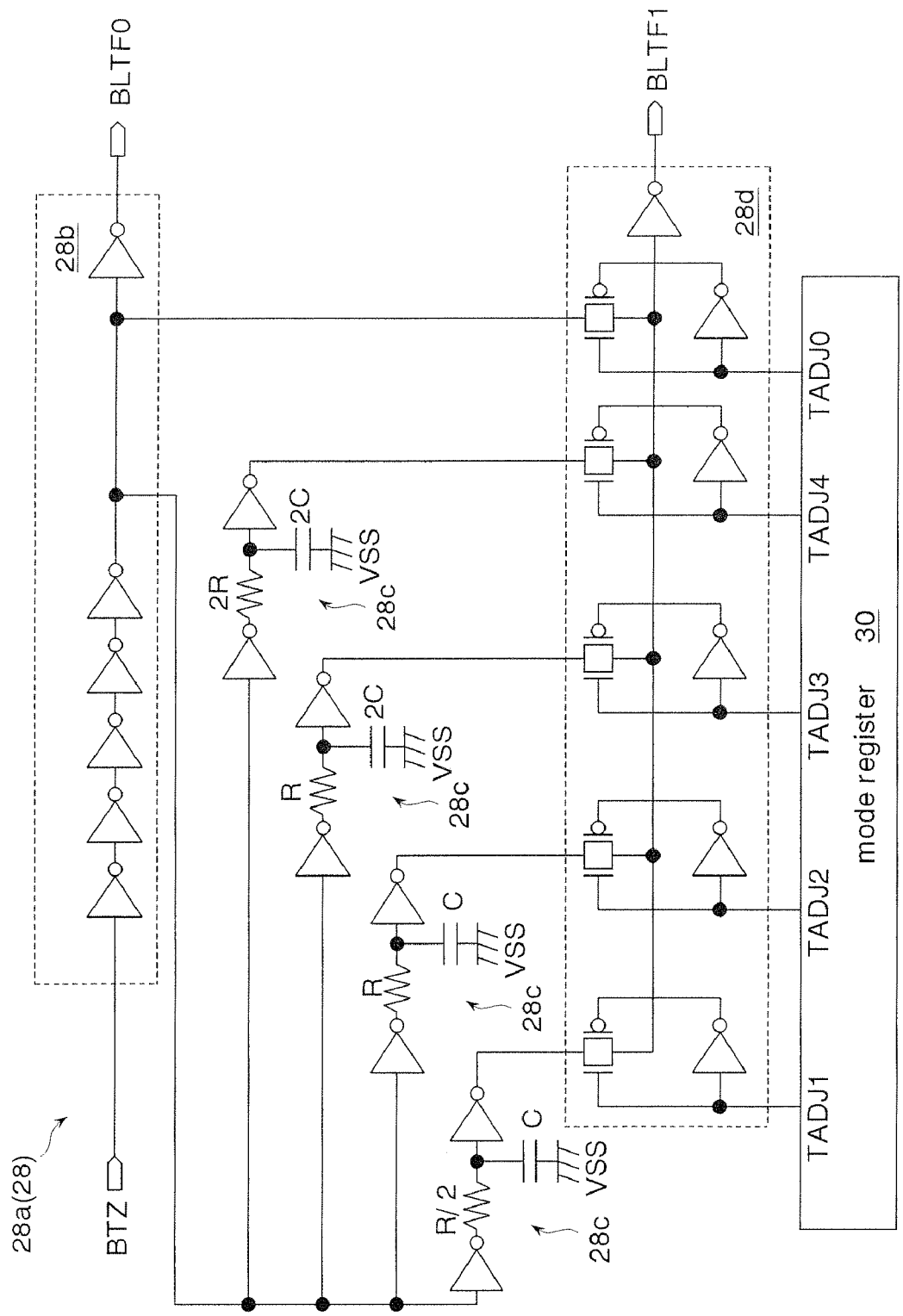
FIG. 15 is a circuit diagram illustrating a timing changing circuit formed in a precharge control circuit shown in FIG. 14.

FIG. 15 illustrates a timing changing circuit 28a which generates the timing signal BLTF1 which determines off-timing of the bit line transfer switch BT in the precharge control circuit 28 shown in FIG. 14. The timing changing circuit 28a has a buffer circuit 28b, four delay circuits 28c, and a selection circuit 28d which selects one of outputs of the buffer circuit 28b, and the delay circuits 28c.

The buffer circuit 28b and the selection circuit 28d are the same as the buffer circuit 26b and the selection circuit 26d in the fourth embodiment. The delay circuits 28c each have a pair of inverters and a resistor and a capacitor coupled between the inverters. The delay circuits 28c commonly receive the bit line transfer signal BTZ, and output a delayed signal to the selection circuit 28d. The delay time in the delay circuits 28c is set according to a time constant determined by the resistor and the capacitor. Thus, the larger the product of the resistance value and the capacitance, the longer the delay time in the delay circuits 28c becomes. The resistors R/2, 2R indicate that they have a resistance value of the half and the double of that of the resistor R, respectively. Similarly, the capacitors 2C indicate that they have a capacitance of the double of that of the capacitors C.

The selection circuit 28d selects an output of one of the delay circuits 28c or an output of the buffer circuit 28b according to the timing adjusting signals TADJ0-4 to be activated, similarly to the fourth embodiment. Specifically, the selection circuit 28d changes deactivation timing of the bit line transfer signal BLTL2 by changing a load amount existing on the signal path for generating the bit line transfer signal BLTL2.

Figure 16:
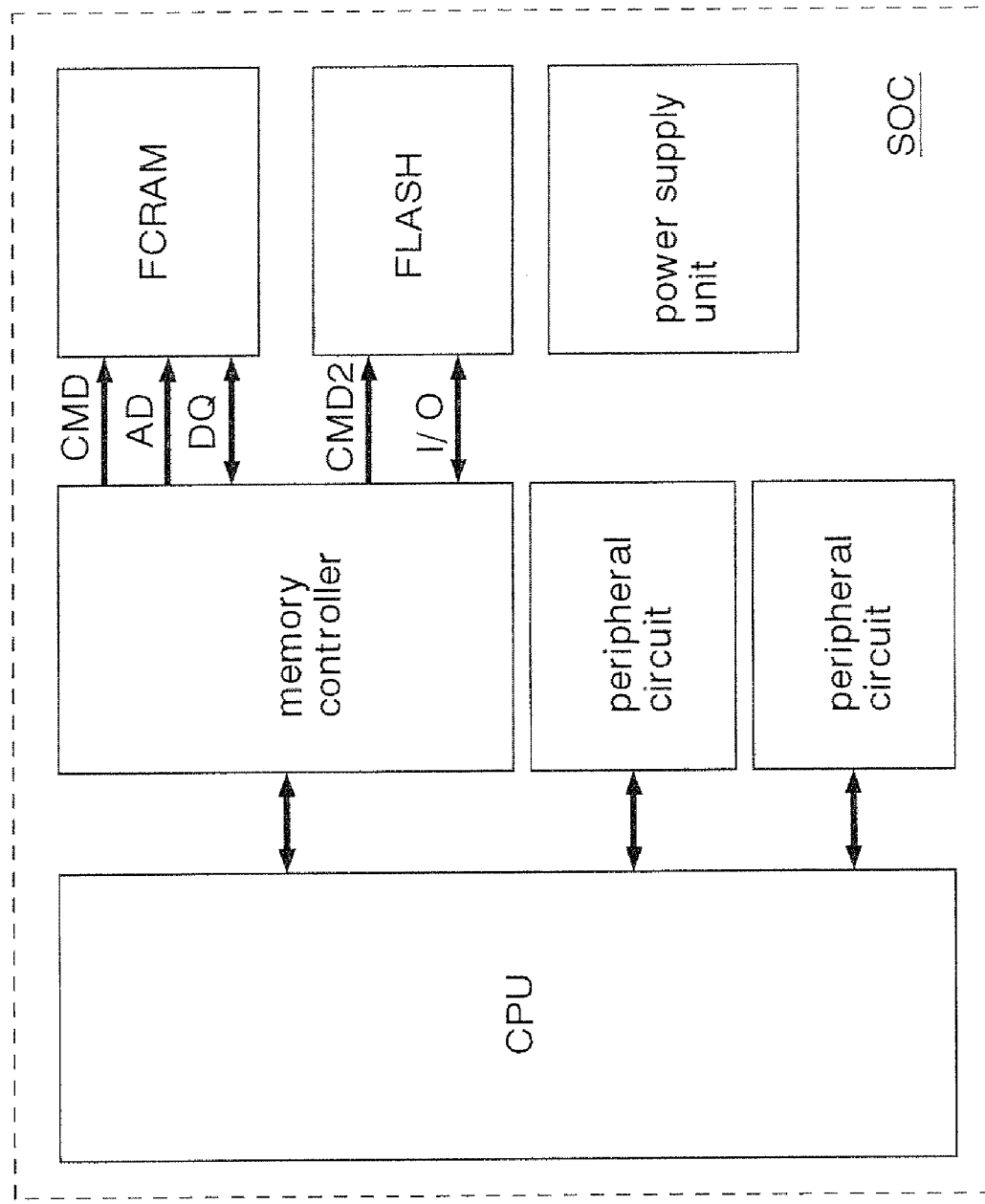
FIG. 16 is a block diagram illustrating a silicon-on-chip in which an FCRAM of the fifth embodiment is embedded.

FIG. 16 illustrates a silicon-on-chip SOC (system) in which the above-described FCRAM is embedded. The SOC has a CPU, a memory controller, a peripheral circuit, a FLASH and a power supply unit, besides the above-described FCRAM. The memory controller operates for accessing the FCRAM and the FLASH by the CPU. The peripheral circuit is a timer, a communication interface, or the like. The power supply unit generates several types of power supply voltages used in the SOC. The embodiment can also be applied to the semiconductor integrated circuit such as the FCRAM or the like embedded in the silicon-on-chip SOC.

As above, also in this embodiment, the same effects as in the above-described embodiments can be obtained. Furthermore, deactivation timing of a bit line transfer signal (BLTL2 for example) can be adjusted by the mode register 30.

Figure 17:
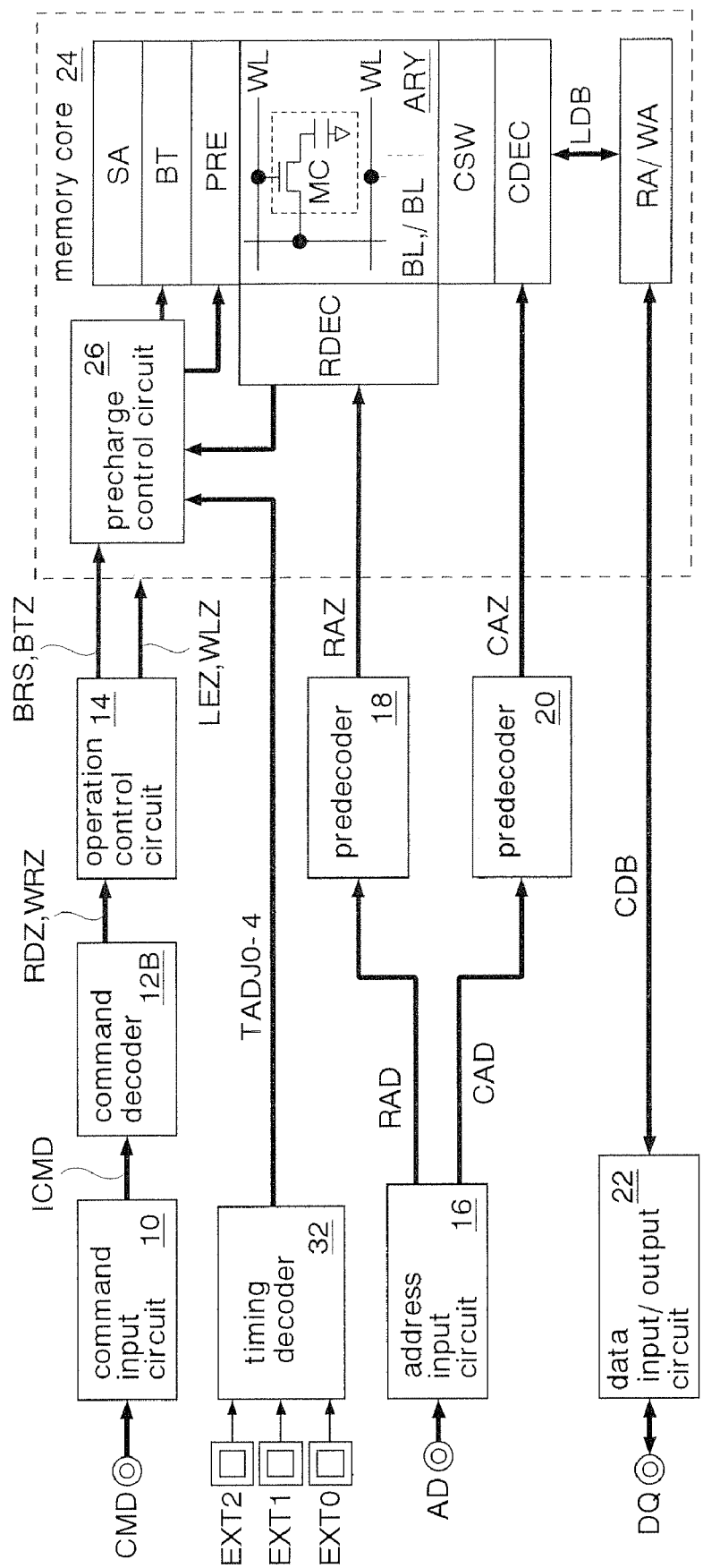
FIG. 17 is a block diagram illustrating a sixth embodiment.

FIG. 17 illustrates a sixth embodiment. The same elements as those explained in the above-described embodiments are given the same reference signs, and detailed explanations thereof are omitted. In this embodiment, a command decoder 12B is formed instead of the command decoder 12 in the fourth embodiment (FIG. 7). In addition, a timing decoder 32 is newly formed. The other structure is the same as in the fourth embodiment. Specifically, the semiconductor integrated circuit in this embodiment is formed as an FCRAM.

The command decoder 12B is the same as the command decoder in FIG. 7 except that it does not have a function to output the timing adjusting signals TADJ0-4. The timing decoder 32 decodes the logic levels of external test signals EXT2-0 supplied via test pads EXT2-0 from the outside of the FCRAM, and activates one of the timing adjusting signals TADJ0-4.

The relationship between the external test signals EXT2-0 and the timing adjusting signals TADJ0-4 to be activated is the same as the relationship between the address signals RAD2-0 and the timing adjusting signals TADJ0-4 in FIG. 11. The not-shown timing changing circuit 26a in the precharge control circuit 26 changes deactivation timing (off-timing) of the bit line transfer signal BLTL2 according to the timing adjusting signals TADJ0-4. Specifically, in this embodiment, deactivation timing of the bit line transfer signal BLTL2 is changed according to the logic levels of signals supplied to the test pads EXT2-0.

In this embodiment, the test pads EXT2-0 are pulled up to a power supply line in the FCRAM. Thus, when the external test signals EXT2-0 are not supplied (default state), the timing decoder 32 receives the external test signals EXT2-0 at high logic levels. At this time, the timing decoder 32 activates only the timing adjusting signal TADJ2 to a high logic level.

Note that by bonding the test pads EXT2-0 to the power supply line or the ground line before packaging the FCRAM, deactivation timing of the bit line transfer signal BLTL2 can be set to the optimum for every FCRAM chip, and the FCRAM can be shipped in this state.

As above, also in this embodiment, the same effects as in the above-described embodiments can be obtained. Furthermore, deactivation timing of the bit line transfer signal BLTL2 can be adjusted according to the external test signals EXT2-0 supplied from the outside of the FCRAM. Accordingly, in the manufacturing process (in a test process for example) of the FCRAM, the read margin can be adjusted for every FCRAM.

Figure 18:
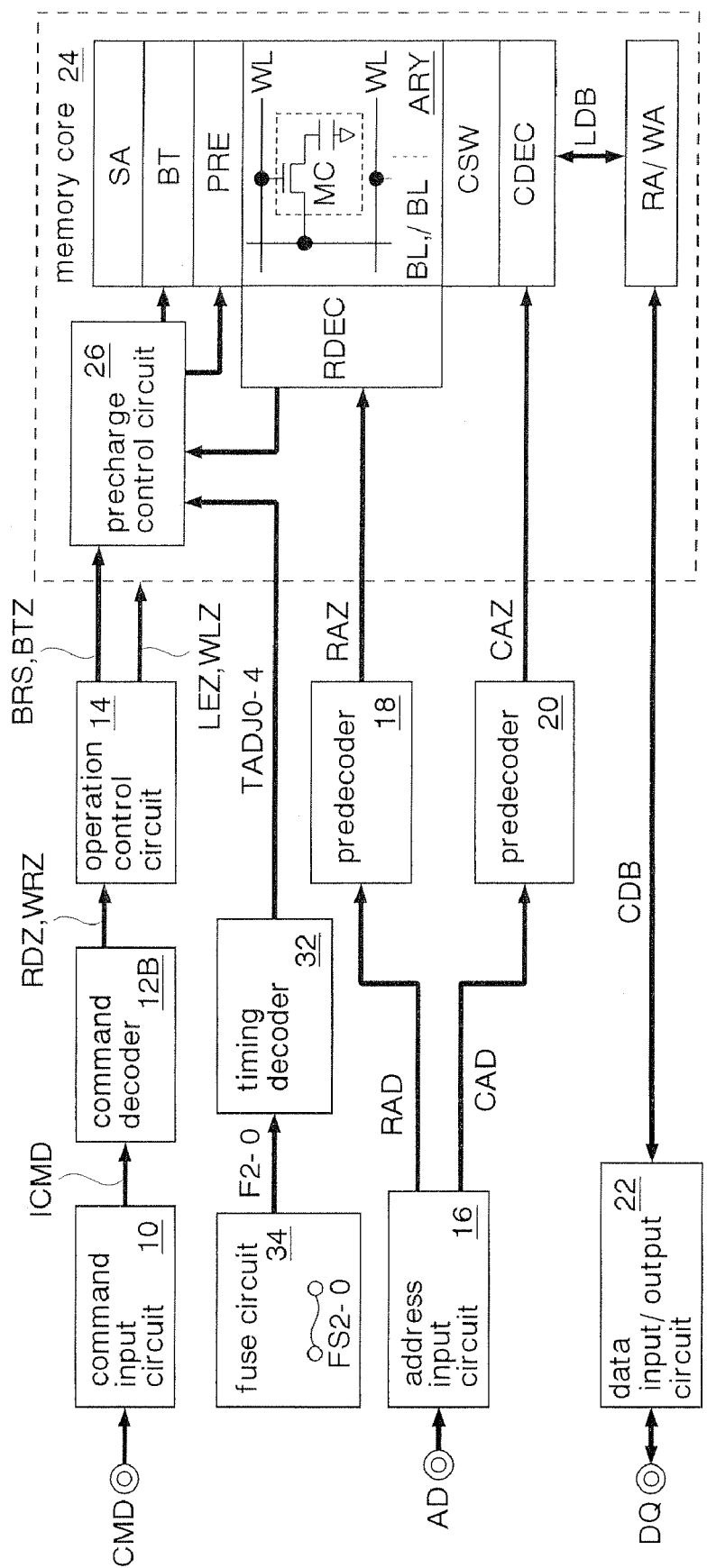
FIG. 18 is a block diagram illustrating a seventh embodiment.

FIG. 18 illustrates a seventh embodiment. The same elements as those explained in the above-described embodiments are given the same reference signs, and detailed explanations thereof are omitted. In this embodiment, a command decoder 12B is formed instead of the command decoder 12 in the fourth embodiment (FIG. 7). In addition, a fuse circuit 34 and a timing decoder 32 is newly formed. The other structure is the same as in the fourth embodiment. Specifically, the semiconductor integrated circuit in this embodiment is formed as an FCRAM.

The fuse circuit 34 has fuses FS2-0. The fuse circuit 34 outputs fuse signals F2-0 at low logic levels when the respective fuses FS2-0 are cut (programmed), and outputs fuse signals F2-0 at high logic levels when the respective fuses FS2-0 are not cut. Specifically, the fuse signals F2-0 indicate the program states of the fuses FS2-0 respectively.

Similarly to the sixth embodiment, the timing decoder 32 decodes the logic levels of the fuse signals F2-0 output from the fuse circuit 34, and activates one of the timing adjusting signals TADJ0-4. The relationship between the fuse signals F2-0 and the timing adjusting signals TADJ0-4 to be activated is the same as the relationship between the address signals RAD2-0 and the timing adjusting signals TADJ0-4 in FIG. 11. The not-shown timing changing circuit 26a in the precharge control circuit 26 changes deactivation timing (off-timing) of the bit line transfer signal BLTL2 according to the timing adjusting signals TADJ0-4. Specifically, in this embodiment, deactivation timing of a bit line transfer signal (BLTL2 for example) is changed according to the logic levels of the fuse signals F2-0 indicating the programmed states of the fuses F2-0.

As above, also in this embodiment, the same effects as in the above-described embodiments can be obtained. Furthermore, deactivation timing of a bit line transfer signal (BLTL2 for example) can be adjusted according to the programmed states of the fuses FS2-0.

Figure 19:
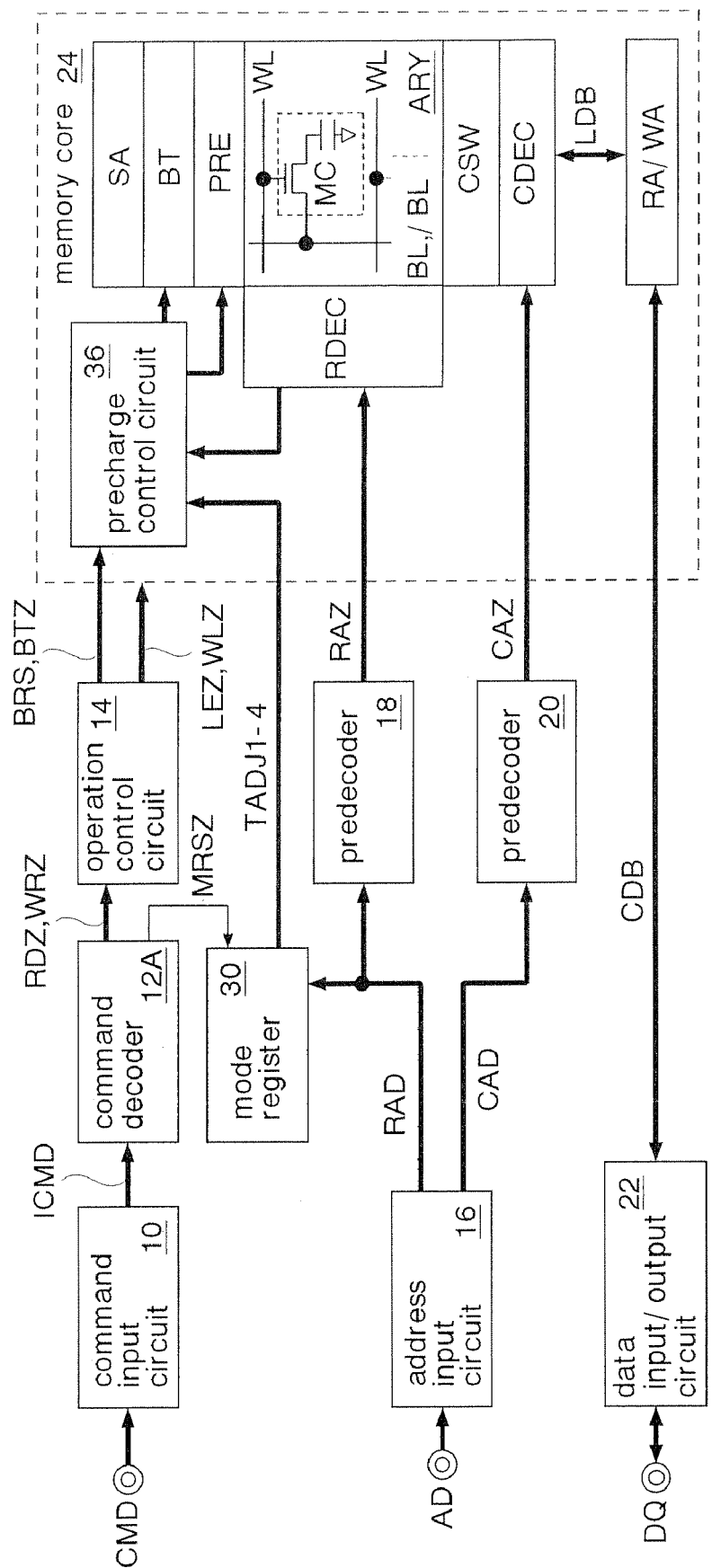
FIG. 19 is a block diagram illustrating an eighth embodiment.

FIG. 19 illustrates an eighth embodiment. The same elements as those explained in the above-described embodiments are given the same reference signs, and detailed explanations thereof are omitted. In this embodiment, a command decoder 12A and a precharge control circuit 36 are formed instead of the command decoder 12 and the precharge control circuit 26 of the fourth embodiment (FIG. 7). In addition, a mode register 30 is newly formed. The other structure is the same as in the fourth embodiment. Specifically, the semiconductor integrated circuit in this embodiment is formed as an FCRAM.

The command decoder 12A and the mode register 30 are the same as in the fifth embodiment. However, the mode register 30 outputs the timing adjusting signals TADJ1-4 from which the timing adjusting signal TADJ0 is excluded. Thus, among the test codes CODE shown in FIG. 11, the RAD2-0="000" is set to be prohibited from being used (reserved).

Similarly to the fourth embodiment, the precharge control circuit 36 adjusts off-timing of the bit line transfer switch BT on the inactive array side corresponding to the bit line to which data are not output, according to the timing adjusting signals TADJ1-4.

Figure 20:
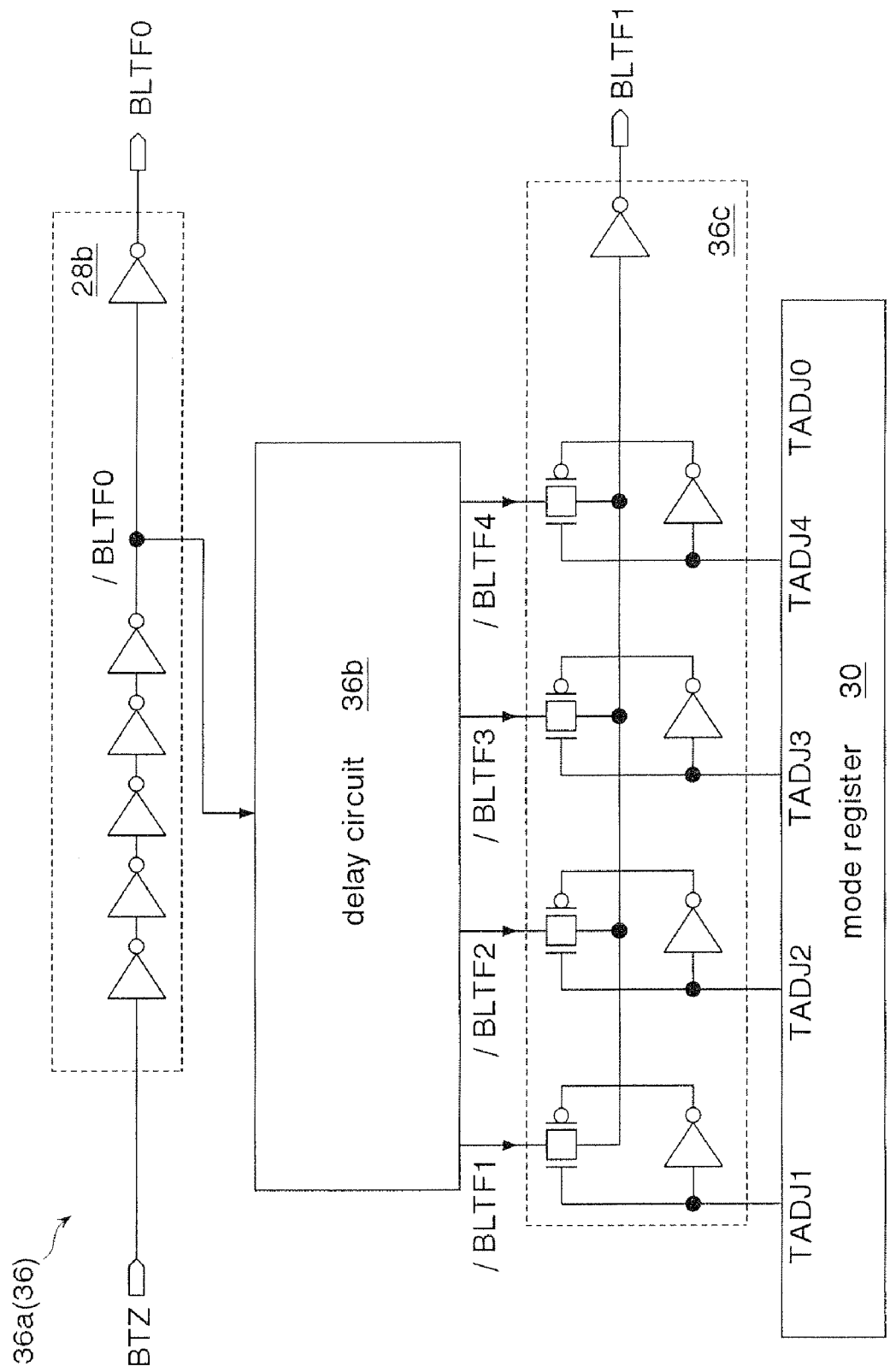
FIG. 20 is a circuit diagram illustrating a timing changing circuit formed in a precharge control circuit shown in FIG. 19.

FIG. 20 illustrates a timing changing circuit 36a which generates the timing signal BLTF1 which determines off-timing of the bit line transfer switch BT in the precharge control circuit 28 shown in FIG. 19. The timing changing circuit 36a has a buffer circuit 28b, a delay circuit 36b, and a selection circuit 36c which selects one of delayed signals /BLTF1-4 from the delay circuit 36b according to the timing adjusting signals TADJ1-4.

Figure 21:
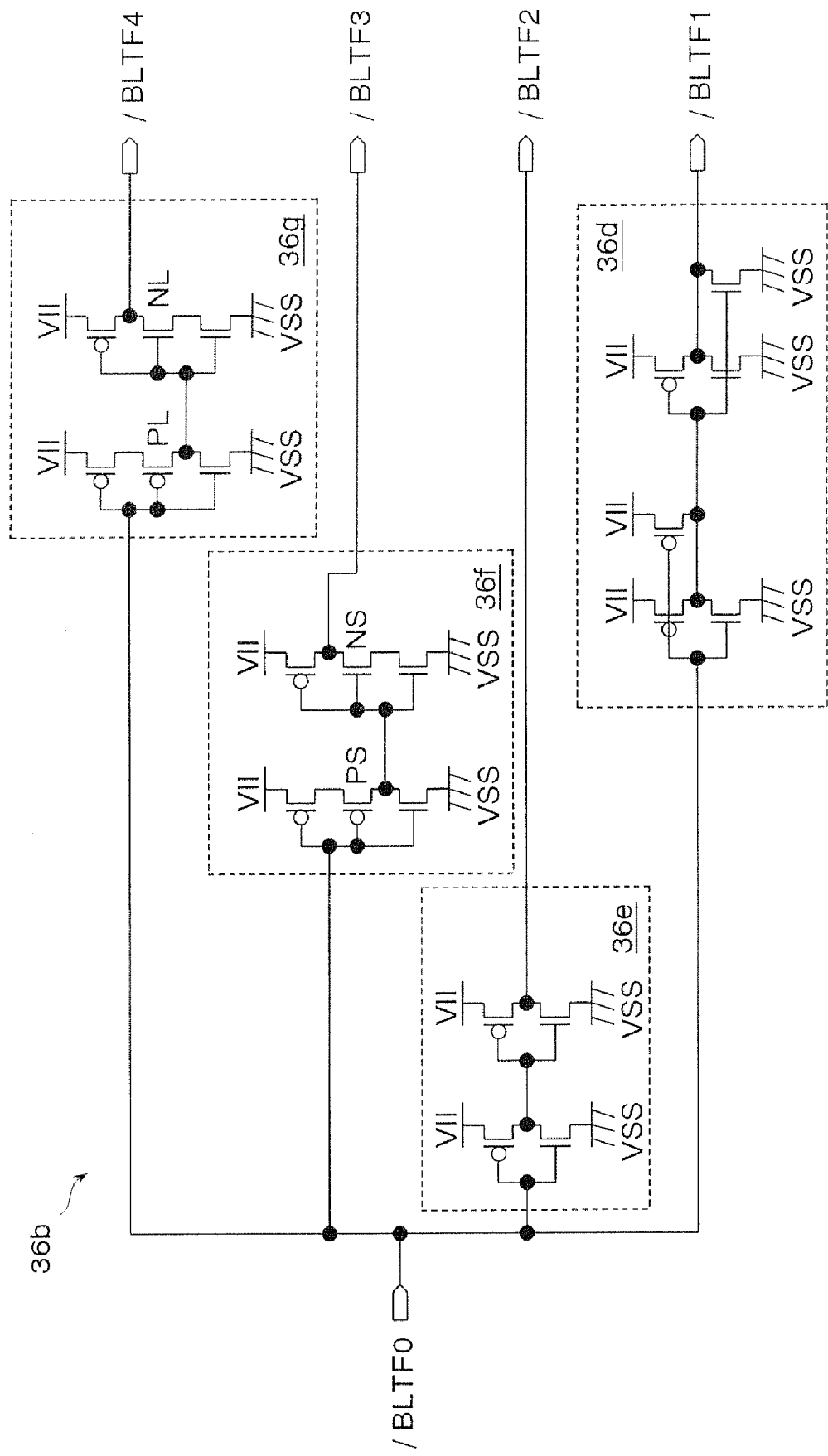
FIG. 21 is a circuit diagram illustrating details of a delay circuit shown in FIG. 20.

FIG. 21 illustrates details of the delay circuit 36b of FIG. 20. The delay circuit 36b has delay stages 36d, 36e, 36f, 36g which are each formed by two stages of cascade coupled inverters. Delay times of the delay stages are 36d<36e<36f<36g. In the delay stage 36d, for reducing the delay time, a pMOS transistor coupled to an internal power supply line VII is formed at the output of a CMOS inverter in the front stage, and an nMOS transistor coupled to a ground line VSS is formed at the output of a CMOS inverter in the rear stage. Thus, the delay time from a rising edge of a delayed signal /BLTF0 to a falling edge of the delayed signal /BLTF1 becomes short.

An internal power supply voltage VII supplied to the internal power supply line VII is generated using an external power supply voltage supplied from the outside of the FCRAM via an external power supply terminal. The internal power supply voltage VII is a constant voltage which does not depend on an external power supply voltage or a chip temperature.

The delay stage 36e is formed by normal CMOS inverters. In each CMOS inverter in the delay stage 36f, a pMOS transistor PS/an nMOS transistor NS which have a channel length L shorter than that of the other transistors is arranged between the pMOS transistor and the nMOS transistor, so as to make the delay time longer. In each CMOS inverter in the delay stage 36g, a pMOS transistor PL/an nMOS transistor NL which have a channel length L longer than that of the other transistors is arranged between the pMOS transistor and the nMOS transistor, so as to make the delay time the longest.

In the delay circuit 36b, the channel lengths L of the transistors other than the transistors PS/NS, PL/NL are of a standard size. Note that for example, a similar delay time can be obtained also by making the channel lengths L of the PMOS transistors PS, PL to be of the standard size, making the gate width W of the pMOS transistor PS longer than the standard size, and making the gate width W of the pMOS transistor PL shorter than the standard size. Specifically, in this embodiment, deactivation timing of a bit line transfer signal (BLTL2 for example) is changed by selecting one of the delay stages 36d, 36e, 36f, 36g having the transistors with the different transistor channel lengths L or gate widths W.

Generally, delay times of the pMOS transistors PS, PL can be reduced by making a ratio W/L of the gate width W to the channel length L large and increased by making the ratio W/L small. Thus, a similar delay time can be obtained also by making the ratio W/L of the pMOS transistor PS large and the ratio W/L of the pMOS transistor PL small. In other words, the generation timing of the falling edge of the bit line transfer signal BLTL2 shown in FIG. 10 can be changed by forming transistors in which at least either of the gate width W and the channel length L is different in the timing changing circuit 36.

As above, also in the eighth embodiment, the same effects as in the above-described embodiments can be obtained. Furthermore, deactivation timing of a bit line transfer signal (BLTL2 for example) can be changed easily by selecting one of the delay stages 36d, 36e, 36f, 36g with the different transistor sizes by the selection circuit 36c.

Figure 22:
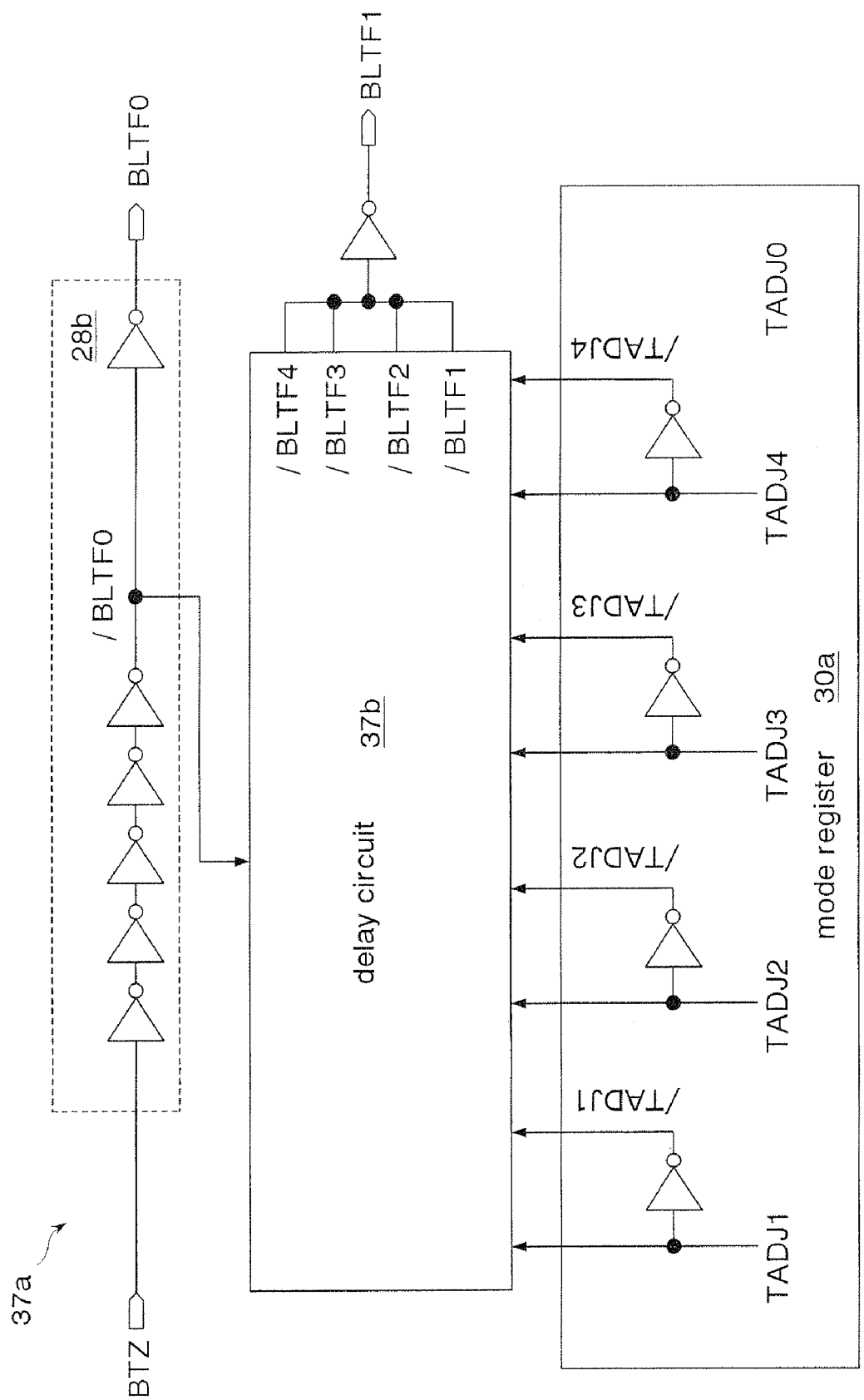
FIG. 22 is a block diagram illustrating a mode register and a timing changing circuit in a ninth embodiment.

FIG. 22 illustrates a mode register 30a and a timing changing circuit 37a in a ninth embodiment. The same elements as those explained in the above-described embodiments are given the same reference signs, and detailed explanations thereof are omitted. In this embodiment, the mode register 30a and the timing changing circuit 37a are formed instead of the mode register 30 and the timing changing circuit 36a in the eighth embodiment. The other structure is the same as in the eighth embodiment. Specifically, the semiconductor integrated circuit in this embodiment is formed as an FCRAM.

The mode register 30a has a function to output the timing adjusting signals TADJ1-4 and timing adjusting signals /TADJ1-4 made by inverting the logic levels of the timing adjusting signals TADJ1-4. The other functions of the mode register 30a are the same as those of the mode register 30.

The timing changing circuit 37a has a buffer circuit 28b and a delay circuit 37b which delays the delayed signal /BLTF0 according to the timing adjusting signals TADJ1-4, /TADJ1-4 to generate the timing signal BLTF1.

Figure 23:
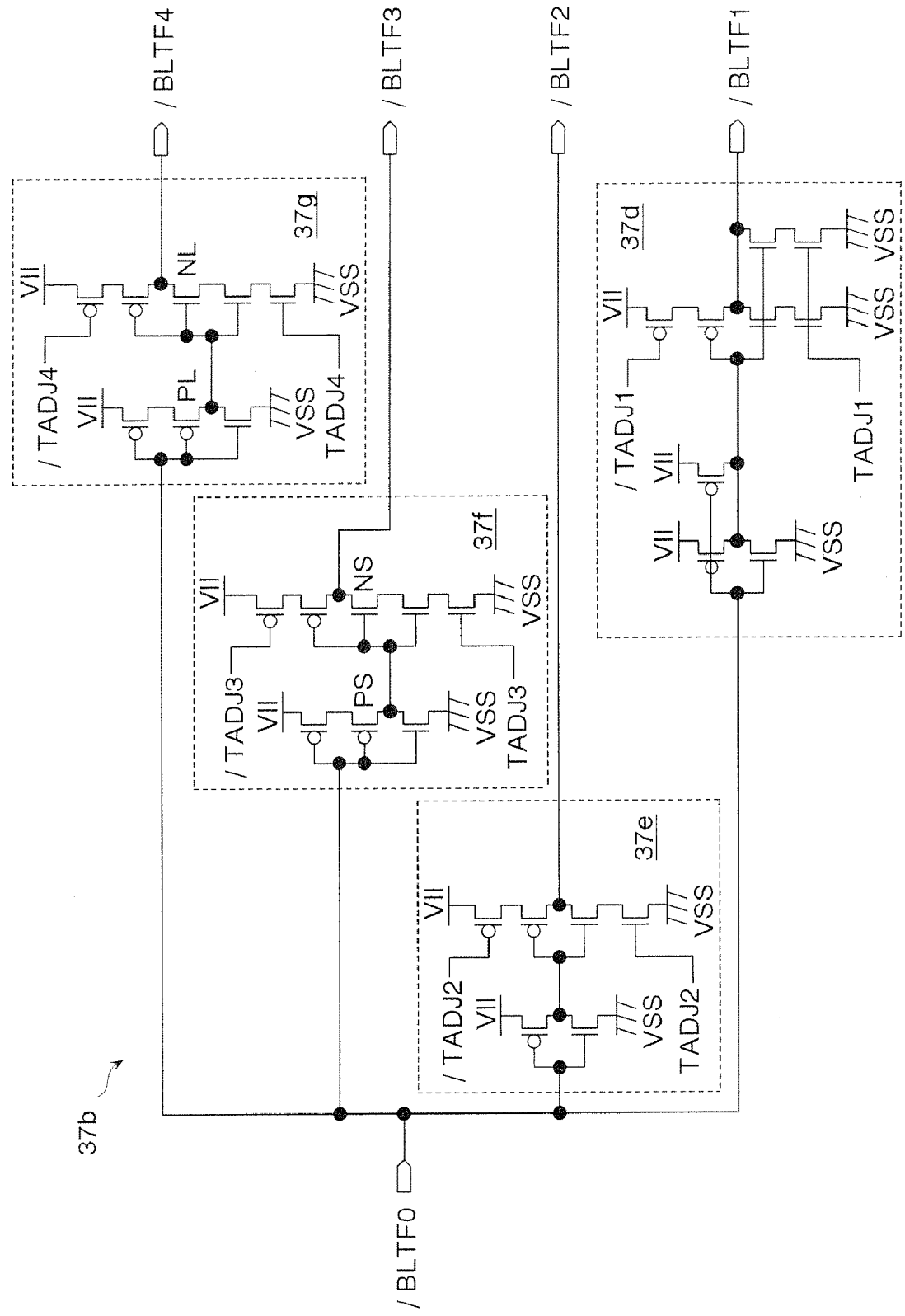
FIG. 23 is a circuit diagram illustrating details of a delay circuit shown in FIG. 22.

FIG. 23 illustrates details of the delay circuit 37b. The delay circuit 37b has delay stages 37d, 37e, 37f, 37g which are each formed by two stages of cascade coupled inverters. Delay times of the delay stages are 37d<37e<37f<37g. The delay stages 37d, 37e, 37f, 37g are formed by adding a pMOS transistor and an nMOS transistor to the power supply line VII, VSS sides respectively of each of the CMOS inverters in the rear stages. The other structures of the delay stages 37d, 37e, 37f, 37g are the same as those of the delay stages 36d, 36e, 36f, 36g shown in FIG. 21.

The gates of the newly added pMOS transistor and nMOS transistor receive the timing adjusting signals TADJ1-4, /TADJ1-4. Thus, a signal made by delaying the delayed signal /BLTF0 is output as one of delayed signals /BLTF1-4 from one of the delay stages 37d, 37e, 37f, 37g selected according to the timing adjusting signals TADJ1-4, /TADJ1-4. As shown in FIG. 22, signal lines for the delayed signals /BLTF1-4 are coupled to each other (wired OR). Thus, similarly to the eighth embodiment, the delay circuit 37b can adjust the delay time of the timing adjusting signal BLTF1 according to the timing adjusting signals TADJ1-4, /TADJ1-4. As above, also in this embodiment, the same effects as in the above-described embodiments can be obtained.

Figure 24:
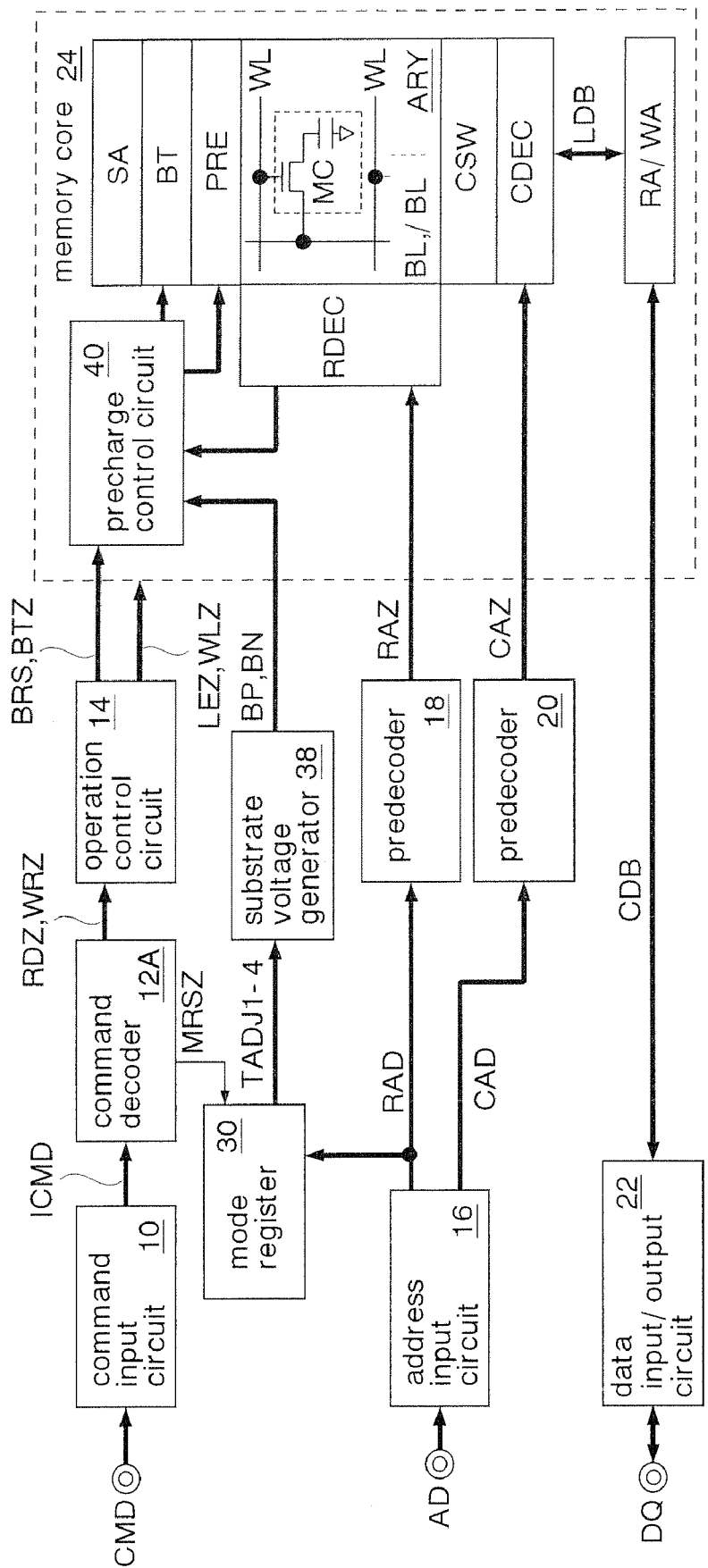
FIG. 24 is a block diagram illustrating a tenth embodiment.

FIG. 24 illustrates a tenth embodiment. The same elements as those explained in the above-described embodiments are given the same reference signs, and detailed explanations thereof are omitted. In this embodiment, a command decoder 12A and a precharge control circuit 40 are formed instead of the command decoder 12 and the precharge control circuit 26 of the fourth embodiment (FIG. 7). In addition, a mode register 30 and a substrate voltage generation circuit 38 which generates several types of substrate voltages BP, BN are newly formed. The other structure is the same as in the eighth embodiment. Specifically, the semiconductor integrated circuit in this embodiment is formed as an FCRAM.

The substrate voltage generation circuit 38 changes voltage values of the substrate voltages BP, BN according to the timing adjusting signals TADJ1-4. The substrate voltage BP is supplied to the substrate of the pMOS transistor forming a delay circuit 40b shown in FIG. 26. The substrate voltage BN is supplied to the substrate of the nMOS transistor forming the delay circuit 40b. The precharge control circuit 40 generates the timing of a falling edge of the bit line transfer signal BLTL2 using the substrate voltages BP, BN.

Figure 25:
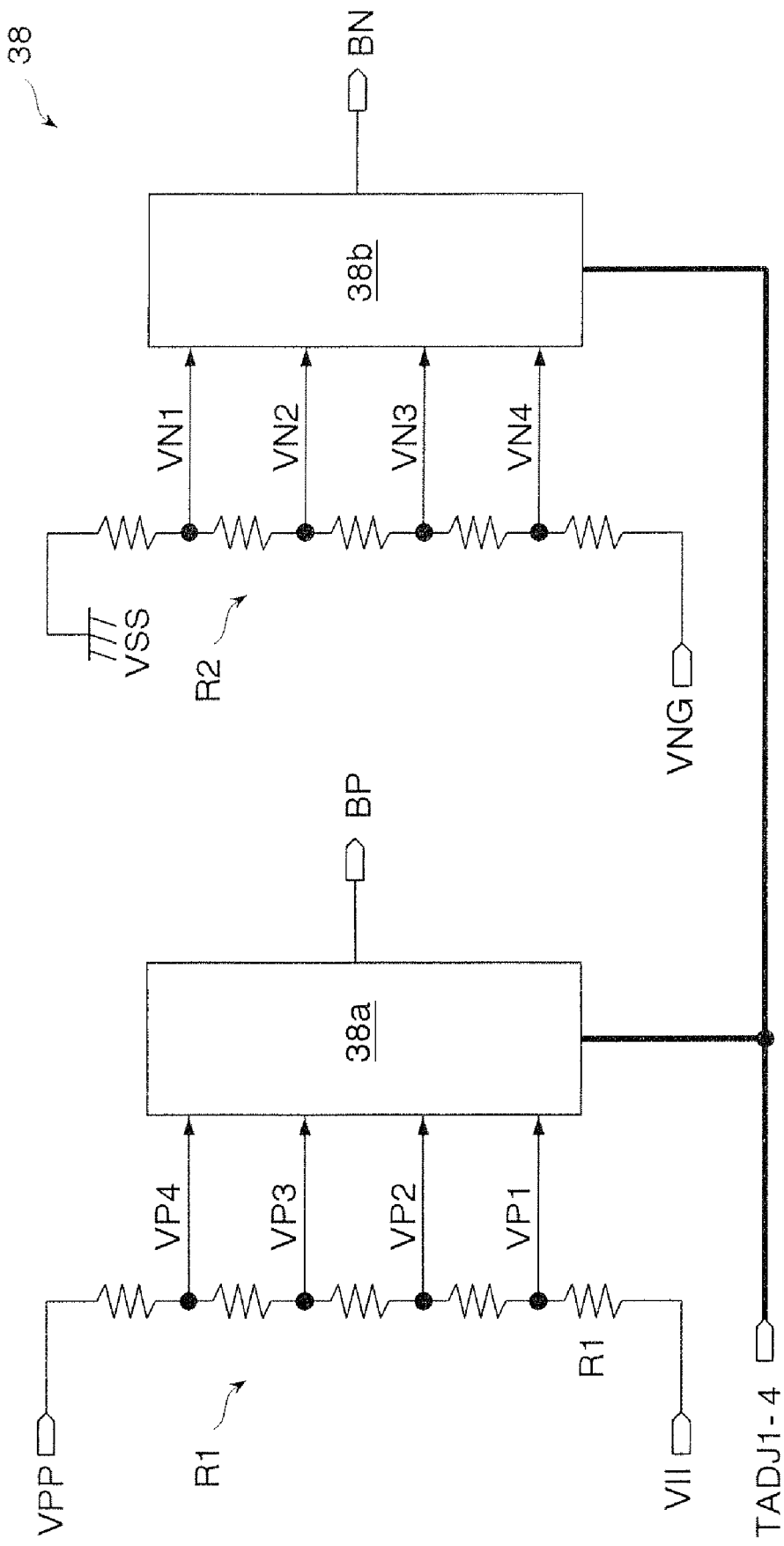
FIG. 25 is a block diagram illustrating details of a substrate voltage generation circuit shown in FIG. 24.

FIG. 25 illustrates details of the substrate voltage generation circuit 38 shown in FIG. 24. The substrate voltage generation circuit 38 has resistor rows R1, R2 and selection circuits 38a, 38b. The resistor row R1 has a plurality of resistors arranged in series between a boosted voltage line VPP and an internal power supply line VII. Upon reception of the timing adjusting signals TADJ1-4 at high logic levels, the selection circuit 38a selects voltages VP1-4 (VP1<VP2<VP3<VP4) output from the resistor row R1 respectively and outputs them as the substrate voltage BP.

The resistor row R2 has a plurality of resistors arranged in series between the ground line VSS and a negative voltage line VNG. Upon reception of the timing adjusting signals TADJ1-4 at high logic levels, the selection circuit 38b selects voltages VN1-4 (VN1>VN2>VN3>VN4) output from the resistor row R2 respectively and outputs them as the substrate voltage BN. In other words, the smaller the number on the ends of the timing adjusting signals TADJ1-4, the lower the substrate voltage BP and the higher the substrate voltage BN become.

Figure 26:
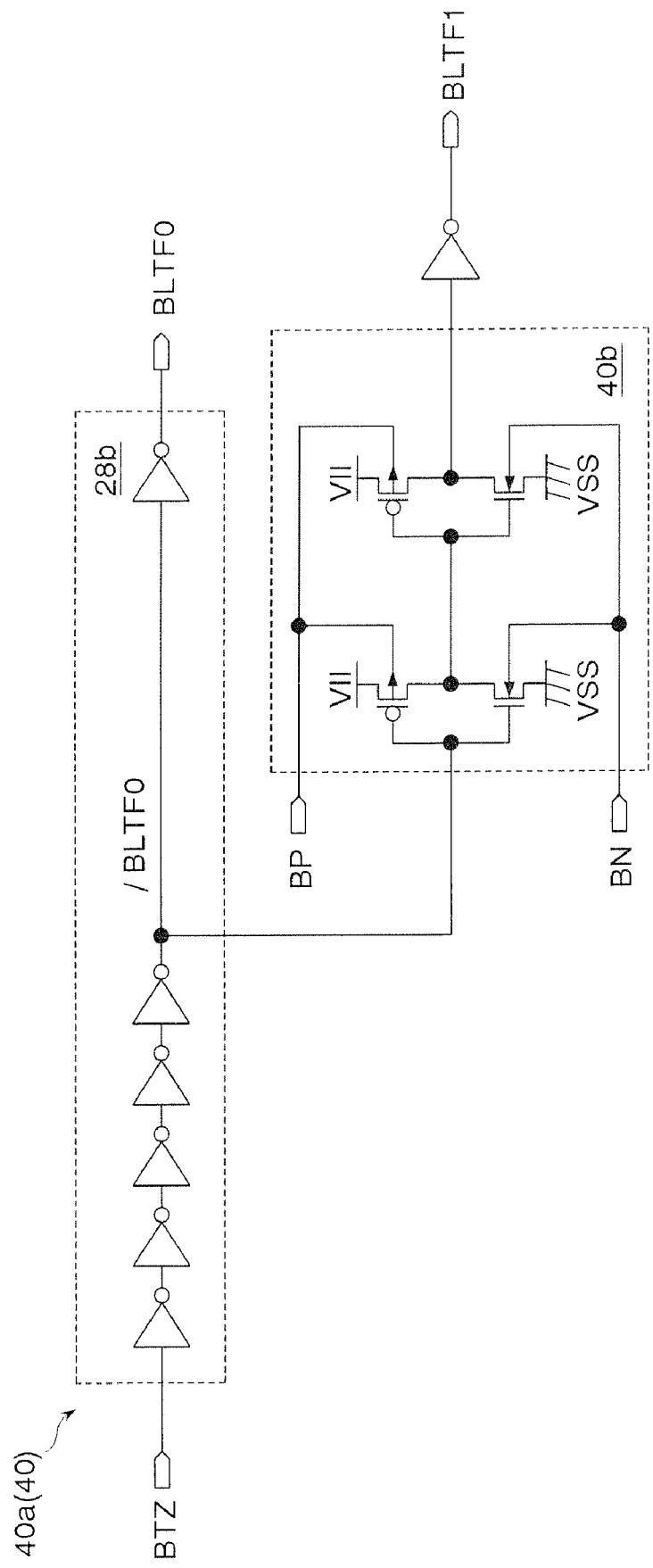
FIG. 26 is a circuit diagram illustrating a timing changing circuit formed in a precharge control circuit shown in FIG. 24.

FIG. 26 illustrates a timing changing circuit 40a which generates the timing signal BLTF1 which determines off-timing of the bit line transfer switch BT in the precharge control circuit 40 shown in FIG. 25. The timing changing circuit 40a has a buffer circuit 28b and a delay circuit 40b.

The delay circuit 40b is formed by a pair of cascade coupled CMOS inverters. The substrates of a PMOS transistor and an nMOS transistor of each CMOS inverter receive the substrate voltages BP, BN, respectively. The lower the substrate voltage BP, the lower the threshold value (absolute value) of the pMOS transistor becomes, and the more easily the pMOS transistor turns on. The higher the substrate voltage BN (negative voltage), the lower the threshold value of the nMOS transistor becomes, and the more easily the nMOS transistor turns on.

As explained with FIG. 25, the smaller the number on the ends of the timing adjusting signals TADJ1-4, the lower the substrate voltage BP and the higher the substrate voltage BN become. In this case, the threshold voltages of the pMOS transistor and the nMOS transistor decrease, and hence the delay time of the delay circuit 40b becomes short.

Thus, the timing changing circuit 40a uses the variable substrate voltages to adjust the delay time of the timing signal BLTF1 according to the timing adjusting signals TADJ1-4.

As above, also in this embodiment, the same effects as in the above-described embodiments can be obtained. Furthermore, the generation timing of a falling edge of a bit line transfer signal (BLTL2 for example) can be changed easily by changing the substrate voltages BP, BN.

Figure 27:
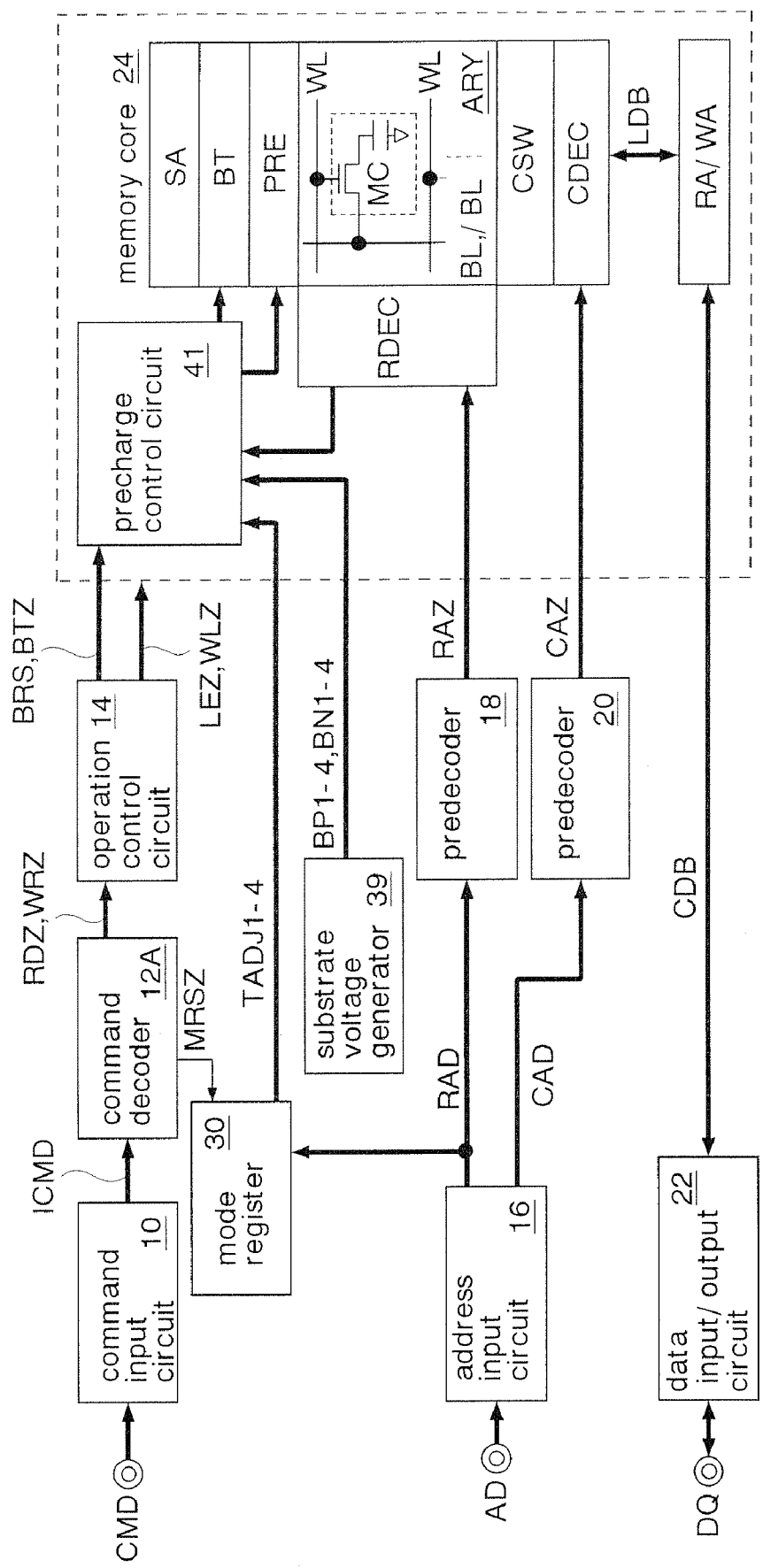
FIG. 27 is a block diagram illustrating an eleventh embodiment.

FIG. 27 illustrates an eleventh embodiment. The same elements as those explained in the above-described embodiments are given the same reference signs, and detailed explanations thereof are omitted. In this embodiment, a substrate voltage generation circuit 39 and a precharge control circuit 41 are formed instead of the substrate voltage generation circuit 38 and the precharge control circuit 40 of the tenth embodiment. The other structure is the same as in the tenth embodiment. Specifically, the semiconductor integrated circuit in this embodiment is formed as an FCRAM.

The substrate voltage generation circuit 39 generates substrate voltages BP1-4, BN1-4 with values different from each other. Values of the substrate voltages BP1-4 are set to BP1<BP2<BP3<BP4. Values of the substrate voltages BN1-4 are set to BN1>BN2>BN3>BN4. According to the timing adjusting signals TADJ1-4, the precharge control circuit 41 generates the timing of a falling edge of a bit line transfer signal (BLTL2 for example) using one of the substrate voltages BP1-4 and one of the substrate voltages BN1-4.

Figure 28:
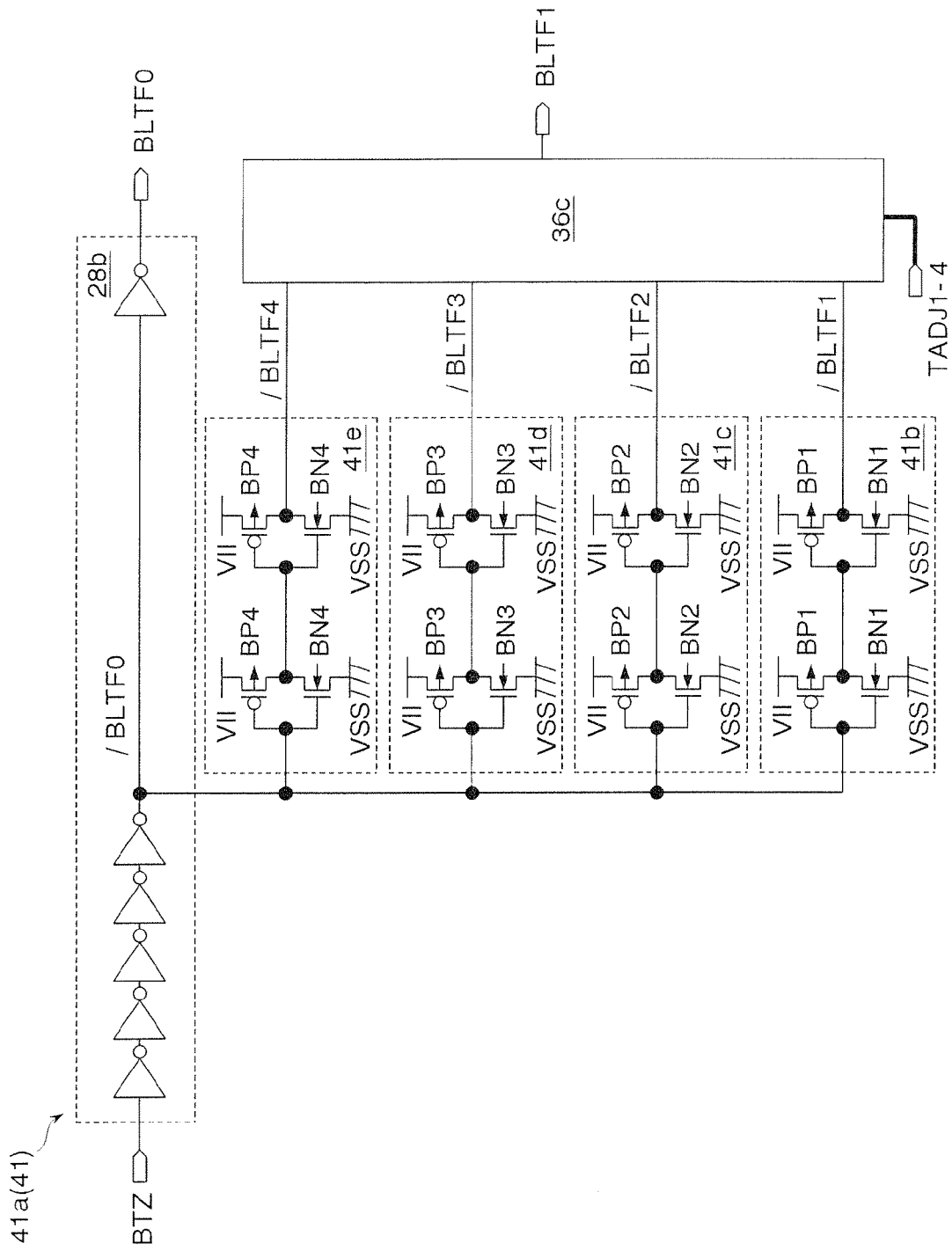
FIG. 28 is a circuit diagram illustrating a timing changing circuit formed in a precharge control circuit shown in FIG. 27.

FIG. 28 illustrates a timing changing circuit 41a which generates the timing signal BLTF1 which determines off-timing of the bit line transfer switch BT in the precharge control circuit 41 shown in FIG. 27. The timing changing circuit 41a has a buffer circuit 28b, delay circuits 41b, 41c, 41d, 41e, and the same selection circuit 36c as in FIG. 20.

The delay circuits 41b, 41c, 41d, 41e are each formed by a pair of cascade coupled CMOS inverters. The substrates of a pMOS transistor and an nMOS transistor of each CMOS inverter receive the substrate voltages BP1-4, BN1-4, respectively. Due to the relationship between the substrate voltages BP1-4, BN1-4, the delay time of the delay circuits 41b, 41c, 41d, 41e are set to 41b<41c<41d<41e. The delay circuits 41b, 41c, 41d, 41e delay the delayed signal /BLTF0 to generate each of the timing signals /BLTF1-4.

The selection circuit 36c selects one of the timing signals /BLTF1-4 according to the timing adjusting signals TADJ1-4, and outputs the signal as the timing signal BLTF1. Thus, the generation timing of the falling edge of the bit line transfer signal BLTL2 shown in FIG. 10 can be changed.

As above, also in the eleventh embodiment, the same effects as in the above-described embodiments can be obtained. Furthermore, the generation timing of a falling edge of a bit line transfer signal (BLTL2 for example) can be changed easily by selecting one of the delay circuits 41b, 41c, 41d, 41e, to which the different substrate voltages BP1-4, BN1-4 are supplied, by the selection circuit 36c.

Figure 29:
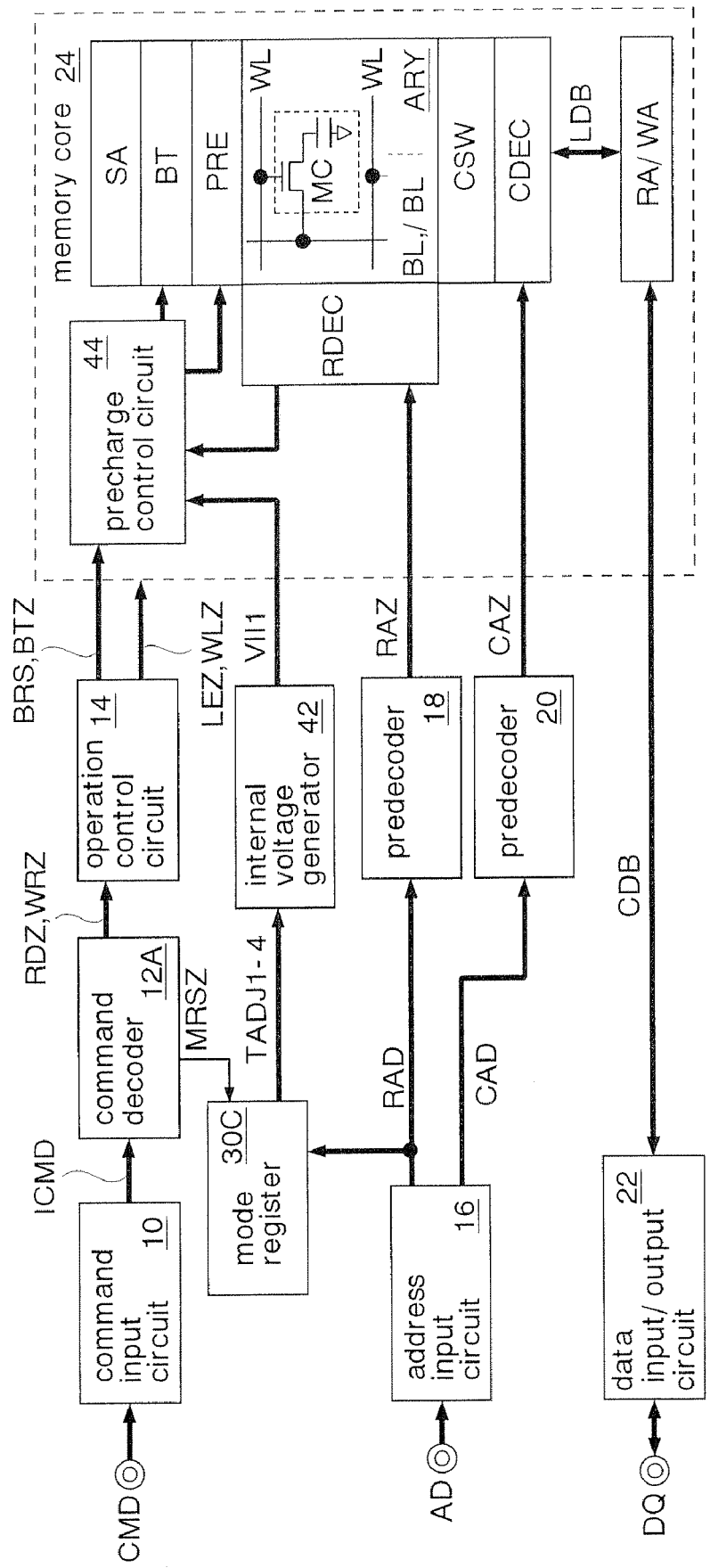
FIG. 29 is a block diagram illustrating a twelfth embodiment.

FIG. 29 illustrates a twelfth embodiment. The same elements as those explained in the above-described embodiments are given the same reference signs, and detailed explanations thereof are omitted. In this embodiment, an internal voltage generation circuit 42 and a precharge control circuit 44 are formed instead of the substrate voltage generation circuit 38 and the precharge control circuit 40 of the tenth embodiment. The other structure is the same as in the tenth embodiment. Specifically, the semiconductor integrated circuit in this embodiment is formed as an FCRAM.

The internal voltage generation circuit 42 generates the internal power supply voltage VII and also generates an internal power supply voltage VII1 using an external power supply voltage VDD. The internal power supply voltage VII is a fixed voltage, and the internal power supply voltage VII1 is a variable voltage. The internal voltage generation circuit 42 changes the value of the internal power supply voltage VII1 according to the timing adjusting signals TADJ1-4. Specifically, the smaller the number on the ends of the timing adjusting signals TADJ1-4, the higher the internal power supply voltage VII1 becomes. The precharge control circuit 44 generates the timing of a falling edge of the bit line transfer signal BLTL2 using the internal power supply voltage VII1.

Figure 30:
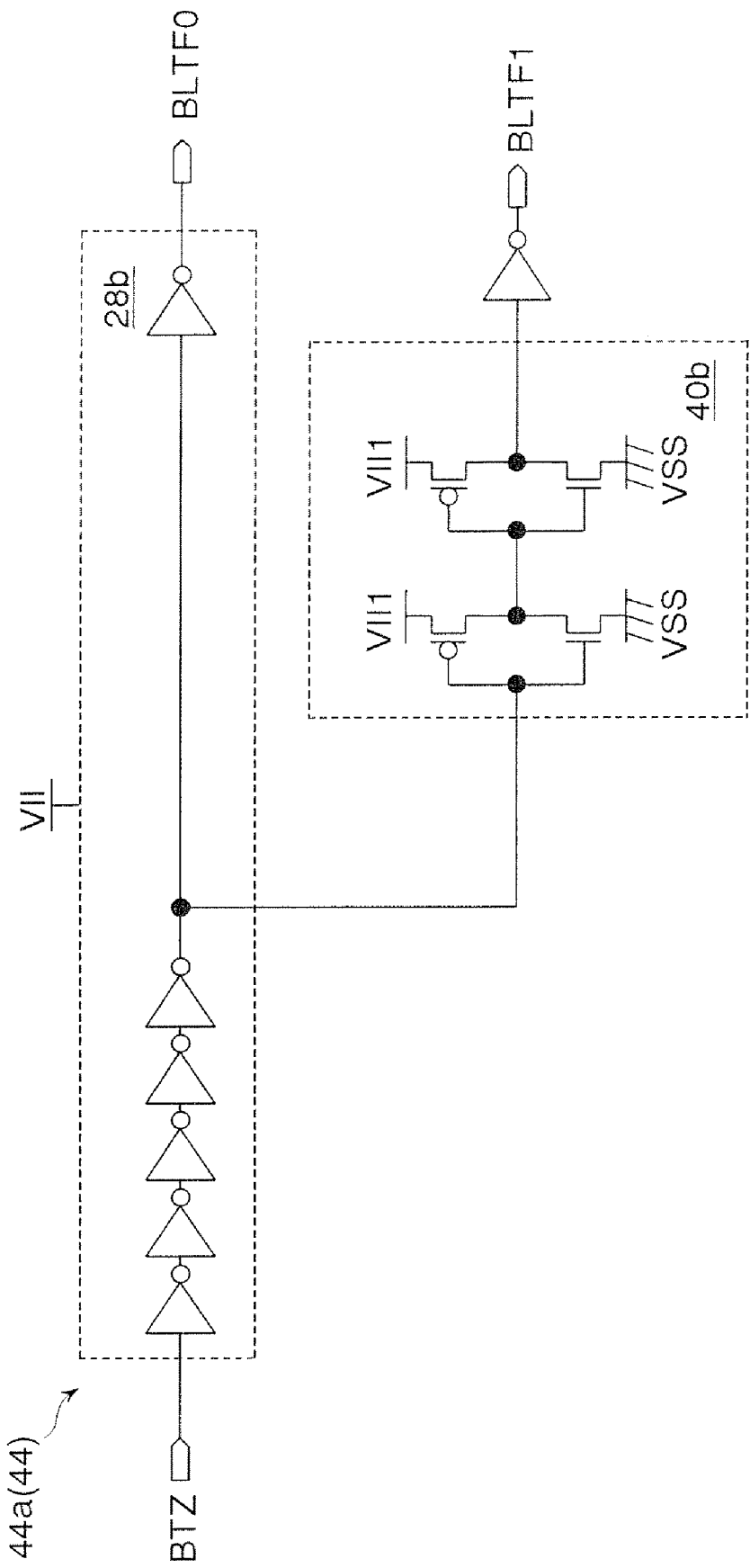
FIG. 30 is a circuit diagram illustrating a timing changing circuit formed in a precharge control circuit shown in FIG. 29.

FIG. 30 illustrates a timing changing circuit 44a which generates the timing signal BLTF1 which determines off-timing of the bit line transfer switch BT in the precharge control circuit 44 shown in FIG. 29. The timing changing circuit 44a has a buffer circuit 28b and a delay circuit 44b. The delay circuit 44b is formed by a pair of cascade coupled CMOS inverters. The source of the pMOS transistor in each CMOS inverter is coupled to the internal power supply line VII1.

As explained with FIG. 29, the smaller the number on the ends of the timing adjusting signals TADJ1-4, the higher the internal power supply voltage VII1 becomes. The higher the internal power supply voltage VII1, the shorter the delay time of the delay circuit 44b becomes. Thus, the timing changing circuit 44a uses the variable internal power supply voltage VII1 to adjust the delay time of the timing signal BLTF1 according to the timing adjusting signals TADJ1-4. Accordingly, the generation timing of a falling edge of the bit line transfer signal BLTL2 shown in FIG. 10 can be changed.

As above, also in the twelfth embodiment, the same effects as in the above-described embodiments can be obtained. Furthermore, the generation timing of a falling edge of a bit line transfer signal (BLTL2 for example) can be changed easily by changing the internal power supply line VII1.

Figure 31:
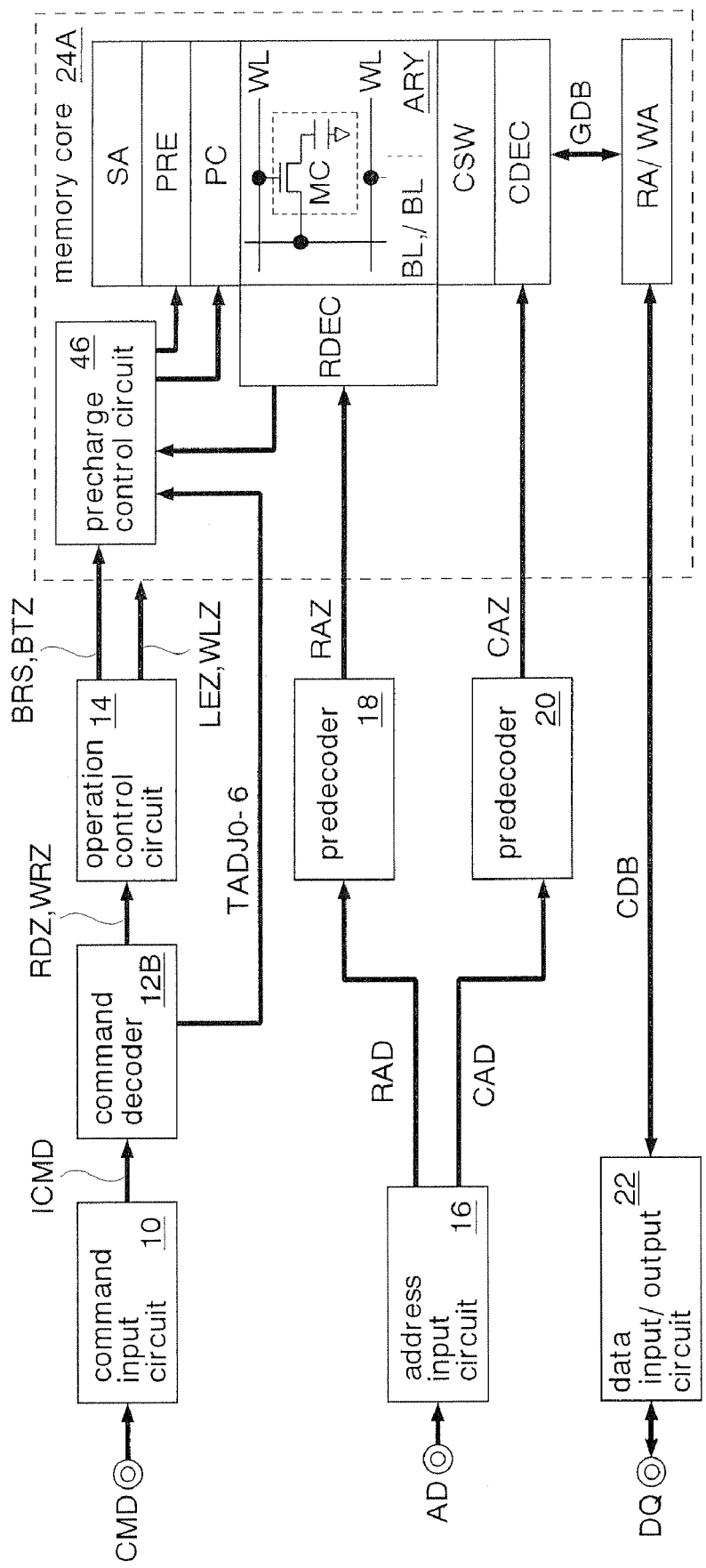
FIG. 31 is a block diagram illustrating a thirteenth embodiment.

FIG. 31 illustrates a thirteenth embodiment. The same elements as those explained in the above-described embodiments are given the same reference signs, and detailed explanations thereof are omitted. In this embodiment, a command decoder 12B and a memory core 24A are formed instead of the command decoder 12 and the memory core 24 of the fourth embodiment (FIG. 7). The other structure is the same as in the fourth embodiment. Specifically, the semiconductor integrated circuit in this embodiment is formed as an FCRAM. The FCRAM can be formed as an MCP or SOP similarly to the fourth or fifth embodiment (FIG. 13, FIG. 16).

The command decoder 12B activates one of timing adjusting signals TADJ0-6 to a high logic level according to a test code (row address signal RAD) supplied together with a test command. Note that after the FCRAM is powered on, the timing adjusting signal TADJ2 is activated to the high logic level as default.

The memory core 24A has a precharge control circuit 46 instead of the precharge control circuit 26 of the fourth embodiment. In this embodiment, each sense amplifier SA is coupled to only a pair of bit lines BL, /BL. Thus, the memory core 24A does not have the bit line transfer unit BT in FIG. 7. In addition, the memory core 24A has a precharge capacitor unit PC shown in FIG. 32, which will be described later.

The precharge control circuit 46 has a function to control the precharge capacitor unit PC instead of the function to control the bit line transfer unit BT. Specifically, the precharge control unit 46 operates as a switch control unit to output switch control signals CNT1-2, BRS for controlling the operations of capacitor switches PSW, precharge switches and an equalization switch, which will be described later. Further, the precharge control circuit 46 has a function to change, according to the timing adjusting signals TADJ0-6, deactivation timing of a switch control signal (one of CNT1-2) to control the operation of the capacitor switch PSW coupled to the bit line (one of BL, /BL) to which data are not output, which will be described later. The other functions of the precharge control circuit 46 are the same as those of the precharge control circuit 26.

Figure 32:
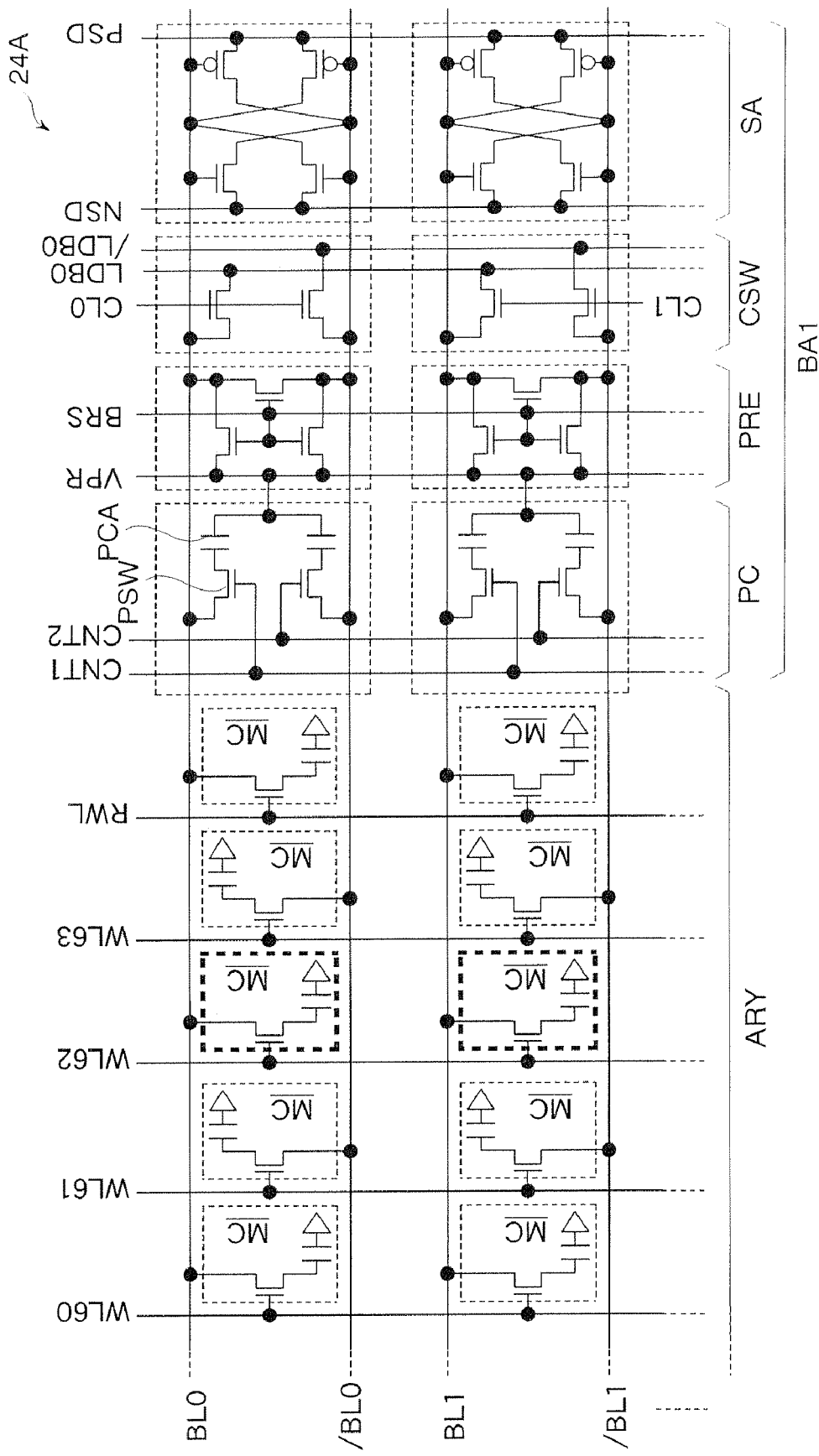
FIG. 32 is a circuit diagram illustrating a substantial part of the memory core shown in FIG. 31.

FIG. 32 illustrates a substantial part of the memory core 24A shown in FIG. 31. The precharge capacity unit PC, the precharge unit PRE, the column switch unit CSW and the sense amplifier unit SA are arranged in a boundary area BA1. Complementary bit line pairs BL0-1, /BL0-1 of the memory cell array ARY are coupled to the sense amplifiers SA, respectively. A memory cell MC closest to the boundary area BA1 is a redundancy memory cell and is coupled to a redundancy word line RWL. The other basic structure is the same as in FIG. 9 except the precharge capacitor unit PC.

The precharge capacitor unit PC has capacitor switches PSW which correspond to the bit lines BL, /BL respectively and are each formed by an nMOS transistor, and precharge capacitors PCA arranged between the capacitor switches PSW and a precharge voltage line VPR. The precharge capacitors PCA are used as a load coupled to the bit lines BL, /BL. The gates of the capacitor switches PSW coupled to the bit lines BL, /BL receive switch control signals CNT1, CNT2, respectively. The switch control signals CNT1-2 are generated by the precharge control circuit 46.

The capacitor switches PSW and the precharge capacitors PCA are formed in the boundary area BA1 located outside the memory cell array ARY. Thus, the precharge capacitors PCA can be formed irrelevantly to the arrangement pitch of memory cells MC. In other words, the capacitances of the precharge capacitors PCA can be set arbitrarily.

Figure 33:
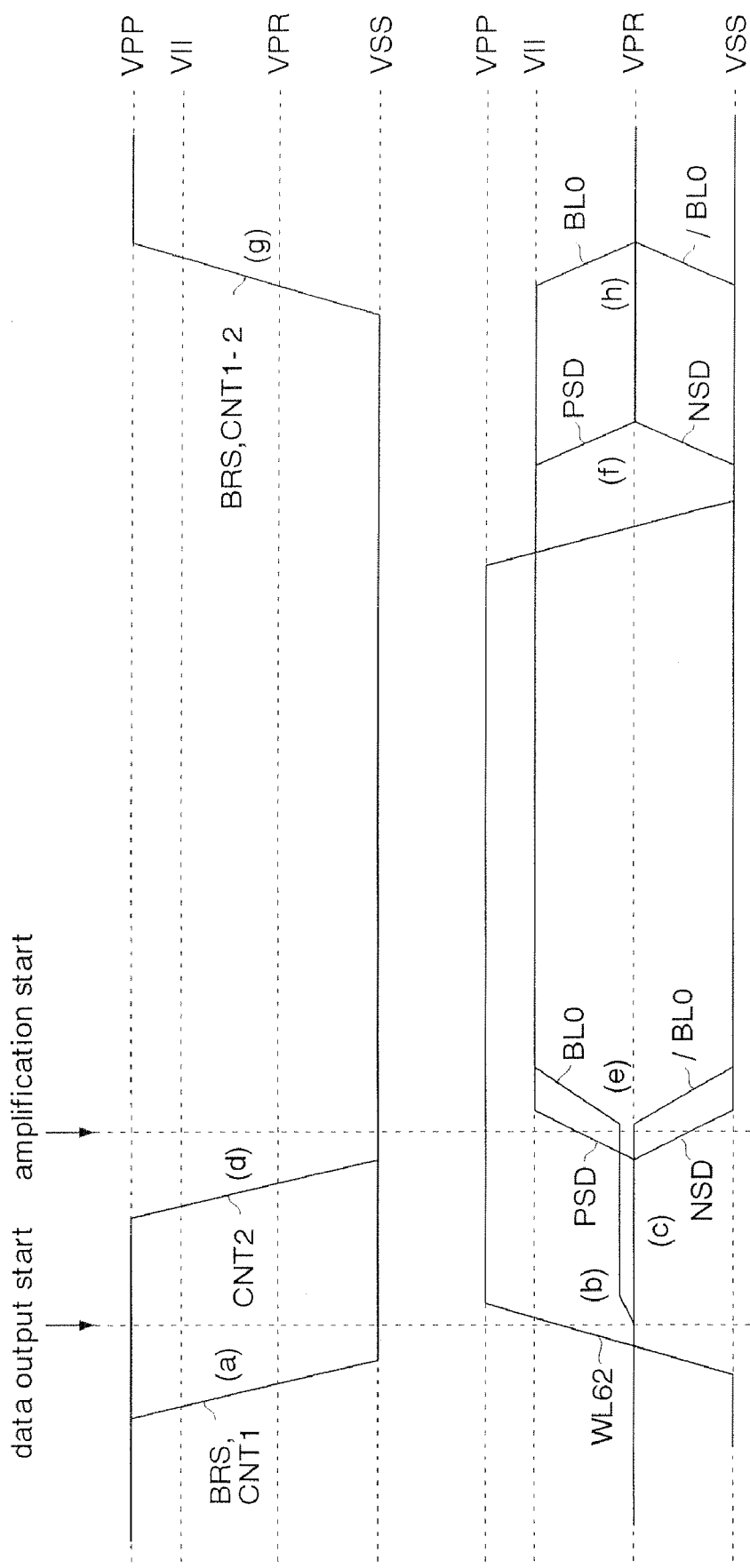
FIG. 33 is a timing chart illustrating a read operation of an FCRAM of the thirteenth embodiment.

FIG. 33 illustrates a read operation of the FCRAM in this embodiment. In this example, the word line WL62 shown in FIG. 32 is selected, and data are read from memory cells MC coupled to the bit lines BL0, BL1, which are indicated by thick dashed line frames. The basic operation thereof is the same as in the above-described FIG. 4. The following explanation is given focusing on the bit lines BL0, /BL0. Here, the bit lines BL0, /BL0 correspond to the data lines D1, D2 in FIG. 4. The switch control signals CNT1-2 correspond to the switch control signals for turning off the switches CS1-2 in FIG. 4. The bit line reset signal BRS2 correspond to the switch control signals for turning off the switches PS1, PS2, ES1 in FIG. 4.

First, just before the word line WL62 is activated, the bit line reset signal BRS2 is deactivated to a low logic level, and the coupling of the bit lines BL0, /BL0 and the precharge voltage line VPR is released. Simultaneously, the switch control signal CNT1 corresponding to the bit line BL0 to which data are output is deactivated to a low logic level (FIG. 33(a)). The capacitor switch PSW coupled to the bit line BL0 is turned off by the switch control signal CNT1. Accordingly, the coupling of the bit line BL0 and the precharge capacitor PCA is released. The load capacitance on the bit line BL0 to which data are output decreases, and hence a change amount of the voltage on the bit line BL0 due to outputting of data becomes large.

Thereafter, the word line WL62 is activated, and data are output to the bit line BL0 (FIG. 33(b)). At this time, the capacitor switch PSW coupled to the bit line /BL0 to which data are not output is on. Accordingly, the bit line /BL0 is coupled to the precharge capacitor PCA and the load capacitance thereon is increased. Therefore, when data are output to the bit line BL0 and the voltage thereon changes, change of the voltage on the bit line /BL0 due to the coupling capacitance is suppressed (FIG. 33(c)). In other words, decrease of the voltage difference in the bit line pair BL0, /BL0 is prevented.

Next, just before the sense amplifier SA starts an amplifying operation, the switch control signal CNT2 corresponding to the bit line /BL0 to which data are not output is deactivated to a low logic level (FIG. 33(d)). The precharge capacitor PCA corresponding to the bit line /BL0 to which data are not output is uncoupled from the bit line /BL0. By reduction of the load capacitance on the bit line /BL0, decrease of amplification speed of the voltage difference in the bit line pair BL0, /BL0 by the sense amplifier SA is prevented.

Next, the sense amplifier SA operates, and the voltage difference in the bit line pair BL0, /BL0 is amplified (FIG. 33(e)). After the word line WL62 is deactivated, the amplifying operation by the sense amplifier SA is completed (FIG. 33(f)).

Thereafter, the bit line reset signal BRS and the switch control signals CNT1-2 are activated (FIG. 33(g)). Thus, the bit line pair BL0, /BL0 are precharged to the precharge voltage line VPR (FIG. 33(h)). Then the read operation is completed.

Figure 34:
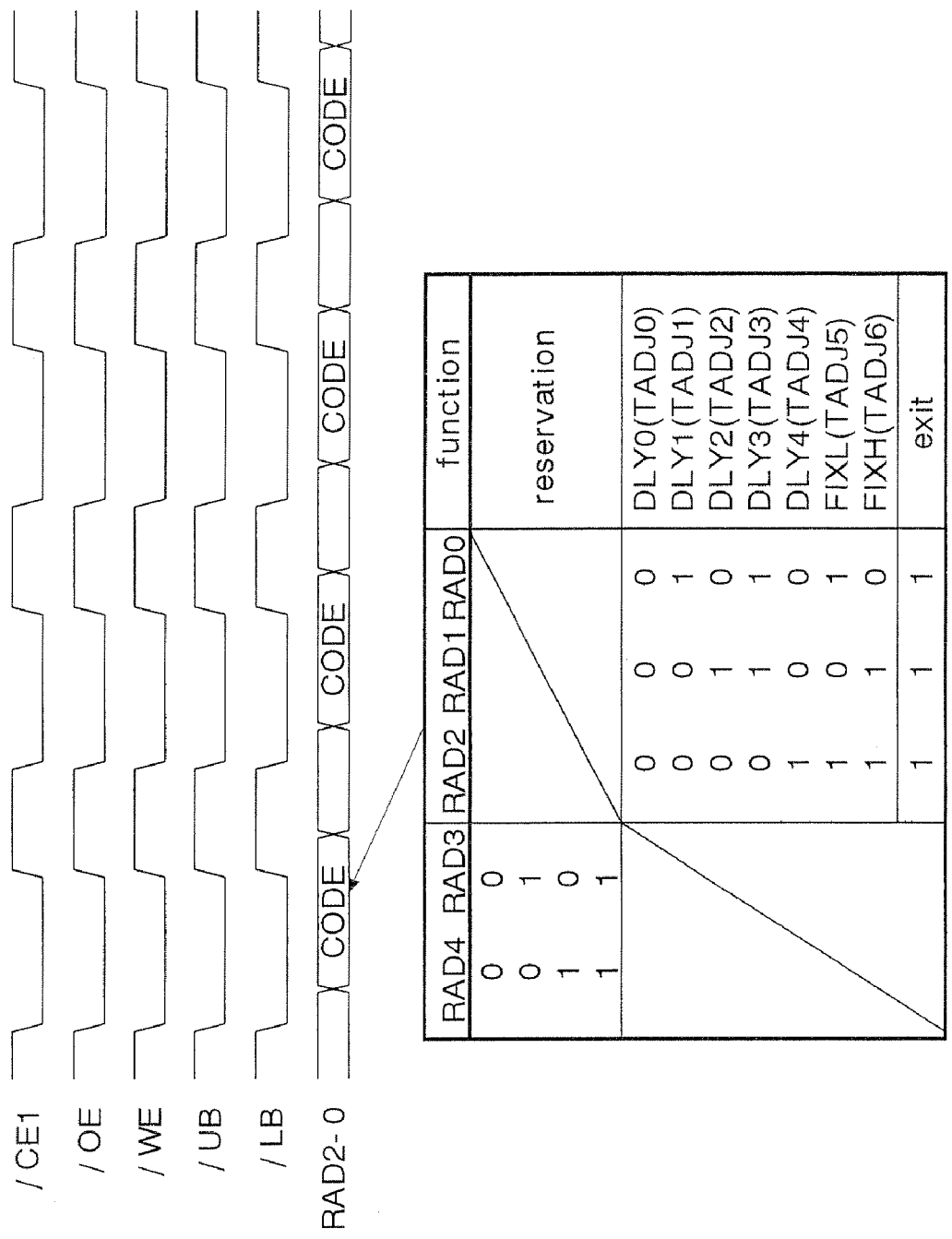
FIG. 34 is an explanatory chart illustrating a test command sequence of the thirteenth embodiment.

FIG. 34 illustrates a test command sequence when changing off-timing of the switch control signal corresponding to the bit line to which data are not output. The sequence is the same as in FIG. 11 except that the assignment of the address signal RAD is different. The command decoder 12B activates one of the timing adjusting signals TADJ0-6 to a high logic level according to a test code CODE supplied together with a test command.

In this embodiment, deactivation timing (off-timing) of the switch control signal CNT corresponding to the bit line to which data are not output is changed by the test code CODE. Accordingly, the timing changing circuit 46a shown in FIG. 35 can adjust the off-timing of the switch control signal CNT only during the test mode. Further, the command input circuit 10 and the address input circuit 16 operate as a command input circuit which receives a timing changing command for changing the off-timing of the switch control signal CNT (CNT1 or CNT2).

The reserved address signals RAD4-3 can be used for changing timing of another signal controlling a precharge operation of the bit line reset signal BRS or the like. The off-timing adjusted during the test mode is retained until the power of the FCRAM is turned off or until the off-timing is adjusted again by the test command. Note that by combining this embodiment with the seventh embodiment (fuse circuit 34), the deactivation timing of the switch control signal CNT can be set to the optimum without changing the photomask.

Figure 35:
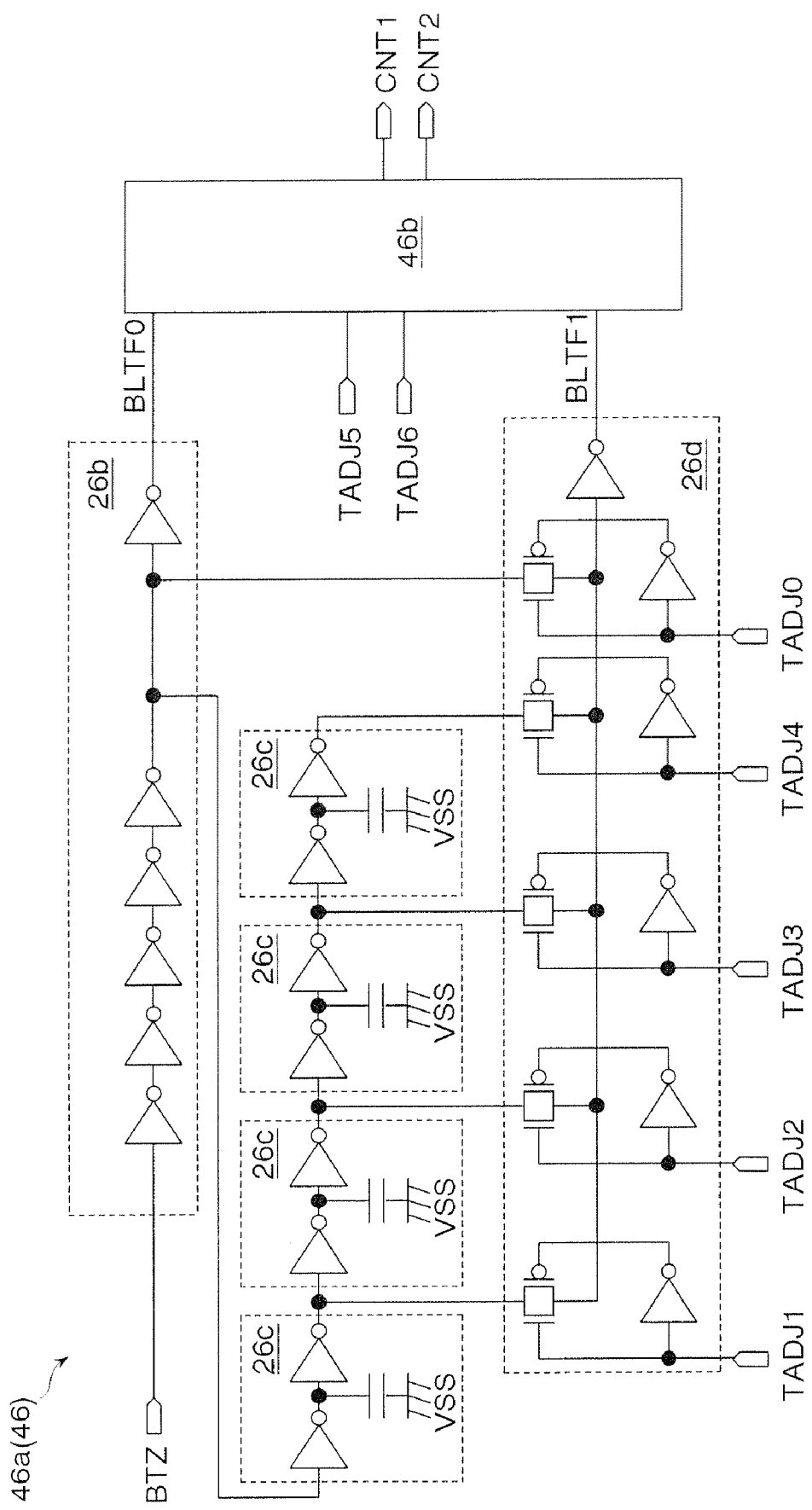
FIG. 35 is a circuit diagram illustrating a timing changing circuit formed in a precharge control circuit shown in FIG. 31.

FIG. 35 illustrates a timing changing circuit 46a which generates a timing signal CNTF1 which determines off-timing of the switch control signal CNT in the precharge control circuit 46 shown in FIG. 31. The timing changing circuit 46a has a buffer circuit 26b, four cascade coupled delay circuits 26c, a selection circuit 26d, and a signal generation circuit 46b.

The buffer circuit 26d, the delay circuits 26c and the selection circuit 26d are the same as in the fourth embodiment (FIG. 12). The signal generation circuit 46b receives the timing signals BLTF0-1 and generates the switch control signals CNT1-2. However, when the timing adjusting signal TADJ5 is activated, the signal generation circuit 46b fixes the switch control signal (one of CNT1-2) corresponding to the bit line (one of BL, /BL) to which data are not output to the ground voltage VSS. At this time, the corresponding capacitor switch PSW is constantly turned off, and the corresponding bit line is not coupled to the precharge voltage line VPR. In other words, the corresponding bit line is held in a state that a load capacitor is not coupled.

Further, when the timing adjusting signal TADJ6 is activated, the signal generation circuit 46b fixes the switch control signal (one of CNT1-2) corresponding to the bit line (one of BL, /BL) to which data are not output to the internal power supply voltage VII. At this time, the corresponding capacitor switch PSW is constantly turned on, and the corresponding bit line is constantly coupled to the precharge voltage line VPR. In other words, the corresponding bit line is held in a state that a load capacitor is coupled constantly.

As above, also in this embodiment, the same effects as in the above-described embodiments can be obtained. Particularly, the same effects as in the second embodiment can be obtained.

Figure 36:
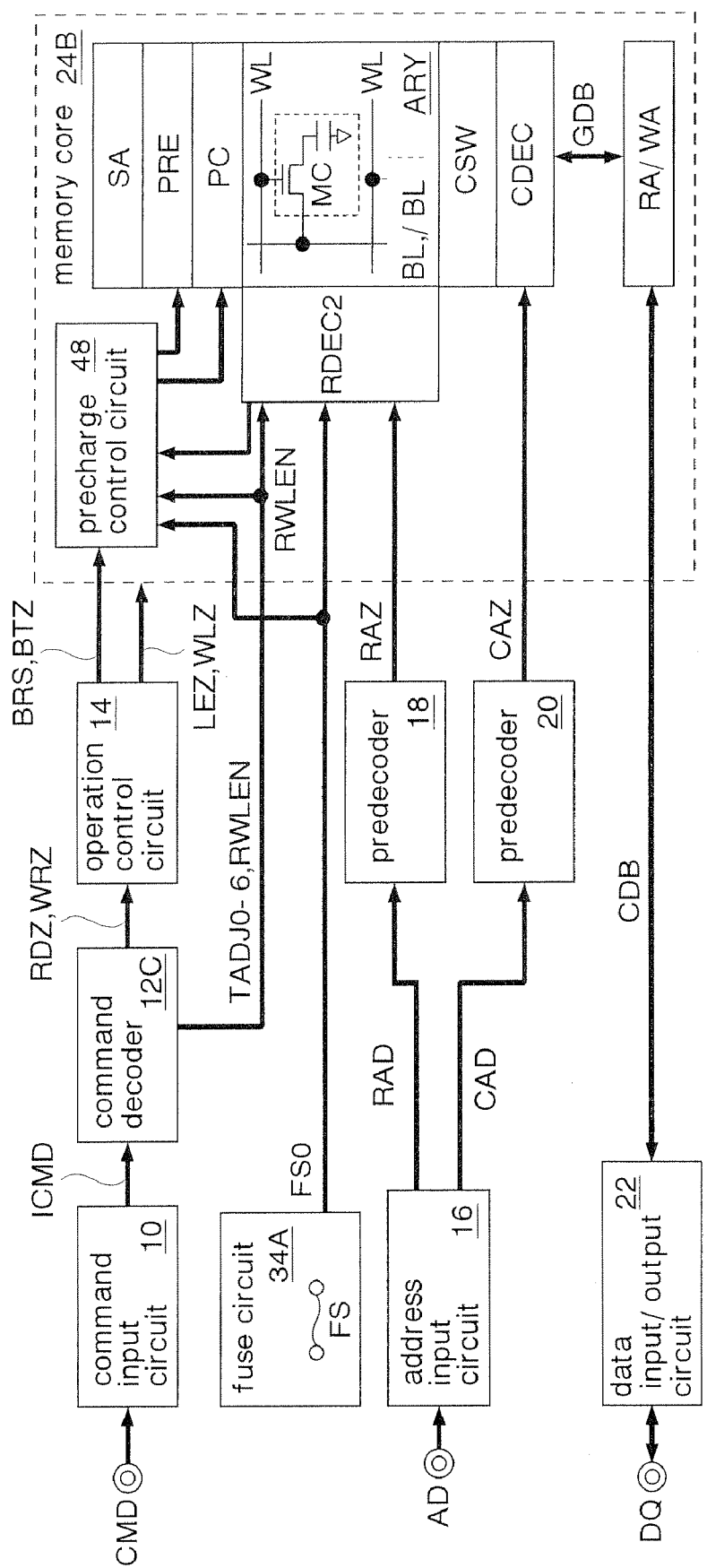
FIG. 36 is a block diagram illustrating a fourteenth embodiment.

FIG. 36 illustrates a fourteenth embodiment. The same elements as those explained in the above-described embodiments are given the same reference signs, and detailed explanations thereof are omitted. In this embodiment, a command decoder 12C and a memory core 24B are formed instead of the command decoder 12B, the memory core 24A of the thirteenth embodiment (FIG. 31). In addition, a fuse circuit 34A is newly formed. The other structure is the same as in the thirteenth embodiment. Specifically, the semiconductor integrated circuit in this embodiment is formed as an FCRAM.

The command decoder 12C activates one of the timing adjusting signals TADJ0-4 (default is TADJ2) to a high logic level according to a test code (row address signal RAD) supplied together with a test command, and outputs a redundancy word enable signal RWLEN.

The redundancy word enable signal RWLEN is a signal which determines whether or not to use a precharge capacitor unit PC shown in FIG. 37, which will be described later, as a redundancy memory cell.

The fuse circuit 34A has a fuse FS. The fuse circuit 34A outputs a fuse signal FS0 at a low logic level when the fuse FS is cut (programmed), and outputs a fuse signal FS0 at a high logic level when the fuse FS is not cut. Specifically, the fuse signal FS0 indicates the program state of the fuse FS. The fuse signal FS0 is a signal which determines whether or not to use a precharge capacitor unit PC shown in FIG. 37 as a redundancy memory cell. The fuse signal FS0 is given priority over the redundancy word enable signal RWLEN.

The memory core 24B has a precharge control circuit 48 and a row decoder RDEC2 instead of the precharge control circuit 46 and the row decoder RDEC of the thirteenth embodiment. In this embodiment, a plurality of precharge capacitor units PC are formed for each of the bit lines BL, /BL in the memory cell array ARY. The memory core 24B is the same as the memory core 24A of the thirteenth embodiment except the functions of the precharge control circuit 48 and the row decoder RDEC2. In other words, each sense amplifier SA is coupled to only a pair of bit lines BL, /BL.

Upon activation of the redundancy word enable signal RWLEN, the row decoder RDEC2 switches a decode function so as to use a part of the precharge capacitor units PC as a redundancy memory cell. Upon reception of the fuse signal FS0 at a low logic level, the row decoder RDEC2 switches a decode function so as to use a part of the precharge capacitor units PC as a redundancy memory cell irrelevantly to the logic level of the redundancy word enable signal RWLEN.

The precharge control circuit 48 has a function to control the plurality of precharge capacitor units PC. Further, the precharge control circuit 48 has a function to change deactivation timing of the switch control signals CNT1-2 according to the timing adjusting signals TADJ0-6, similarly to the thirteenth embodiment. Upon activation of the redundancy word enable signal RWLEN, the precharge control circuit 48 stops supplying of the switch control signals CNT1-2 to a part of the precharge capacitor units PC. In other words, the precharge control circuit 48 functions also as a switch selection circuit which sets the number of precharge capacitors PCA (FIG. 37) to be used as a load, according to the redundancy word enable signal RWLEN.

Upon reception of the fuse signal FS0 at a low logic level, the precharge control circuit 48 stops supplying of the switch control signal CNT1-2 to a part of the precharge capacitor units PC irrelevantly to the logic level of the redundancy word enable signal RWLEN. The other functions of the precharge control circuit 48 are the same as those of the precharge control circuit 46. Specifically, the precharge control circuit 48 has the same timing changing circuit 46a as in FIG. 35.

Figure 37:
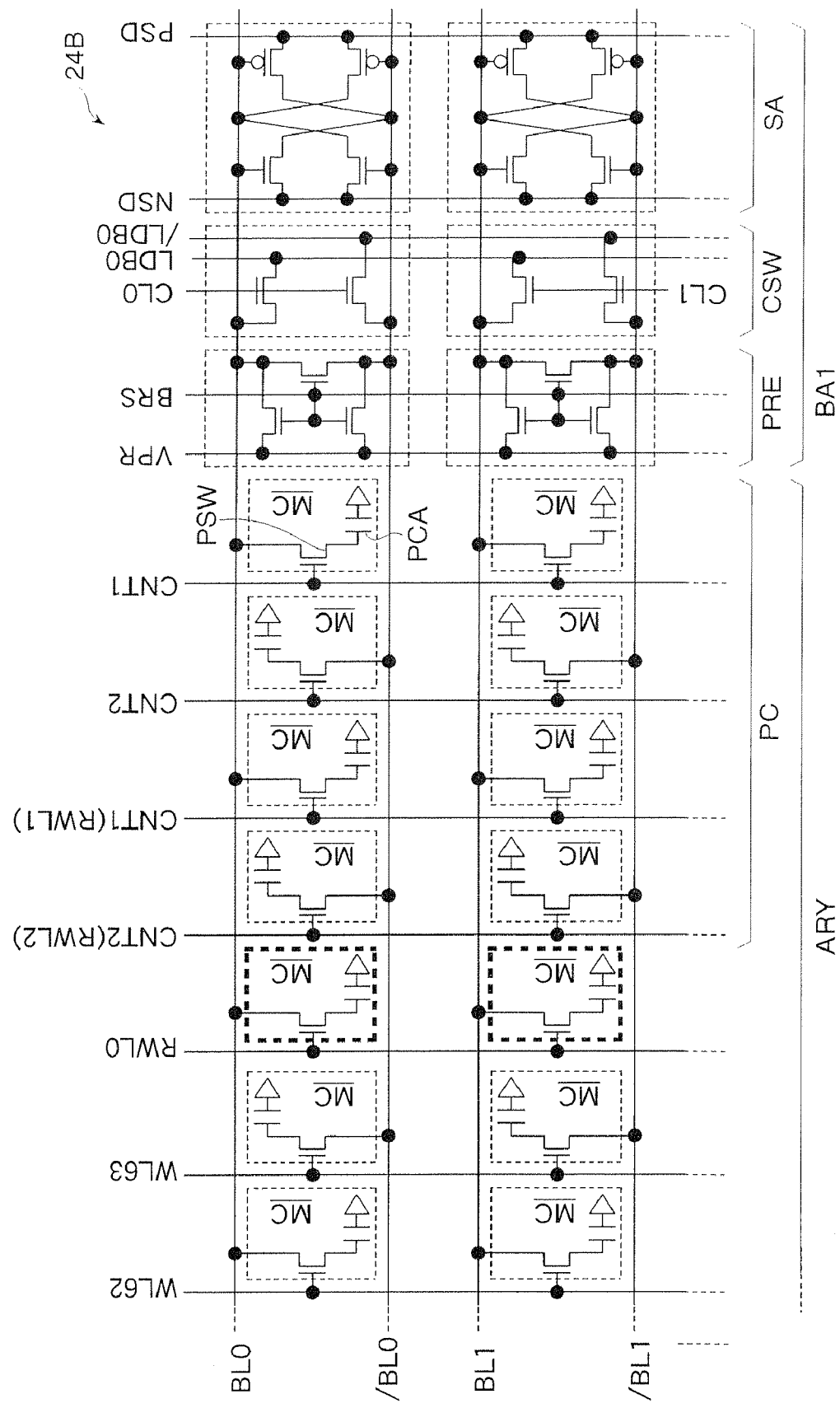
FIG. 37 is a circuit diagram illustrating a substantial part of a memory core shown in FIG. 36.

FIG. 37 illustrates a substantial part of the memory core 24B shown in FIG. 36. Each of the precharge capacitor units PC is formed using a memory cell MC. Specifically, the capacitor switch PSW is formed using the transfer transistor of a memory cell MC, and the precharge capacitor PCA is formed using the capacitor of a memory cell MC. Accordingly, an already designed memory cell array ARY can be used for example.

In this embodiment, a pair of capacitor switches PSW and a pair of precharge capacitors PCS are formed for each of the bit lines BL, /BL. However, when the redundancy word enable signal RWLEN at a high logic level is output from the command decoder 12c, or when the fuse signal FS0 at a low logic level is output from the fuse circuit 34A, one of the capacitor switches PSW and one of the precharge capacitors PCA are used as a redundancy memory cell. At this time, the gate of the capacitor switch PSW used as a redundancy memory cell is uncoupled from the signal line of the switch control signals CNT1-2 and is coupled to the redundancy word lines RWL1-2.

Figure 38:
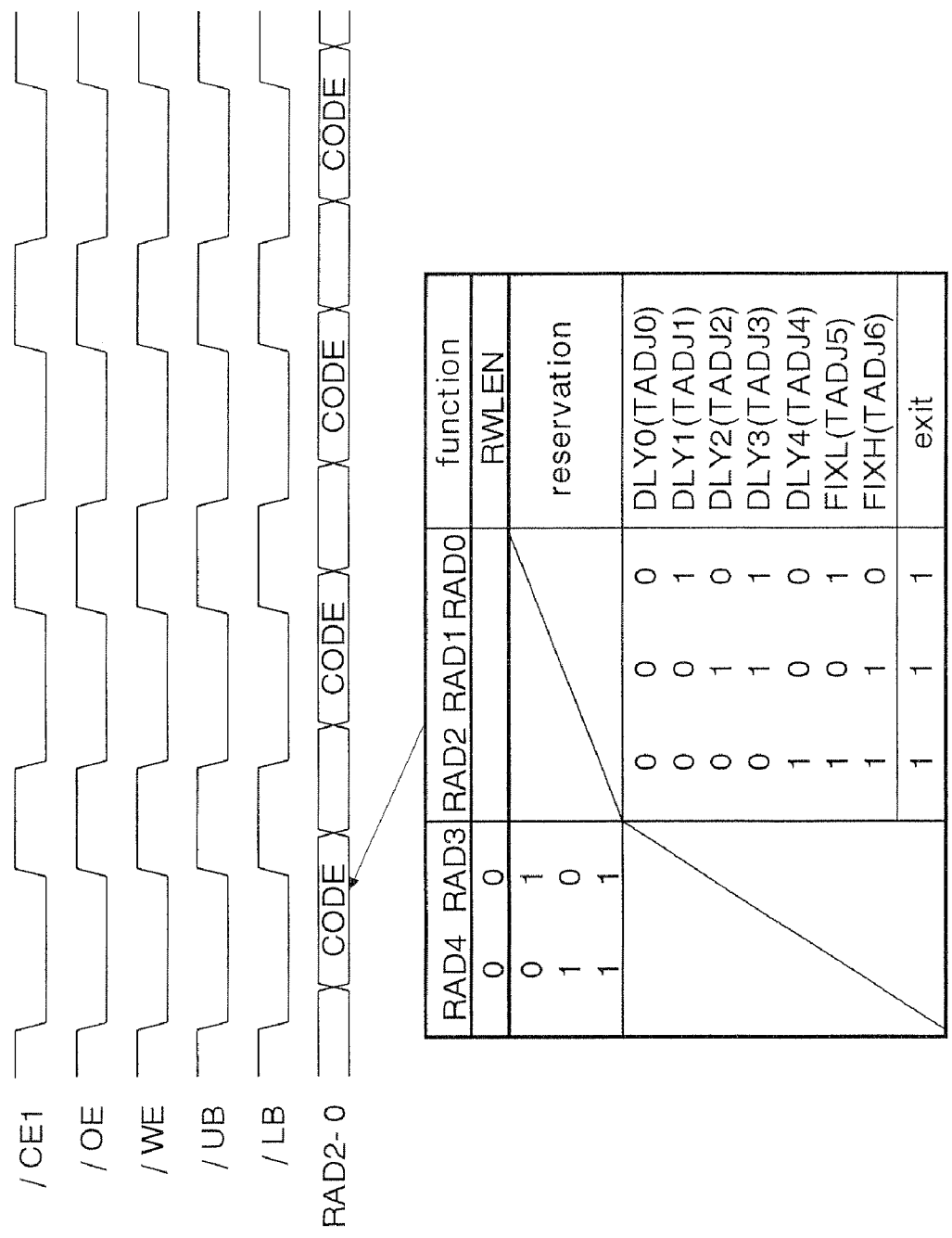
FIG. 38 is an explanatory chart illustrating a test command sequence of the fourteenth embodiment.

FIG. 38 illustrates a test command sequence when changing off-timing of a switch control signal corresponding to the bit line to which data are not output. The command decoder 12C activates the redundancy word enable signal RWLEN to a high logic level when the address signals RAD4-3 are "00". Other assignments of the address signal PAD are the same as in FIG. 34.

The reserved address signals RAD4-3 can be used for changing timing of another signal for controlling a precharge operation of the bit line reset signal BRS or the like. The off-timing adjusted during the test mode is retained until the power of the FCRAM is turned off or until the off-timing is adjusted again by the test command. Note that by combining this embodiment with the seventh embodiment (fuse circuit 34), the deactivation timing of the switch control signal CNT can be set to the optimum without changing the photomask.

As above, also in this embodiment, the same effects as in the above-described embodiments can be obtained. Furthermore, the use of the memory cells MC to form the capacitor switches PSW and the precharge capacitors PCA facilitates layout designing of the memory core 24B. Since the number of precharge capacitors PCA coupled to each of the bit lines BL, /BL can be changed, the optimum reading operation characteristics can be obtained for every FCRAM manufactured. In other words, layout data of an already designed memory cell array ARY can be utilized, and hence efficiency of designing the FCRAM can be improved. Since the precharge capacitor PCA that is not in use can be used as a redundancy memory cell, efficiency of relieving defects can be improved, and the yield of the FCRAM can be improved.

Figure 39:
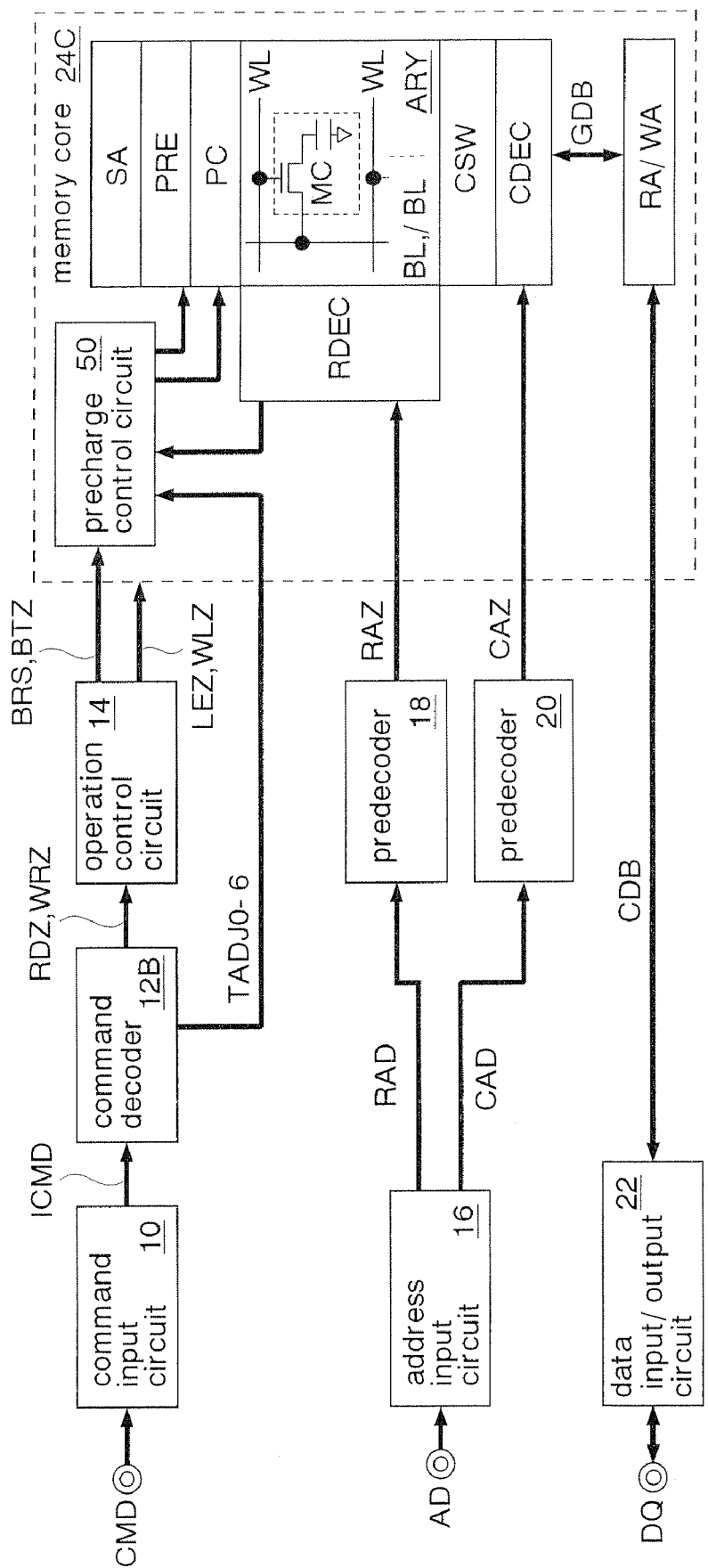
FIG. 39 is a block diagram illustrating a fifteenth embodiment.

FIG. 39 illustrates a fifteenth embodiment. The same elements as those explained in the above-described embodiments are given the same reference signs, and detailed explanations thereof are omitted. In this embodiment, a memory core 24C is formed instead of the memory core 24A of the thirteenth embodiment (FIG. 31). The other structure is the same as in the thirteenth embodiment. Specifically, the semiconductor integrated circuit in this embodiment is formed as an FCRAM. Further, the command input circuit 10 and the address input circuit 16 operate as a command input circuit which receives a timing changing command for changing off-timing of a switch control signal CNT (CNT1 or CNT2), which will be described later. The test command sequence thereof is the same as in the above-described FIG. 34.

The memory core 24C has a precharge control circuit 50 instead of the precharge control circuit 46 of the thirteenth embodiment. In this embodiment, each sense amplifier SA is coupled to only a pair of bit lines BL, /BL. The precharge control circuit 50 is different from the precharge control circuit 46 in function to control the precharge capacitor unit PC and the precharge unit PRE. The other functions of the precharge control circuit 50 are the same as those of the precharge control circuit 46.

Figure 40:
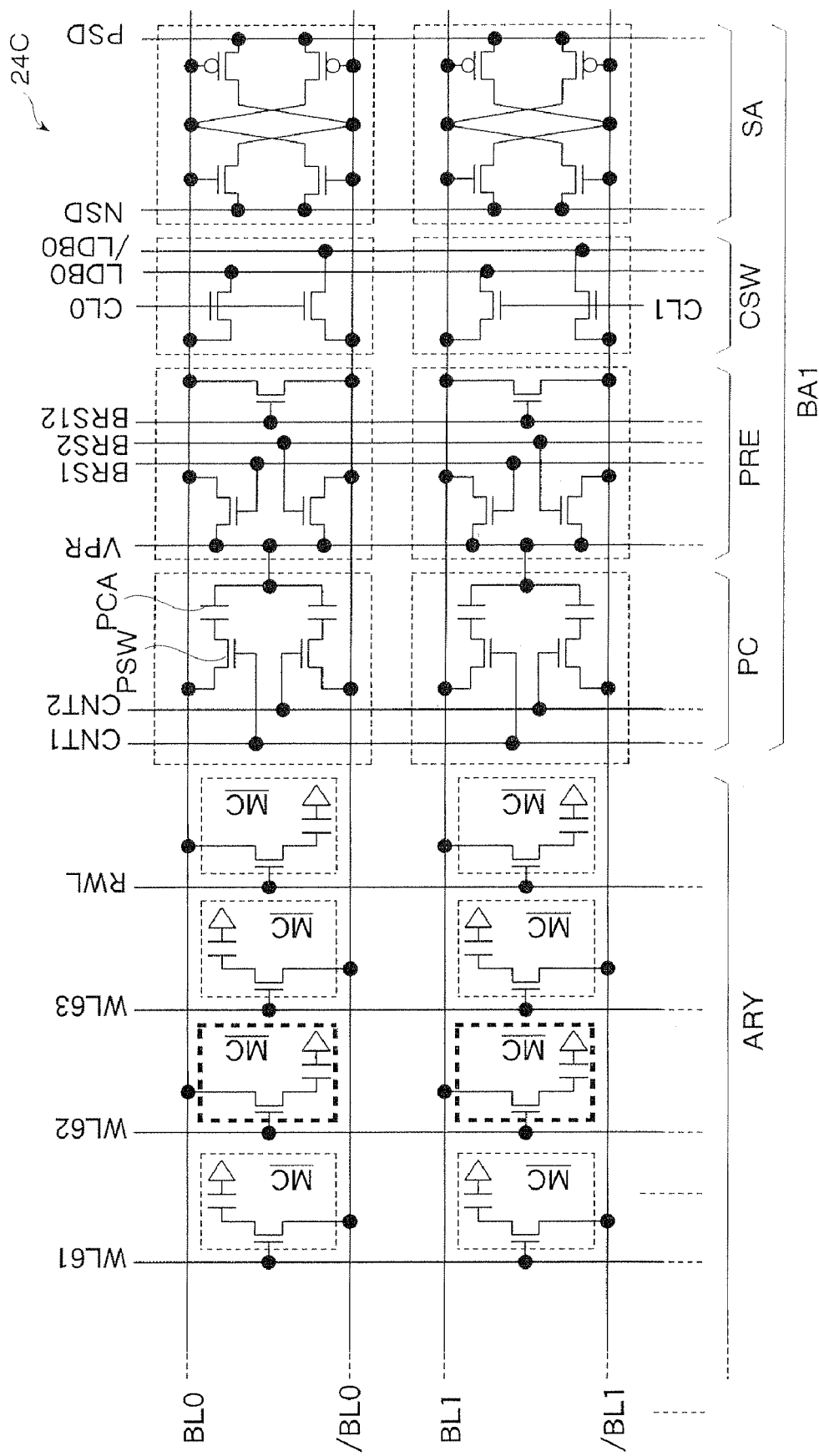
FIG. 40 is a circuit diagram illustrating a substantial part of a memory core shown in FIG. 39.

FIG. 40 illustrates a substantial part of the memory core 24C shown in FIG. 39. The memory core 24C is the same as the memory core 24A (FIG. 32) of the thirteenth embodiment except that the circuit structure of the precharge unit PRE is different. In each precharge circuit of the precharge unit PRE, the gates of nMOS transistors (precharge switches) which couple the bit lines BL, /BL to the precharge voltage line VPR receive the bit line reset signals BRS1-2, which are different from each other. Further, the gate of an nMOS transistor (equalization switch) for equalization, which couples the bit line pair BL, /BL to each other, receives a bit line reset signal BRS12 having the AND logic of the bit line reset signals BRS1-2. Accordingly, each bit line of the bit line pair BL, /BL can receive the precharge voltage VPR independently from each other. The precharge capacitors PCA are used as a load coupled to the bit lines BL, /BL.

Figure 41:
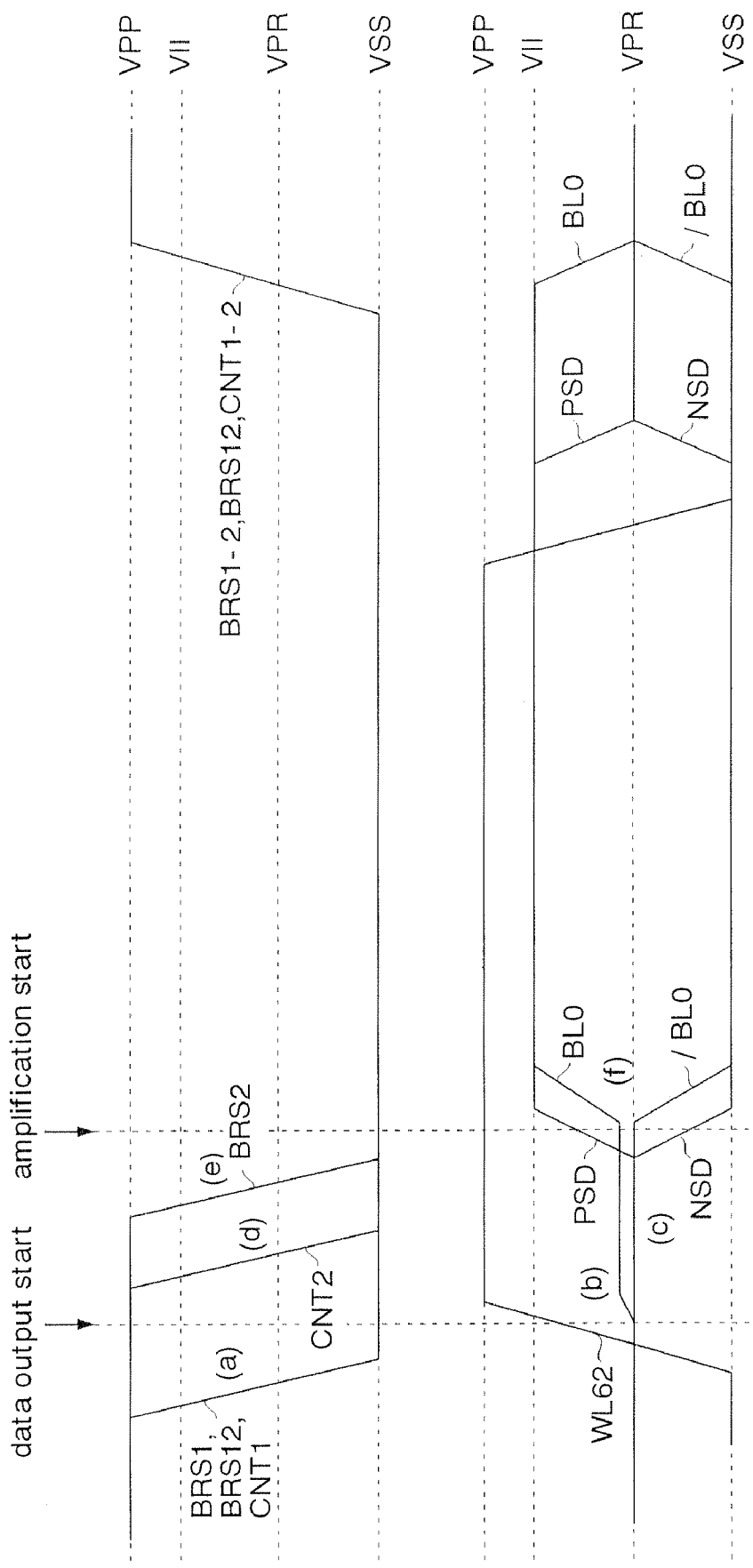
FIG. 41 is a timing chart illustrating a read operation of an FCRAM of the fifteenth embodiment.

FIG. 41 illustrates a read operation of the FCRAM of this embodiment. In this example, the word line WL62 is selected, and data are read from memory cells MC coupled to the bit lines BL0, BL1, which are indicated by thick dashed line frames in FIG. 40. The basic operation thereof is the same as in the above-described FIG. 5. The following explanation is given focusing on the bit lines BL, /BL0. Details of the waveforms of the bit lines BL0, /BL0 from activation of the word line WL62 until start of an amplifying operation by the sense amplifier SA are the same as in FIG. 6(d). Here, the bit lines BL0, /BL0 correspond to the data lines D1, D2 in FIG. 6. The switch control signal CNT2 and the bit line reset signal BRS2 correspond to the switch control signals for turning off the switch CS2 and the switch PS2 in FIG. 6.

First, just before the word line WL62 is activated, the bit line reset signal BRS1 is deactivated to a low logic level, and the coupling of the bit line BL0 to which data are output and the precharge voltage line VPR is released. In response to the change of the bit line reset signal BRS1, the bit line reset signal BRS12 is deactivated to a low logic level, and an equalization operation for the bit line pair BL0, /BL0 stops. Simultaneously, the switch control signal CNT1 corresponding to the bit line BL0 to which data are output is deactivated to a low logic level (FIG. 41(a)).

The capacitor switch PSW coupled to the bit line BL0 is turned off by the switch control signal CNT1. Accordingly, the coupling of the bit line BL0 and the precharge capacitor PCA is released. This release causes the load capacitance on the bit line BL0 to which data are output to decrease, and hence a change amount of the voltage on the bit line BL0 due to outputting of data becomes large.

Thereafter, the word line WL62 is activated, and data are output to the bit line BL0 (FIG. 41(b)). At this time, the capacitor switch PSW coupled to the bit line /BL0 to which data are not output is on. Accordingly, the bit line /BL0 is coupled to the precharge capacitor PCA and the load capacitance thereon is increased. Therefore, when data are output to the bit line BL0 and the voltage thereon changes, change of the voltage on the bit line /BL0 due to the coupling capacitance is suppressed (FIG. 41(c)). In other words, decrease of the voltage difference in the bit line pair BL0, /BL0 is prevented.

After the word line WL62 is activated and before the sense amplifier starts the amplifying operation, the switch control signal CNT2 is deactivated to a low logic level (FIG. 41(d)). By the deactivation of the switch control signal CNT2, the capacitor switch PSW coupled to the bit line /BL0 to which data are not output turns off. The coupling of the bit line /BL0 and the precharge capacitor PCA is released, and hence the load capacitance on the bit line /BL0 decreases. By the high logic level of the bit line reset signal BRS2, the bit line /BL0 is coupled to the precharge voltage line VPR. Since the load capacitance on the bit line /BL0 is small, the voltage on the bit line /BL0 decreases quickly to the precharge voltage VPR (corresponding to the reference voltage VREF) as shown in FIG. 6(d).

Next, just before the sense amplifier SA starts the amplifying operation, the bit line reset signal BRS2 corresponding to the bit line /BL0 to which data are not output is deactivated to a low logic level (FIG. 41(e)). Thus, the bit line /BL0 charged to the precharge voltage VPR is set to a floating state.

Next, the sense amplifier SA operates, and the voltage difference in the bit line pair BL0, /BL0 is amplified (FIG. 41(f)). The operation thereafter is the same as in the above-described FIG. 33, and hence an explanation thereof is omitted. As above, also in this embodiment, the same effects as in the above-described embodiments can be obtained. Particularly, the same effects as in the third embodiment can be obtained.

Figure 42:
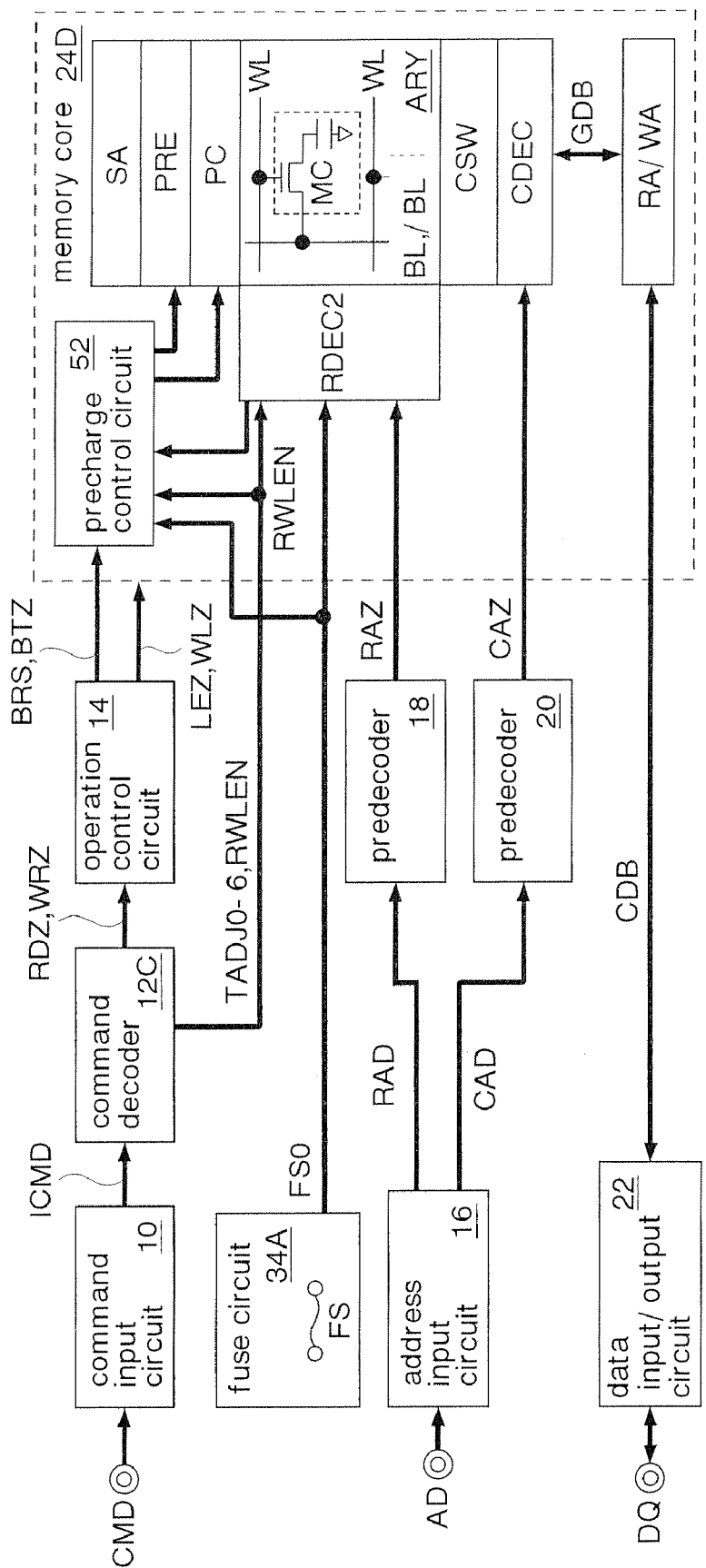
FIG. 42 is a block diagram illustrating a sixteenth embodiment.

FIG. 42 illustrates a sixteenth embodiment. The same elements as those explained in the above-described embodiments are given the same reference signs, and detailed explanations thereof are omitted. In this embodiment, a memory core 24D is formed instead of the memory core 24B of the fourteenth embodiment (FIG. 36). The other structure is the same as in the fourteenth embodiment. Specifically, the semiconductor integrated circuit in this embodiment is formed as an FCRAM.

The memory core 24D has a precharge control circuit 52 instead of the precharge control circuit 48 of the fourteenth embodiment. The memory core 24D is the same as the memory core 24B of the fourteenth embodiment except the precharge control circuit 50 and the precharge circuit PRE shown in FIG. 43, which will be described later. Specifically, each sense amplifier SA is coupled to only a pair of bit lines BL, /BL.

The precharge control circuit 52 has a function to generate the bit line reset signals BRS11-2, BRS12, similarly to the precharge control circuit 50 of the fifteenth embodiment. The other functions are the same as those of the precharge control circuit 48 of the fifteenth embodiment.

Figure 43:
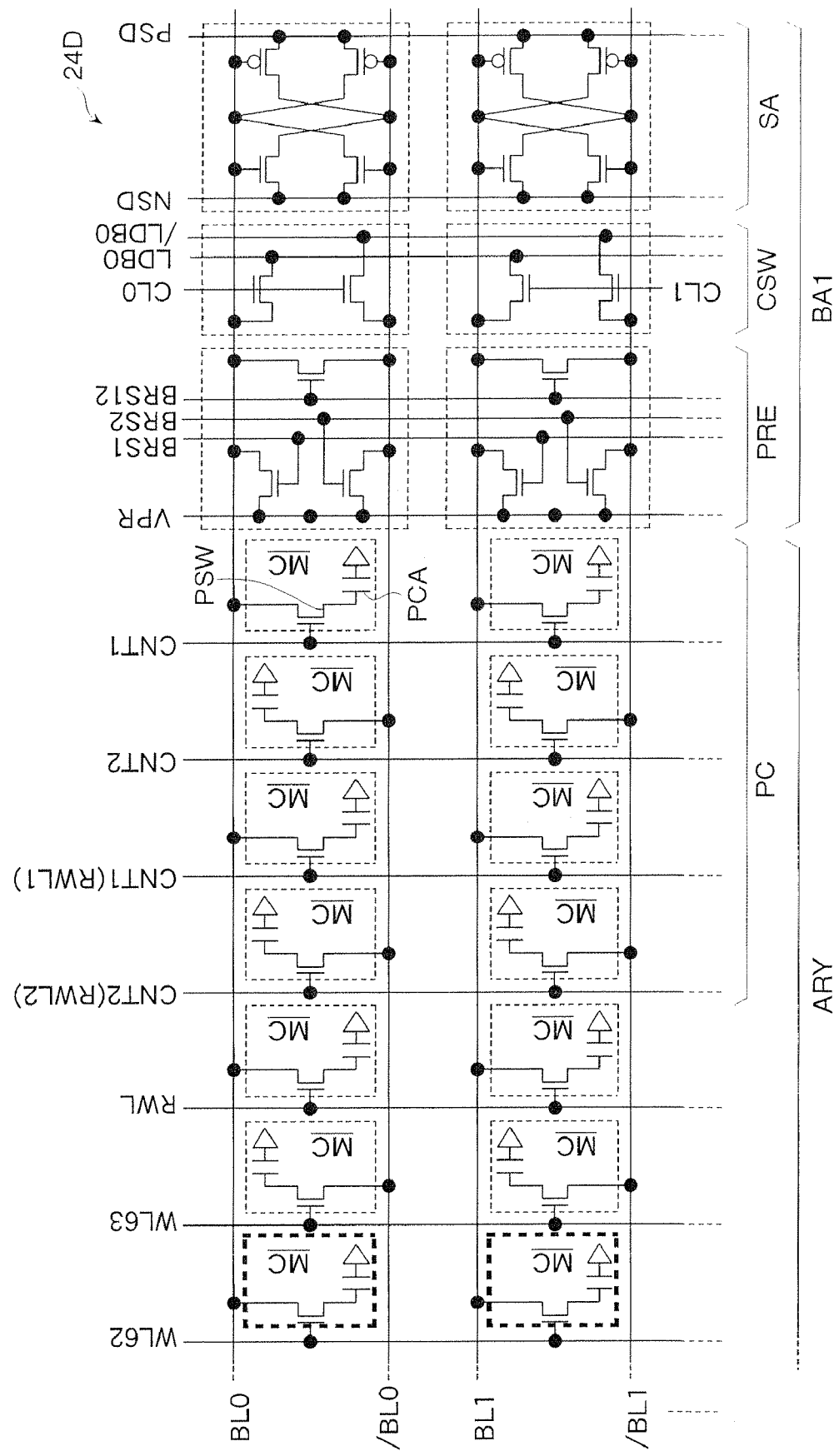
FIG. 43 is a circuit diagram illustrating a substantial part of a memory core shown in FIG. 42.

FIG. 43 illustrates a substantial part of the memory core 24D shown in FIG. 42. The memory core 24D is different from that of the fourteenth embodiment (FIG. 37) only in structure of the precharge circuit PRE. Specifically, a plurality of precharge capacitor units PC are formed for each of the bit lines BL, /BL. The capacitor switches PSW are formed using the transfer transistors of the memory cells MC, and the precharge capacitors PCA are formed using the capacitors of the memory cells MC.

The precharge circuit PRE is the same as in the fifteenth embodiment (FIG. 40). The operation of the precharge circuit PRE is the same as in the fifteenth embodiment (FIG. 41). Further, in this embodiment, a part of the precharge capacitor units PC can be used as a redundancy memory cell, similarly to the fourteenth embodiment. As above, also in this embodiment, the same effects as in the above-described embodiments can be obtained.

Figure 44:
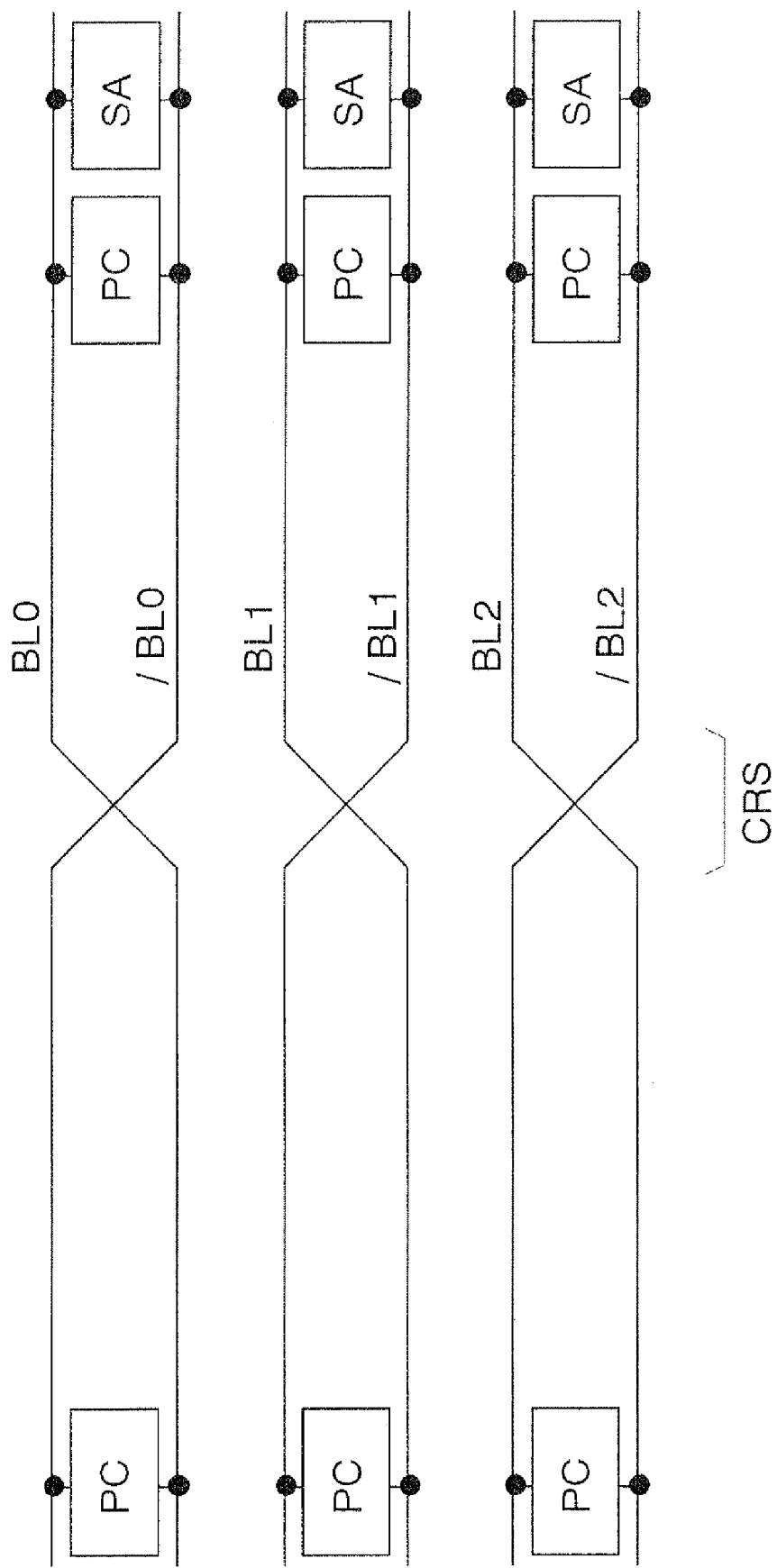
FIG. 44 is a block diagram illustrating a substantial part of a memory core in a seventeenth embodiment.

FIG. 44 illustrates a substantial part of a memory core in a seventeenth embodiment. The same elements as those explained in the above-described embodiments are given the same reference signs, and detailed explanations thereof are omitted. In this embodiment, the memory cell array ARY of the thirteenth embodiment (FIG. 31) is replaced with a memory cell array ARY having a bit line twisted structure. The bit line twisted structure has intersection parts CRS where the bit lines BL, /BL intersect each other. The precharge capacitor units PC are arranged on both sides of the intersection parts CRS for each of the bit line pairs BL, /BL. Note that the memory cell array ARY having the bit line twisted structure may be applied to the fourteenth to the sixteenth embodiment.

As above, also in this embodiment, the same effects as in the above-described embodiments can be obtained. Furthermore, by arranging the precharge capacitor units PC on the both sides of the intersection parts CRS, the operation of each precharge unit PC can be controlled easily. In addition, the precharge control on the bit lines BL, /BL can be implemented securely when the bit lines BL, /BL are long.

Note that the technique of the mode register of the fifth embodiment (FIG. 14) may be applied to the thirteenth to the seventeenth embodiment, and the deactivation timing of the switch control signal CNT2 may be changed according to a value set in the mode register. Similarly, in the fourteenth to the sixteenth embodiment, the number of precharge capacitors PCA used as a load may be set by the mode register.

Pads and a timing decoder similar to those of the sixth embodiment (FIG. 17) may be formed in the thirteenth to the seventeenth embodiment, and the deactivation timing of the switch control signal CNT2 may be changed according to a value set in the mode register. Similarly, in the fourteenth to the sixteenth embodiment, the number of precharge capacitors PCA used as a load may be set by the pads and the timing decoder.

A fuse circuit and a timing decoder similar to those of the seventh embodiment (FIG. 18) may be formed in the thirteenth to the seventeenth embodiment, and the deactivation timing of the switch control signal CNT2 may be changed according to a value set in the mode register.

The timing changing circuits 26a, 28a of the fourth and the fifth embodiment (FIG. 12, FIG. 15) may be applied to the fourteenth to the seventeenth embodiment. Alternatively, the timing changing circuits 36a, 37a, 40a, 41a, 44a of the eighth to the twelfth embodiment may be applied. Specifically, in the fourteenth to the seventeenth embodiment, the deactivation timing of the switch control signal CNT may be adjusted by selectively using a plurality of delay stages in which at least either of the channel length L and the gate width W is different. The deactivation timing of the switch control signal CNT may be adjusted by changing the substrate voltage supplied to the substrates of the transistors of the delay circuits. Alternatively, the deactivation timing of the switch control signal CNT may be adjusted by changing the power supply voltage supplied to the delay circuits.

The MCP (FIG. 13) of the fourth embodiment may be formed using the semiconductor integrated circuit chips of the first to the third and the fifth to the seventeenth embodiment. Similarly, the SOC (FIG. 16) of the fifth embodiment may be formed using the semiconductor integrated circuits of the first to the fourth and the sixth to the seventeenth embodiment.

The embodiments are applicable not only to the precharge control of the bit lines BL, /BL coupled to the sense amplifier SA, but also to precharge control of the local data bus lines LDB coupled to the read amplifier RA. Alternatively, the embodiments are also applicable to a differential amplifier and a logic chip or the like having complementary data lines coupled to the differential amplifier.

The embodiments are applicable not only to the FCRAM but also to a general DRAM, SDRAM, or pseudo SRAM.

A proposition of the embodiments is to prevent decrease of the read margin of data due to the coupling capacitance.

According to a first aspect of the embodiments, one of a pair of data output units each having a complementary data line pair outputs data. At this time, the data output unit outputs data to one of the data lines which are precharged to a reference voltage. Amplifier switches couple coupling wires to the data lines respectively. A switch control unit outputs amplifier switch control signals which control operations of the amplifier switches respectively. Specifically, when one of the data output units outputs data to one of the data line pair, the switch control unit turns on by the amplifier switch control signals a pair of amplifier switches coupled to the data line pair of the data output unit which outputs data. Thus, the data line pair to which data are outputted are coupled to the coupling wire pair.

Further, the switch control unit turns on an amplifier switch coupled to a data line, which corresponds to a data line to which data are not output, in a data output unit which does not output data during a period after the one of the data output units outputs data until the differential amplifier starts an amplifying operation. Accordingly, the coupling wire and the data line to which data are not transmitted are coupled to the precharged data line in the data output unit which does not output data, and the load amount thereon increases. Therefore, it is possible to prevent change of the voltage on the data line and the coupling wire to which data are not transmitted due to the influence of the coupling capacitance during data output. Consequently, it is possible to prevent decrease of the voltage differences in the data line pair and the coupling wire pair when the differential amplifier starts an amplifying operation. That is, decrease of the read margin of data due to the coupling capacitance in the data line pair and the coupling wire pair can be prevented. The differential amplifier can perform a sufficient amplifying operation, and hence for example the access time, which is a time from request for output of data until amplified data are output to the outside, can be reduced.

For example, each of the data output units is a memory cell array having a plurality of memory cells. Each of the data line pairs is a complementary bit line pair coupled to the memory cells respectively. Thus, the embodiments can also be applied to a semiconductor memory in which a differential amplifier is shared by a pair of memory cell arrays.

In a preferred example of the first aspect of the embodiments, before the differential amplifier starts an amplifying operation, the switch control unit turns off the amplifier switch coupled to the data line, which corresponds to the data line to which data are not output, in the data output unit which does not output data. The coupling wire to which data are not output is set to floating before the amplifying operation. Thus, the differential amplifier can differentially amplify the voltage difference in the coupling wire pair reliably.

For example, precharge switches are arranged respectively between the data lines and a reference voltage line to which the reference voltage is supplied. Then, the switch control unit turns on by precharge switch control signals precharge switches coupled to the data line pair of the data output unit which does not output data during a period after the one of the data output units outputs data until the differential amplifier starts an amplifying operation. Thus, the voltage on the data line and the coupling wire to which data are not transmitted can be precharged to the reference voltage until just before an amplifying operation. Consequently, it is possible to securely prevent change of the voltage on the data line and the coupling wire to which data are not transmitted due to the influence of the coupling capacitance during data output.

In a preferred example of the first aspect of the embodiments, equalization switches couple data lines of the data line pairs to each other. The switch control unit outputs equalization switch control signals which control operations of the equalization switches respectively. Further, the switch control unit turns off by the equalization switch control signals an equalization switch coupled to the data line pair of the data output unit which outputs data, and turns on an equalization switch coupled to the data line pair of the data output unit which does not output data during a period after the data output unit outputs data until the differential amplifier starts an amplifying operation.

The coupling wire to which data are not transmitted is coupled to both the data lines of the data output unit which does not output data. Therefore, the load amount on the coupling wire to which data are not transmitted can be increased significantly. Consequently, it is possible to securely prevent change of the voltage on the data line and the coupling wire to which data are not transmitted due to the influence of the coupling capacitance during data output.

In a second aspect of the embodiments, a data output unit having a complementary data line pair outputs data to one of the data lines which are precharged to a reference voltage. A capacitor switch and a precharge capacitor usable as a load are arranged in series between each of the data lines and a reference voltage line to which the reference voltage is supplied. A switch control unit outputs switch control signals which control operations of the capacitor switches respectively. Specifically, when the data output unit outputs data to one of the data line pair, the switch control unit turns off by the switch control signals a capacitor switch being on, which corresponds to the data line to which data are output. Thus, the load amount on the data line to which data are output decreases, and hence the voltage variation amount on the data line which changes in response to data output to the data line can be increased.

Further, the switch control unit maintains an on-state of a capacitor switch, which corresponds to a data line to which data are not output, during a period after the data output unit outputs data until the differential amplifier starts an amplifying operation. Accordingly, when the data output unit outputs data to one of the data line pair, the data line to which data are not output is coupled to the precharge capacitor, and the load amount on the data line is increased. Thus, it is possible to prevent change of the voltage on the data line to which data are not output due to the influence of the coupling capacitance during data output. Consequently, decrease of the voltage difference in the data line pair can be prevented when the differential amplifier starts the amplifying operation. That is, decrease of the read margin of data due to the coupling capacitance in the data line pair can be prevented.

In a preferred example of the second aspect of the embodiments, the switch control unit turns off the capacitor switch being on, which corresponds to the data line to which data are not output, before the differential amplifier starts an amplifying operation. Accordingly, the load amount on the data line to which data are not output decreases before an amplifying operation. Thus, the differential amplifier can differentially amplify the voltage difference in the coupling wire pair reliably.

In a preferred example of the second aspect of the embodiments, each of the data output units is a memory cell array having a plurality of memory cells. Each of the data line pairs is a complementary bit line pair coupled to the memory cells respectively. The embodiments can also be applied to a semiconductor memory in which a differential amplifier is shared by a pair of memory cell arrays.

In a preferred example of the second aspect of the embodiments, each of the memory cells has a memory cell capacitor which retains data and a transfer transistor. The capacitor switch and the precharge capacitor are formed using a transfer transistor and a memory cell capacitor of the memory cells. Use of the memory cells to form the capacitor switch and the precharge capacitor facilitates designing of the layout of the semiconductor integrated circuit. In other words, layout data of an already designed memory cell array can be utilized, and hence efficiency of designing can be improved.

For example, the semiconductor integrated circuit has a redundancy control circuit. The redundancy control circuit uses, as a redundant memory cell for relief of a defect, a memory cell which is formed by a precharge capacitor not used as a load and a capacitor switch coupled to the precharge capacitor. Thus, efficiency of relieving defects can be improved, and the yield of the semiconductor integrated circuit can be improved.

In a third aspect of the embodiments, a data output unit having a complementary data line pair outputs data to one of the data lines which are precharged to a reference voltage. A capacitor switch and a precharge capacitor usable as a load are arranged in series between each of the data lines and a reference voltage line to which the reference voltage is supplied. Precharge switches are arranged respectively between the data lines and the reference voltage line to which the reference voltage is supplied. A switch control unit outputs switch control signals which control operations of the capacitor switches and the precharge switches respectively. A differential amplifier is coupled to the data line pair and amplifies a voltage difference in the data line pair.

Specifically, when the data output unit outputs data to one of the data line pair, the switch control unit turns off by the switch control signals a capacitor switch being on and a precharge switch being on, which correspond to the data line to which data are output. Further, the switch control unit turns off a precharge switch being on, which corresponds to a data line to which data are not output, after turning off a capacitor switch being on, which corresponds to the data line to which data are not output, during a period after the data output unit outputs data until the differential amplifier starts an amplifying operation. While a precharge capacitor is coupled to the data line to which data are not output, the load amount on the data line increases. Thus, it is possible to prevent change of the voltage on the data line to which data are not output due to the influence of the coupling capacitance of the data line during data output.

After the coupling of the data line to which data are not output and the precharge capacitor is released, the load amount on the data line decreases. Thus, even when the voltage on the data line to which data are not output changes due to the influence of the coupling capacitance during data output, the data line can be precharged to the reference voltage in a short time via the precharge switch being on. Consequently, it is possible to prevent decrease of the voltage difference in the data line pair when the differential amplifier starts an amplifying operation. That is, decrease of the read margin of data due to the coupling capacitance of the data line can be prevented.

In a preferred example of the third aspect of the embodiments, the switch control unit turns off the capacitor switch being on and the precharge switch being on, which correspond to the data line to which data are output, before the data output unit outputs data. Thus, the data line to which data are output turns to a floating state and its load amount decreases, and hence the voltage variation amount on the data line which changes in response to data output to the data line can be increased.

In a preferred example of the first to the third aspect of the embodiments, the switch control unit has a timing changing circuit which changes generation timing of the amplifier switch control signal. With the timing changing circuit, the relationship between the timing of the switch control signals and the influence of coupling noise on the data lines can be evaluated. By feeding back the evaluation results to the manufacturing process or the designing process, the semiconductor integrated circuit with a large read margin of data can be made.

In a preferred example of the second and the third aspect of the embodiments, for example a plurality of the capacitor switches are formed for each of the data lines. A switch selection circuit sets the number of precharge capacitors used as a load. By changing the number of precharge capacitors coupled to the data lines, the voltage variation on the data lines when data are output and when data are differentially amplified can be adjusted to the optimum. As a result, the read margin of data can be improved.

The many features and advantages of the embodiments are apparent from the detailed specification and, thus, it is intended by the appended claims to cover all such features and advantages of the embodiments that fall within the true spirit and scope thereof. Further, since numerous modifications and changes will readily occur to those skilled in the art, it is not desired to limit the inventive embodiments to the exact construction and operation illustrated and described, and accordingly all suitable modifications and equivalents may be resorted to, falling within the scope thereof.

What is claimed is:

1. A semiconductor integrated circuit, comprising:
a pair of data output units each having a complementary data line pair and outputting data to one of the data lines which are precharged to a reference voltage;
a complementary coupling wire pair;
a differential amplifier coupled to the coupling wire pair and amplifying a voltage difference in the coupling wire pair;
amplifier switches coupling the coupling wires to the data lines respectively; and
a switch control unit outputting amplifier switch control signals controlling operations of the amplifier switches respectively, wherein
when one of the data output units outputs data to one of the data line pair, the switch control unit turns on by the amplifier switch control signals a pair of amplifier switches coupled to the data line pair of the data output unit which outputs data, and turns on the amplifier switch coupled to the data line, which corresponds to the other of the data line pair coupled one of the data output units, in the data output unit which does not output data during a period after the one of the data output units outputs data until the differential amplifier starts an amplifying operation.

2. The semiconductor integrated circuit according to claim 1, wherein before the one of the data output units output data, the switch control unit turns off an amplifier switch coupled to the data line, which corresponds to the one of the data line pair coupled one of the data output units, in the data output unit which does not output data.

3. The semiconductor integrated circuit according to claim 1, wherein before the differential amplifier starts an amplifying operation, the switch control unit turns off the amplifier switch coupled to the data line, which corresponds to the other of the data line pair coupled one of the data output units, in the data output unit which does not output data.

4. The semiconductor integrated circuit according to claim 3, further comprising precharge switches arranged respectively between the data lines and a reference voltage line to which the reference voltage is supplied, wherein
the switch control unit outputs precharge switch control signals which control operations of the precharge switches respectively, and the switch control unit turns on by the precharge switch control signals precharge switches coupled to the data line pair of the data output unit which does not output data during a period after the one of the data output units outputs data until the differential amplifier starts an amplifying operation.

5. The semiconductor integrated circuit according to claim 1, further comprising equalization switches which couple data lines of the data line pairs to each other, wherein
the switch control unit outputs equalization switch control signals which control operations of the equalization switches respectively, and the switch control unit turns off by the equalization switch control signals an equalization switch coupled to the data line pair of the data output unit which outputs data, and turns on an equalization switch coupled to the data line pair of the data output unit which does not output data during a period after the data output unit outputs data until the differential amplifier starts an amplifying operation.

6. The semiconductor integrated circuit according to claim 1, wherein:
each of the data output units is a memory cell array having a plurality of memory cells; and
each of the data line pairs is a complementary bit line pair coupled to the memory cells respectively.

7. The semiconductor integrated circuit according to claim 1, wherein the switch control unit comprises a timing changing circuit which changes generation timing of the amplifier switch control signals.

8. A semiconductor integrated circuit, comprising:
a data output unit having a complementary data line pair and outputting data to one of the data lines which are precharged to a reference voltage;
a differential amplifier coupled to the data line pair and amplifying a voltage difference in the data line pair;
a capacitor switch and a precharge capacitor usable as a load which are arranged in series between each of the data lines and a voltage line; and
a switch control unit outputting switch control signals controlling operations of the capacitor switches respectively, wherein
when the data output unit outputs data to one of the data line pair, the switch control unit turns off by the switch control signals a capacitor switch being on, which corresponds to the data line to which data are output, and maintains an on-state of the capacitor switch being on, which corresponds to a data line to which data are not output, during a period after the data output unit outputs data until the differential amplifier starts an amplifying operation and turns off the capacitor switch being on, which corresponds to the data line to which data are not output, before the differential amplifier starts an amplifying operation.

9. The semiconductor integrated circuit according to claim 8, wherein:
the data output unit is a memory cell array having memory cells; and
the data line pair is a complementary bit line pair coupled to the memory cells respectively.

10. The semiconductor integrated circuit according to claim 9, wherein:
each of the memory cells comprises a memory cell capacitor which retains data and a transfer transistor; and
the capacitor switch and the precharge capacitor are formed using the transfer transistor and the memory cell capacitor of the memory cells.

11. The semiconductor integrated circuit according to claim 10, further comprising:
a plurality of the capacitor switches and a plurality of the precharge capacitors which are coupled to each of the data lines;
a switch selection circuit which sets the number of precharge capacitors used as a load; and
a redundancy control circuit which uses, as a redundant memory cell for relief of a defect, a memory cell which is formed by the precharge capacitor not used as the load and a capacitor switch coupled to the precharge capacitor.

12. The semiconductor integrated circuit according to claim 8, further comprising:
a plurality of the capacitor switches which are coupled to each of the data lines and a plurality of the precharge capacitors; and
a switch selection circuit which sets the number of precharge capacitors used as a load.

13. The semiconductor integrated circuit according to claim 8, wherein the switch control unit comprises a timing changing circuit which changes generation timing of the switch control signals.

14. A semiconductor integrated circuit, comprising:
a data output unit having a complementary data line pair and outputting data to one of the data lines which are precharged to a reference voltage;
a differential amplifier coupled to the data line pair and amplifying a voltage difference in the data line pair;
a capacitor switch and a precharge capacitor usable as a load, which are arranged in series between each of the data lines and a voltage line;
precharge switches arranged respectively between the data lines and a reference voltage line to which the reference voltage is supplied; and
a switch control unit which outputs switch control signals which control operations of the capacitor switches and the precharge switches respectively, wherein
when the data output unit outputs data to one of the data line pair, the switch control unit turns off by the switch control signals a capacitor switch being on and a precharge switch being on, which correspond to the data line to which data are output, and turns off a precharge switch being on, which corresponds to a data line to which data are not output, after turning off a capacitor switch being on, which corresponds to the data line to which data are not output, during a period after the data output unit outputs data until the differential amplifier starts an amplifying operation.

15. The semiconductor integrated circuit according to claim 14, wherein the switch control unit turns off the capacitor switch being on and the precharge switch being on, which correspond to the data line to which data are output, before the data output unit outputs data.

16. The semiconductor integrated circuit according to claim 14, wherein:
the data output unit is a memory cell array having memory cells; and
the data line pair is a complementary bit line pair coupled to the memory cells respectively.

17. The semiconductor integrated circuit according to claim 16, wherein:
each of the memory cells comprises a memory cell capacitor which retains data and a transfer transistor;
the capacitor switch and the precharge capacitor are formed using the transfer transistor and the memory cell capacitor of the memory cells; and
the precharge switches are formed using the transfer transistor of the memory cells.

18. The semiconductor integrated circuit according to claim 14, further comprising:
a plurality of the capacitor switches which are coupled to each of the data lines and a plurality of the precharge capacitors; and
a switch selection circuit which sets the number of precharge capacitors used as a load.

19. The semiconductor integrated circuit according to claim 14, wherein the switch control unit comprises a timing changing circuit which changes generation timing of the switch control signals.

* * * * *